(12) United States Patent
Noda

(10) Patent No.: US 6,335,616 B2
(45) Date of Patent: Jan. 1, 2002

(54) RINGING PREVENTIVE CIRCUIT, DEVICE UNDER TEST BOARD, PIN ELECTRONICS CARD, AND SEMICONDUCTOR DEVICE

(75) Inventor: Hiroshi Noda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/756,779

(22) Filed: Jan. 10, 2001

Related U.S. Application Data

(62) Division of application No. 09/461,333, filed on Dec. 15, 1999, now Pat. No. 6,191,573, which is a division of application No. 09/263,770, filed on Mar. 5, 1999, now Pat. No. 6,066,946, which is a division of application No. 08/950,909, filed on Oct. 15, 1997, now Pat. No. 5,945,823, which is a division of application No. 08/552,870, filed on Nov. 3, 1995, now Pat. No. 5,736,851.

(30) Foreign Application Priority Data

Apr. 17, 1995 (JP) .............................................. 7-090860

(51) Int. Cl.[7] .............................................. G01R 31/28
(52) U.S. Cl. .................... 324/158.1; 324/73.1
(58) Field of Search ............................ 324/158.1, 73.1, 324/765, 537, 763; 327/170, 199, 292, 309; 714/733; 326/62, 30

(56) References Cited

U.S. PATENT DOCUMENTS

| 4,507,576 A | 3/1985 | McCraken et al. |
| 4,947,113 A | 8/1990 | Chism et al. |
| 5,164,663 A | 11/1992 | Alcorn |
| 5,200,696 A | 4/1993 | Menis et al. |
| 5,266,894 A | 11/1993 | Takagi et al. |
| 5,436,559 A | 7/1995 | Takagi et al. |
| 5,736,851 A | 4/1998 | Noda |
| 5,945,823 A | 8/1999 | Noda |
| 6,066,946 A | 5/2000 | Noda |

*Primary Examiner*—Vinh P. Nguyen
(74) *Attorney, Agent, or Firm*—Oblon, Spivak, McClelland, Maier & Neustadt, P.C.

(57) ABSTRACT

To remove ringing from pulse. A buffer amplifier (30) is inserted in series into a path through which a signal is transmitted. Ringing caused in the output of the buffer amplifier (30) is detected by an L side comparator (31) and an H side comparator (32). When ringing is detected, a current is supplied into the input of the buffer amplifier (30) through an L side current supply circuit (33) or an H side current supply circuit (34). By supplying a current from the L side and H side current supply circuits (33, 34), the overshooting portion due to ringing can be suppressed.

8 Claims, 32 Drawing Sheets

FIG. 10
(a)
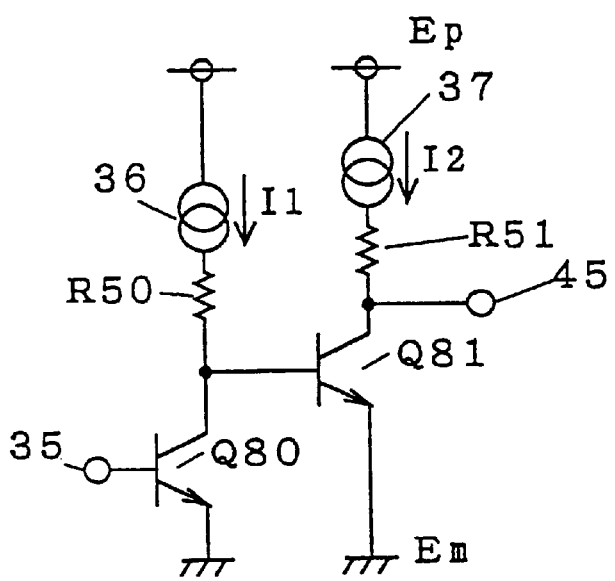
(b)
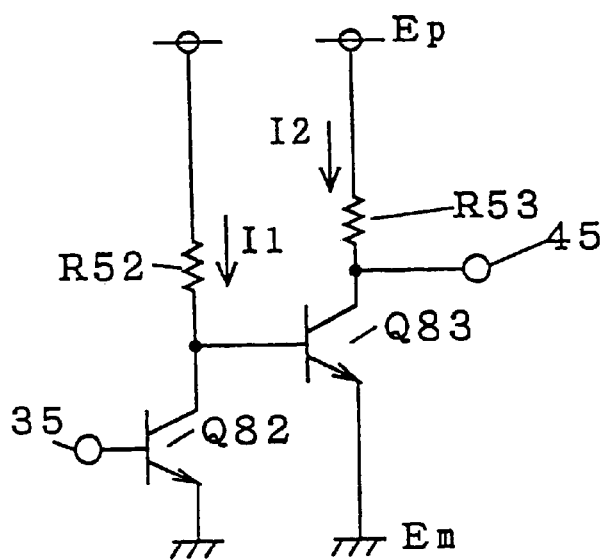

FIG. 11
(a)
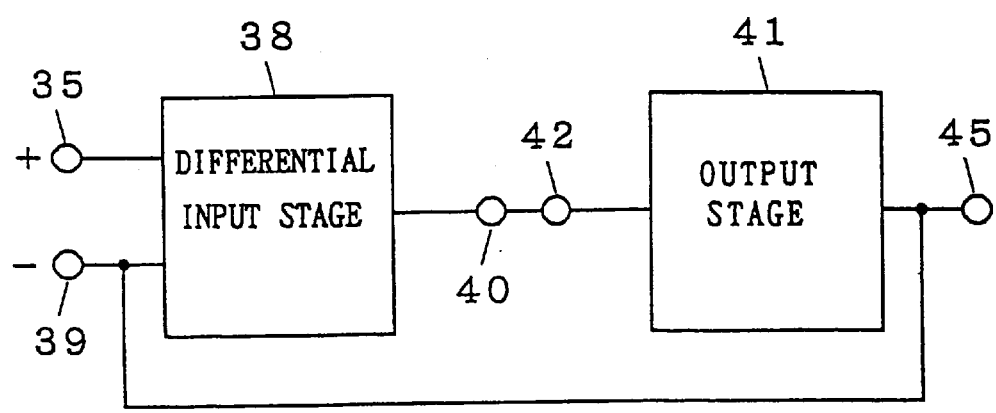
(b)
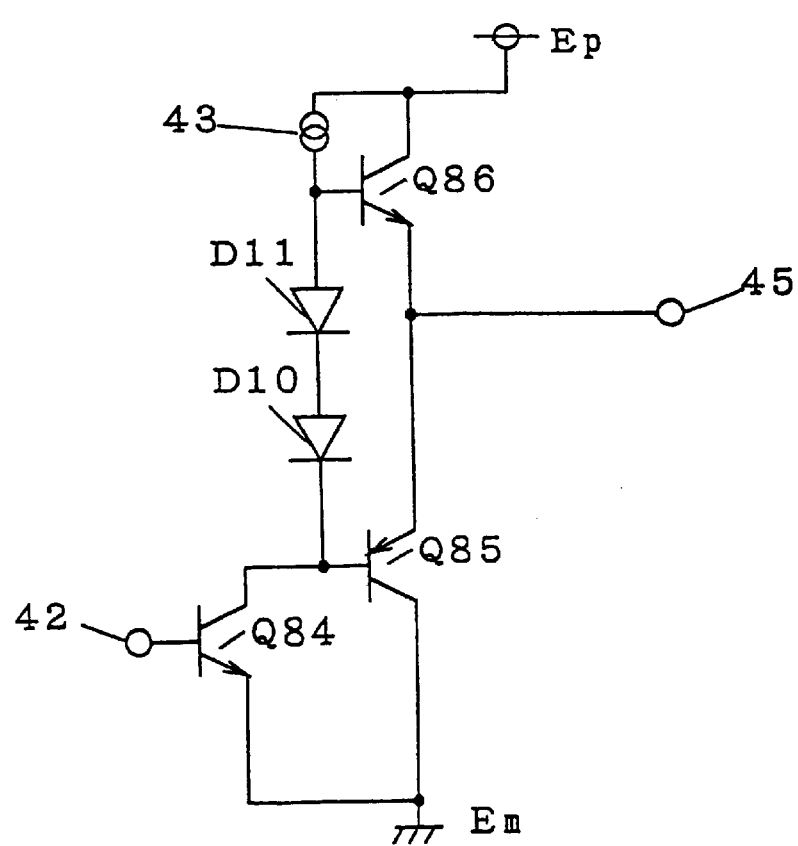

FIG. 12
(a)
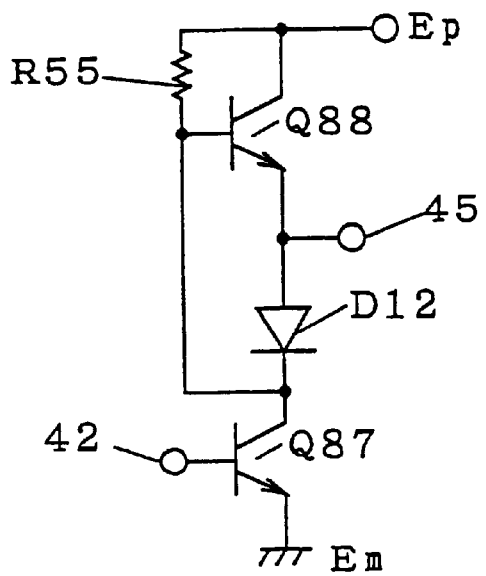
(b)
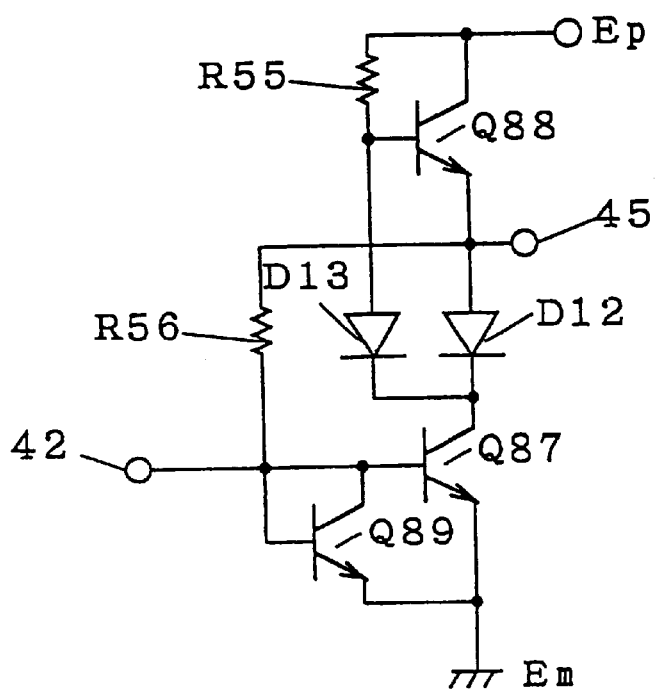

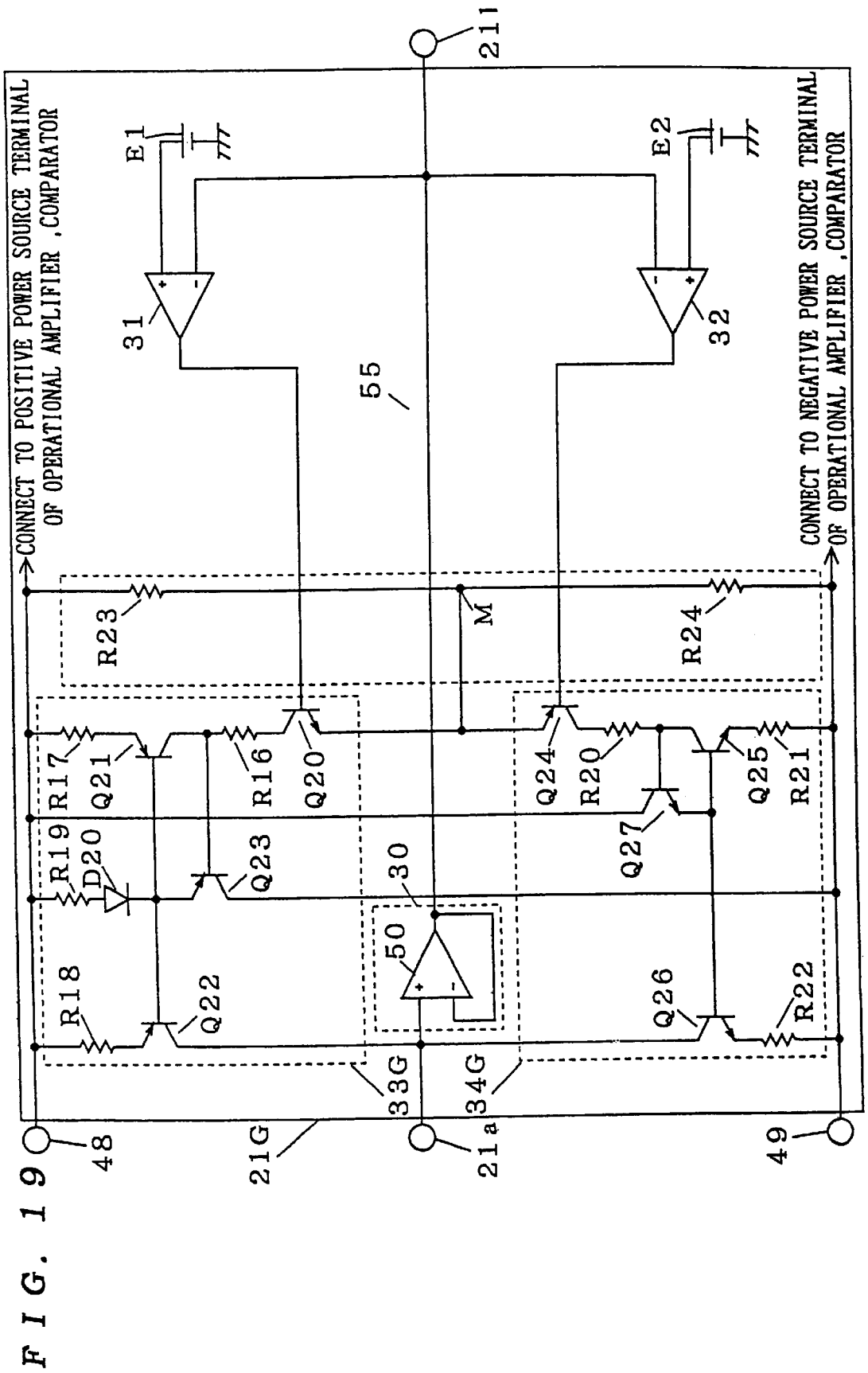
F I G. 1 9

FIG. 27
(a)
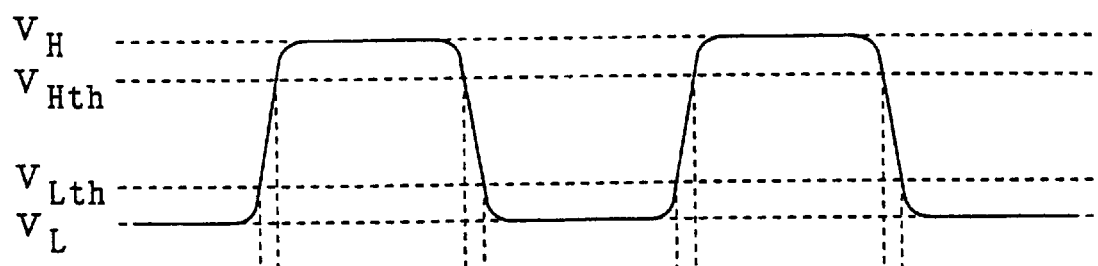
(b)
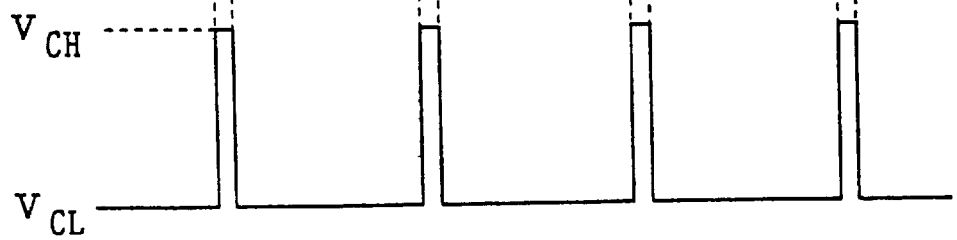

FIG. 28
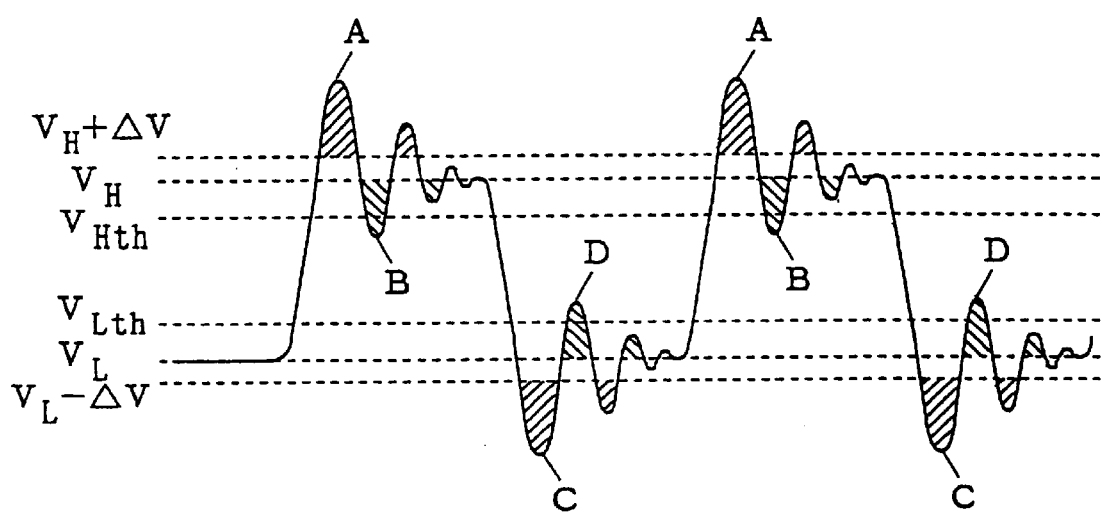
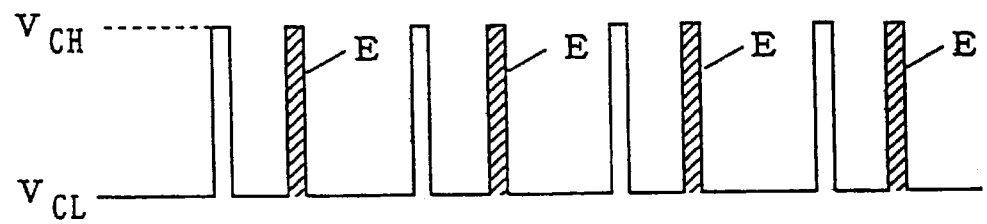

FIG. 32
(a)
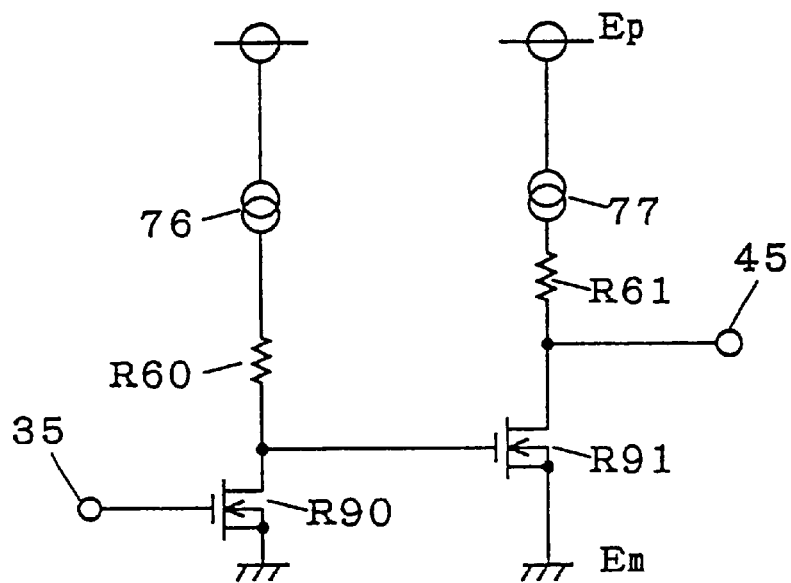
(b)
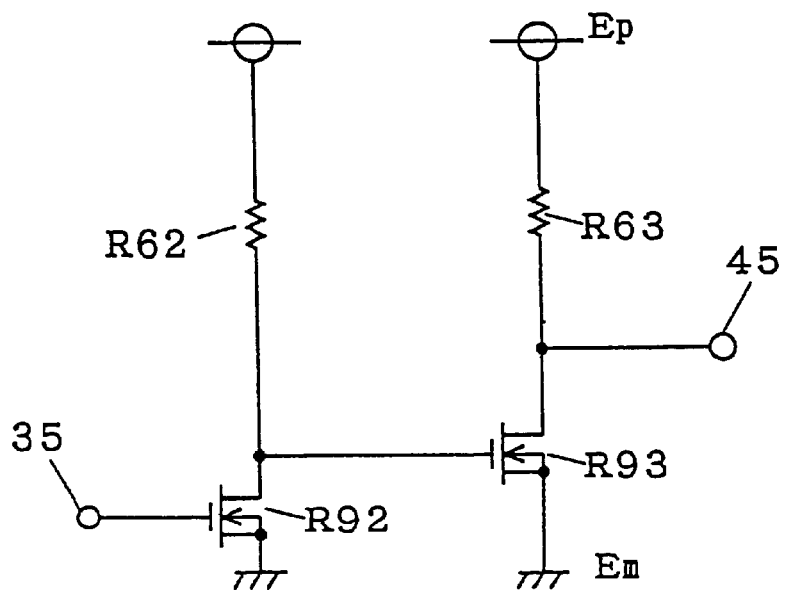

FIG. 33
(a)
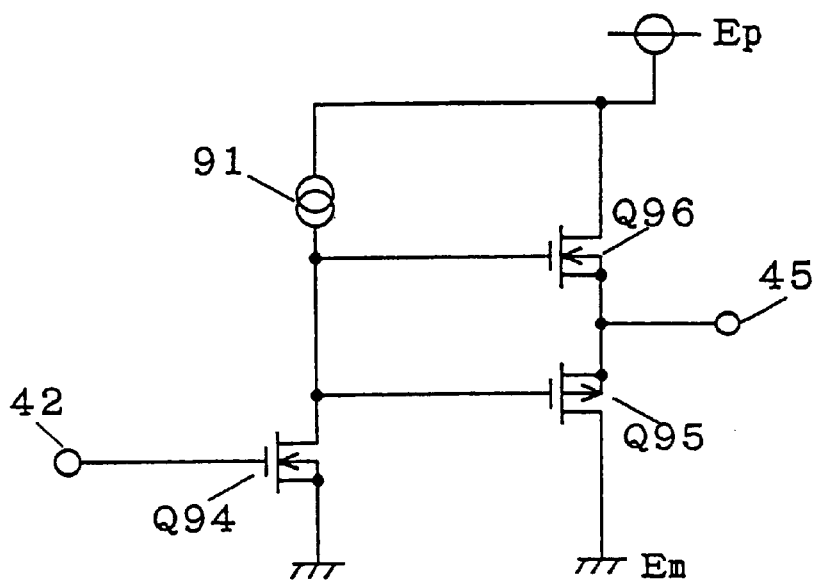
(b)
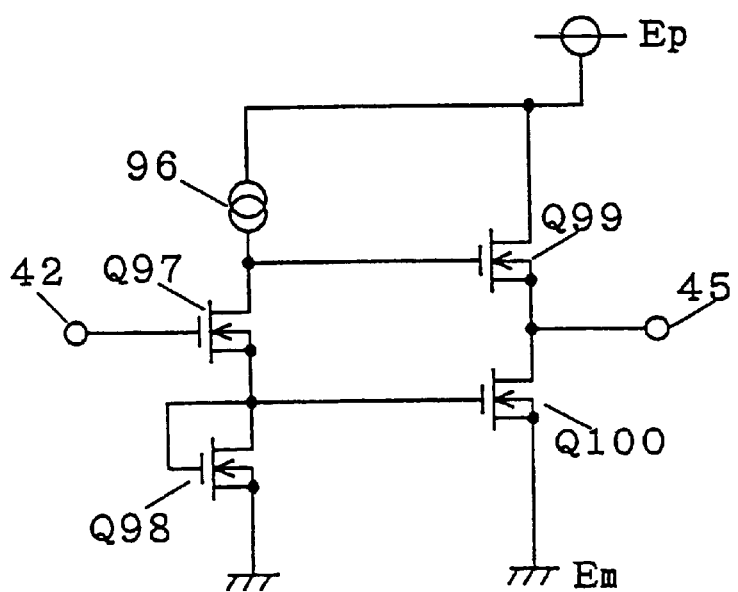

RINGING PREVENTIVE CIRCUIT, DEVICE UNDER TEST BOARD, PIN ELECTRONICS CARD, AND SEMICONDUCTOR DEVICE

This application is a division of application Ser. No. 09/461,333 filed on Dec. 15, 1999, which is a division of application Ser. No. 09/263,770 filed on Mar. 5, 1999, now U.S. Pat. No. 6,066,946, which is a division of application Ser. No. 08/950,909 filed on Oct. 15, 1997, now U.S. Pat. No. 5,945,823, which is a division of application Ser. No. 08/552,870 filed on Nov. 3, 1995, now U.S. Pat. No. 5,736,851.

BACKGROUND OF THE INVENTION

1. Field of the Invention

The present invention relates to removal of ringing in the input unit of a pin electronics card used in semiconductor testing apparatus, output stage circuit inside the IC or LSI, or output unit of a device under test board (DUT board) used in semiconductor testing apparatus, and more particularly to a ringing preventive circuit for removing noise such as ringing from a transmission path in which an electric signal is transmitted.

2. Description of the Background Art

FIG. 25 is a conceptual diagram showing the connected state of the DUT board mounting a semiconductor device such as IC and LSI, and the input unit of a pin electronics card of a semiconductor testing apparatus, for testing a semiconductor apparatus such as IC and LSI. In FIG. 25, reference numeral 1 denotes an objective device to be tested such as IC and LSI, 2 is a DUT board for mounting the objective device 1, 3 is a holder such as socket and prober fixed on the DUT board 2 for holding and electrically connecting the objective device 1, 4 is a transmission path for transmitting an electric signal outputted from the output unit of the objective device 1, being connected to the objective device I in the holder 3, 5 is a connector connected to the transmission path 4 provided at the DUT board 2 side, 6 is a semiconductor testing apparatus for testing the objective device 1, 7 is a pin electronics card provided in the semiconductor testing apparatus 6 and including a comparator or the like, and 8 is a connector provided in a pin electronics card 7 to be connected to the connector 5 of the DUT board 2.

The pin electronics card 7 of the semiconductor testing apparatus 6 is an input and output interface with the objective device 1, and has a significant influence on the test performance.

FIG. 26 is a circuit diagram showing the outline of the structure of the pin electronics card 7 of the semiconductor testing apparatus shown in FIG. 25. In FIG. 26, reference numeral K1 is a relay having one end connected to the connector 8 for making or breaking a connection between the one end and the other end in response to a control signal, 11 is a pin electronics comparator having an input terminal 11a connected to the other end of the relay K1, a terminal connected to a power source E5 to be provided with a reference voltage $V_{Hth}$, a terminal connected to a power source E6 to be provided with a reference voltage $V_{Lth}$, and an output terminal 11b for outputting the result of comparison of the voltage at the input terminal 11a with the reference voltages $V_{Hth}$, $V_{Lth}$, 12 is a pin electronics driver having an input terminal 12a for receiving a signal to be given to the objective device for testing, and an output terminal 12b connected to the other end of the relay K1, and 13 is a pin electronics control circuit for processing the signal to be given to the objective device from the semiconductor testing apparatus to give to the input terminal 12a of the pin electronics driver 12, processing the signal outputted from the output terminal 11b of the pin electronics comparator 11 to be taken into the semiconductor testing apparatus, and controlling to open or close the relay K1. Herein, it is supposed that reference voltage $V_{Hth}$ >reference voltage $V_{Lth}$.

The operation of the conventional semiconductor testing apparatus shown in FIG. 25 and FIG. 26 is described below. In particular, processing of the signal to be outputted from the objective device 1 is explained. In the pin electronics card 7, in order to process an input signal, the relay K1 is in ON (closed) state, so that the pin electronics comparator 11 may be connected between the connector 8 and pin electronics control circuit 13. The voltage $V_{CO}$ at the output terminal 11b of the pin electronics comparator 11 is, supposing the voltage at the input terminal 11a of the pin electronics comparator 11 to be $V_{Ci}$, $V_{CO}=V_{CL}$ when $V_{Ci}>V_{Hth}$, $V_{CO}=V_{CL}$ when $V_{Ci}<V_{Lth}$, and $V_{CO}=V_{CH}$ when $V_{Lth}<C_{Ci}<V_{Hth}$, where voltage $V_{CL}$ is the lower side logic level in the pin electronic control circuit 13, and voltage $V_{CH}$ is the higher side logic level in the pin electronics control circuit 13.

FIG. 27 is a waveform diagram showing the signal processed by the pin electronics card and the processing result in the pin electronics comparator. The waveform shown in (a) of FIG. 27 is a voltage waveform of an ideal electric signal suited to processing of the pin electronics comparator 11. Ideally, from the output circuit of the objective device 1 shown in FIG. 25, a signal having a waveform as shown in (a) of FIG. 27 is outputted, and passes through the transmission path 4, and a signal having the waveform shown in (a) of FIG. 27 is put into the connector 8 of the pin electronics card 7 in the semiconductor testing apparatus 6. From the connector 8 which is the input and output terminal of the pin electronics card, an ideal signal Vi is put in, and it is supplied into the pin electronics comparator 11 through the relay K1. Therefore, the voltage $V_{Ci}$ at the input terminal 11a of the pin electronics comparator is ideally a signal Vi having the waveform shown in (a) of FIG. 27. At this time, the output impedance of the pin electronics driver 12 is supposed to be in high impedance state (hereinafter called Hi-Z state). Hence, ideally, the voltage waveform generated at the output terminal 11b by the action of the pin electronics comparator 11 is as shown in (b) of FIG. 27.

Actually, however, in the process of the waveform passing through the transmission path 4 and others, the signal having the voltage waveform as shown in FIG. 28 mixed with ringing and other noise due to inductance component and capacitance component of the transmission path 4, impedance mismatching of the transmission path 4, incoming noise mixed in the transmission path 4 and others is put into the pin electronics comparator 11.

FIG. 28 is a waveform diagram showing the signal processed in the pin electronics card and the processing result in the pin electronics comparator. When a signal having the waveform as shown in (a) of FIG. 28 is put into the pin electronics comparator 11, the pin electronics comparator 11 may sometimes malfunction. When the waveform shown in (a) of FIG. 28 is put into the pin electronics comparator 11, malfunction occurs in the portion crossing the voltage $V_{Hth}$ in shaded region B in (a) of FIG. 28, and in the portion crossing the voltage $V_{Lth}$ in shaded region D. When the signal having the waveform shown in (a) of FIG. 28 is put into the pin electronics comparator 11, the waveform appearing at the output terminal 11b of the pin electronics comparator 11 is as shown in (b) of FIG. 28. Shaded region E in (b) of FIG. 28 is the malfunctioning portion.

The pin electronics card is an interface between the objective device 1 and semiconductor testing apparatus 6, and the information indicated by the signal outputted from the objective device 1 must be accurately communicated to the semiconductor testing apparatus 6, but this object may not be achieved if malfunction occurs in the pin electronics comparator 11.

Incidentally, transmission of pulse signal or processing is not limited to the semiconductor testing apparatus alone, but such scene is often encountered in general semiconductor devices. FIG. 29 is a conceptual diagram showing part of the constitution of a general semiconductor device. In FIG. 29, reference numeral 14 is a semiconductor device, 15 is an output pin of the semiconductor device 14, 16 is an output buffer connected to the output pin 15 for giving an output signal to the output pin 15, 17 is a transmission path connected to the output buffer 16, and 18 is a circuit before an output stage for generating a circuit to be transmitted through the transmission path 17. The transmission path 17 may contain wiring of aluminum, polysilicon or the like, in the semiconductor device 14, and the output pin 15 may be a pad or the like.

A pulse signal having a certain waveform is outputted from the circuit before an output stage 18, and is transmitted to the output buffer 16 through the transmission path 17. It is further transmitted from the output buffer 16 having a low output impedance to the output pin 15, and is outputted outside the semiconductor device from the output pin 15. The waveform of the signal outputted from the circuit before an output stage 18 and the waveform transmitted to the output pin 15 should be ideally ringing-free waveform as shown in (a) of FIG. 27.

However, for example, when a signal having a waveform as shown in (a) of FIG. 27 is outputted from the circuit before an output stage 18, in the process of passing through the transmission path 17 or output buffer 16, it may be changed to a waveform having noise such as ringing, as shown in (a) of FIG. 28, due to inductance component in the transmission path 17, crosstalk noise from the peripheral circuit or the like, and may be transmitted to the output pin 15 in such form.

The conventional semiconductor testing apparatus, DUT board, and semiconductor device are thus constituted, and ringing or other nosie is caused in the process of the electric signal passing through the transmission paths 4, 17, and therefore when the signal mixed with ringing is processed, the circuit and others may malfunction, and accurate testing of semiconductor device or appropriate action of semiconductor device may not be realized.

SUMMARY OF THE INVENTION

A first aspect of the invention relates to a ringing preventive circuit comprising a buffer amplifier having an input terminal and an output terminal, a first comparator having a first input terminal connected to the output terminal of the buffer amplifier, a second input terminal provided with a first reference voltage, and an output terminal, for outputting a first control signal from the output terminal in response to a result of comparison between the voltages at the first and second input terminals, and a first current supply circuit having a first terminal connected to a first power source for supplying a first voltage, a second terminal connected to the input terminal of the buffer amplifier, and a control signal input terminal connected to the output terminal of first comparator, for controlling conduction and non-conduction of a current flowing from the first terminal to the second terminal by the first control signal.

A second aspect of the invention relates to a ringing preventive circuit of the first aspect, wherein the first current supply circuit comprises a constant current source having a first terminal and a second terminal connected to the first power source, and a second terminal, for supplying a specific current from the first terminal to the second terminal, and switch means having a first current electrode connected to the first terminal of the constant current source, a second current electrode connected to the input terminal of the buffer amplifier, and a control electrode connected to the second terminal of the first comparator, for controlling on/off of the current flowing between the first and second current electrodes in response to the signal given to the control electrode.

A third aspect of the invention relates to a ringing preventive circuit of the first aspect, wherein the first current supply circuit comprises switch means having a control electrode connected to the output terminal of the first comparator, a first current electrode provided with a second voltage relating to the first power source, and a second current electrode, for controlling conduction and non-conduction of a current flowing between the first and second current electrodes in response to the signal given to the control electrode, and a current mirror circuit connected to the first power source, having a first current output terminal connected to the second current electrode of the switch means, and a second current output terminal connected to the input terminal of the buffer amplifier, for outputting a first current from the first current output terminal and a second current from the second current output terminal, the second current in the second current output terminal is duplicated in said first current output terminal.

A fourth aspect of the invention relates to a ringing preventive circuit of the first aspect, further comprising a second comparator having a first input terminal connected to the output terminal of the buffer amplifier, a second input terminal provided with a second reference voltage, and an output terminal, for outputting a second control signal from the output terminal in response to a result of comparison between voltages of the first and second input terminals of the second comparator, and a second current supply circuit having a first terminal connected to a second power source for supplying a second voltage, a second terminal connected to the input terminal of the buffer amplifier, and a control signal input terminal connected to the output terminal of the buffer amplifier, for controlling conduction and non-conduction of a current flowing from the first terminal to the second terminal in response to the second control signal.

A fifth aspect of the invention relates to a ringing preventive circuit comprising a buffer amplifier having an input terminal and an output terminal, a first comparator having a first input terminal connected to the output terminal of the buffer amplifier, a second input terminal provided with a first reference voltage, and an output terminal, for outputting a first control signal from the output terminal in response to a result of comparison between voltages at the first an second input terminals, and a first current supply circuit having a first terminal connected to a first power source for supplying a first voltage, a second terminal connected to the input terminal of the buffer amplifier, a third terminal connected to the output terminal of the buffer amplifier, and a control signal input terminal connected to the output terminal of first comparator, for controlling conduction and non-conduction by the first control signal, and passing a current depending on the voltage of the third terminal from the first terminal to the second terminal.

A sixth aspect of the invention relates to a ringing preventive circuit of the fifth aspect, further comprising a second comparator having a first input terminal connected to the output terminal of the buffer amplifier, a second input terminal provided with a second reference voltage, and an output terminal, for outputting a control signal from the output terminal, in response to a result of comparison between voltages of the first and second input terminals, and a second current supply circuit having a first terminal connected to a second power source for supplying a second voltage, a second terminal connected to the input terminal of the buffer amplifier, a third terminal connected to the output terminal of the buffer amplifier, and a control signal input terminal connected to the output terminal of second comparator, for controlling conduction and non-conduction by the second control signal, and passing a current depending on the voltage of the third terminal from the first terminal to the second terminal.

A seventh aspect of the invention relates to a ringing preventive circuit of the fifth aspect, wherein the first current supply circuit comprises a differential amplifying circuit having a first power source terminal provided with a second voltage relating to the first power source, a first input terminal provided with a second reference voltage, a second input terminal connected to the output terminal of the buffer amplifier, and an output terminal, for amplifying the voltage difference between the input terminal and the second input terminal, and outputting on the basis of the second voltage, a transistor having a first current electrode connected to the output terminal of the differential amplifier circuit, a control electrode connected to the output terminal of the first comparator, and a second current electrode, and a current mirror circuit having a first current output terminal connected to the second current electrode of the transistor, a second current output terminal connected to the input terminal of the buffer amplifier, and a current input terminal connected to the first power source, for outputting a first current from the first current output terminal and a second current from the second current output terminal, the second current in the second current output terminal is duplicated in the first current output terminal.

An eighth aspect of the invention relates to a device under test board comprising a connector for connecting with a test head, a transmission path for transmitting a signal to the connector, holding means for holding an objective device and electrically connecting the transmission path and the objective device, and a ringing preventive circuit connected between the transmission path and the connector, for removing ringing of the signal transmitted through the transmission path, wherein the ringing preventive circuit comprises a buffer amplifier having an input terminal connected to the transmission path and an output terminal connected to the connector, a first comparator having a first input terminal connected to the output terminal of the buffer amplifier, a second input terminal provided with first reference voltage, and an output terminal, for outputting a control signal from the output terminal in response to a result of comparison between voltages of the first and second input terminals, and a first current supply circuit having a first terminal connected to a power source for supplying a supply voltage, a second terminal connected to the input terminal of the buffer amplifier, and a control signal input terminal connected to the output terminal of the first comparator, for controlling conduction and non-conduction of a current flowing from the first terminal to the second terminal in response to control signal.

A ninth aspect of the invention relates to a device under test board comprising a connector for connecting with a test head, a transmission path for transmitting a signal to the connector, holding means for holding an objective device and electrically connecting the transmission path and the objective device, and a ringing preventive circuit connected between the transmission path and the connector, for re-moving ringing of the signal transmitted through the transmission path, wherein the ringing preventive circuit comprises a buffer amplifier having an input terminal connected to the transmission path and an output terminal connected to the connector, a first comparator having a first input terminal connected to the output terminal of the buffer amplifier, a second input terminal provided with first reference voltage, and an output terminal, for outputting a control signal from the output terminal in response to a result of comparison between voltages of the first and second input terminals, and a first current supply circuit having a first terminal connected to a power source for supplying a supply voltage, a second terminal connected to the input terminal of the buffer amplifier, a third terminal connected to the output terminal of the buffer amplifier, and a control input terminal connected to the second output of the first comparator, for controlling on/off by the control signal, and passing a current depending on the voltage of the output terminal of the buffer amplifier from the first terminal to the second terminal.

A tenth aspect of the invention relates to a device under test board of the ninth aspect, further comprising a high impedance circuit inserted between the input terminal of the buffer amplifier and the transmission path, for setting the impedance of the transmission path as seen from the buffer amplifier higher than the impedance of the transmission path.

An eleventh aspect of the invention relates to a pin electronics card comprising a connector connected to a test board on which an objective device is mounted, an interface circuit having a signal input terminal for interfacing to use a signal entered from the signal input terminal as an input to the tester, and a ringing preventive circuit connected between the signal input terminal of the interface circuit and the connector, for removing ringing caused in a signal entered from the signal input terminal, wherein the ringing preventive circuit comprises a buffer amplifier having an input terminal connected to the connector, and an output terminal connected to the signal input terminal of the interface circuit, a first comparator having a first input terminal connected to the output terminal of the buffer amplifier, a second input terminal provided with a first reference voltage, and an output terminal, for outputting a control signal from the output terminal in response to a result of comparison between voltages of the first and second input terminals, and a first current supply circuit having a first terminal connected to a power source for supplying a supply voltage, a second terminal connected to the input terminal of the buffer amplifier, and a control signal input terminal connected to the second output terminal of the first comparator, for controlling conduction and non-conduction of a current flowing from the first terminal to the second terminal in response to the control signal.

A twelfth aspect of the invention relates to a pin electronics card comprising a connector connected to a test board on which an objective device is mounted, an interface circuit having a signal input terminal for interfacing to use a signal entered from the signal input terminal as an input to the tester, and a ringing preventive circuit connected between the signal input terminal of the interface circuit and the connector, for removing ringing caused in a signal entered from the signal input terminal, wherein the ringing preventive circuit comprises a buffer amplifier having an input terminal connected to the connector, and an output terminal connected to the signal input terminal, a first comparator having a first input terminal connected to the output terminal of the buffer amplifier, a second input terminal provided with a first reference voltage, and an output terminal, for outputting a control signal from the output terminal in response to a result of comparison between voltages of the first and second input terminals, and a first current supply circuit having a first terminal connected to a power source for supplying a supply voltage, a second terminal connected to the input terminal of the buffer amplifier, and a control signal input terminal connected to the output terminal of the first comparator, for controlling on/off by the control signal and passing a current from the first terminal to the second terminal depending on the voltage of the output terminal.

A thirteenth aspect of the invention relates to a pin electronics card of the twelfth aspect, further comprising a high impedance circuit inserted between the first input terminal of the buffer amplifier and the connector, for setting the impedance at the connector side as seen from the buffer amplifier hither than before insertion.

A fourteenth aspect of the invention relates to a semiconductor device having a ringing preventive circuit adjacent to an output pin for removing ringing of pulse signal outputted from an output stage, wherein said ringing preventive circuit comprises a buffer amplifier having an input terminal connected to the output stage, and an output terminal connected to the output pin, a first comparator having a first input terminal connected to the output terminal of the buffer amplifier, a second input terminal provided with a first reference voltage, and an output terminal, for outputting a control signal from the output terminal in response to a result of comparison between voltages of the first and second input terminals, and a first current supply circuit having a first terminal connected to a power source for supplying a supply voltage, a second terminal connected to the input terminal of the buffer amplifier, and a control signal input terminal connected to the output terminal of the first comparator, for controlling conduction and non-conduction of a current flowing from the first terminal to the second terminal by the control signal.

A fifteenth aspect of the invention relates to a semiconductor device having a ringing preventive circuit for removing ringing of pulse signal outputted from an output stage disposed near an output pin, wherein said ringing preventive circuit comprises a buffer amplifier having an input terminal connected to the connector, and an output terminal connected to the signal input terminal, a first comparator having a first input terminal connected to the output terminal of the buffer amplifier, a second input terminal provided with a first reference voltage, and an output terminal, for outputting a control signal from the output terminal in response to a result of comparison between voltages of the first and second input terminals, and a first current supply circuit having a first terminal connected to the power source, a second terminal connected to the input terminal of the buffer amplifier, a third terminal connected to the output terminal of the buffer amplifier, and a control signal input terminal connected to the output terminal of the first comparator, for controlling on/off by the control signal and passing a current from the first terminal to the second terminal depending on the voltage of the output terminal.

According to the first, eighth and eleventh aspects of the invention, the first comparator detects generation of ringing depending on whether the voltage of the output terminal of the buffer amplifier exceeds the first reference voltage or not. When ringing occurs, corresponding to the output of the first comparator, the first current supply circuit supplies a current to the input of the buffer amplifier, and the output of the buffer amplifier is restrained from exceeding the first reference voltage to increase the difference, thereby preventing ringing.

According to the second aspect of the invention, the constant current power source supplies a predetermined current to the switch means, and hence it is not necessary to adjust the element composing the first current supply circuit depending on the amplitude of the signal or magnitude of ringing.

It is not necessary to adjust the element composing the first current supply circuit, and hence handling of the ringing preventive circuit is easy.

According to the third aspect of the invention, the switch means has the first current electrode connected to the first power source, and the second current electrode to the first current output terminal of the current mirror circuit, and therefore the first and second current electrodes are free from effects of input and output of the buffer amplifier, and hence it is not necessary to adjust the element composing the first current supply circuit, and it is not influenced by, for example, the base line of the pulse entered in the input terminal of the buffer amplifier, and malfunction does not occur if the level of the signal of input and output of the buffer amplifier is shifted so that handling of the ringing preventive circuit may be easily performed.

According to the fourth aspect of the invention, the first and second comparators detect generation of ringing depending on whether the voltage of the output terminal of the buffer amplifier exceeds the first or second reference voltage or not. When ringing occurs, corresponding to the output of the first or second comparator, the first or second current supply circuit supplies a current to the input of the buffer amplifier, and the output of the buffer amplifier is restrained from exceeding the first and second reference voltage to increase the difference, so that ringing occurring in both rise and fall of a signal can be suppressed.

According to the fifth, ninth and twelfth aspects of the invention, the first comparator detects generation of ringing depending on whether the voltage of the output terminal of the buffer amplifier exceeds the first reference voltage or not. When ringing occurs, the first current supply circuit supplies a current corresponding to the output of the buffer amplifier to the input of the buffer amplifier, and the output of the buffer amplifier is restrained from exceeding the first reference voltage to increase the difference, so that ringing may be suppressed.

According to the sixth aspect of the invention, the first and second comparators detect generation of ringing depending on whether the voltage of the output terminal of the buffer amplifier exceeds the first or second reference voltage or not. When ringing occurs, the first and second current supply circuits supply a current corresponding to the output of the buffer amplifier to the input of the buffer amplifier, and the output of the buffer amplifier is restrained from exceeding the first and second reference voltages to increase the difference, so that ringing may be suppressed.

According to the seventh aspect of the invention, the first comparator detects generation of ringing depending on whether the voltage of the output terminal of the buffer amplifier exceeds the first reference voltage or not. When ringing occurs, the first current supply circuit supplies a current corresponding to the output of the buffer amplifier amplified by the differential amplifying circuit, to the input of the buffer amplifier, and the output of the buffer amplifier is restrained from exceeding the first reference voltage to increase the difference, so that ringing may be suppressed.

According to the tenth and thirteenth aspects of the invention, the first comparator detects generation of ringing depending on whether the voltage of the output terminal of the buffer amplifier exceeds the first reference voltage or not. When ringing occurs, the first current supply circuit supplies a current between the high impedance converting circuit and input terminal of the buffer amplifier, corresponding to the output of the first comparator, and the output of the buffer amplifier is restrained from exceeding the first reference voltage to increase the difference, and the current flowing when the first current supply circuit supplies the current can be decreased by the high impedance converting circuit.

According to the fourteenth aspect of the invention, the first comparator detects generation of ringing depending on whether the voltage of the output terminal of the buffer amplifier exceeds the first reference voltage or not. When ringing occurs in the pulse signal transmitted through a transmission path, the first current supply circuit supplies a current to the input terminal of the buffer amplifier, corresponding to the output of the first comparator, and the output of the buffer amplifier is restrained from exceeding the first reference voltage to increase the difference, and at this time, since the buffer amplifier is contained in the ringing preventive circuit, the buffer amplifier used in the output of the semiconductor may be omitted by adding the ringing preventive circuit. Accordingly, ringing can be suppressed by the ringing preventive circuit, while limiting expansion of the circuit scale by adding the ringing preventive circuit.

According to the fifteenth aspect of the invention, the first comparator detects generation of ringing depending on whether the voltage of the output terminal of the buffer amplifier exceeds the first reference voltage or not. When ringing occurs in the pulse signal transmitted through a transmission path, the first current supply circuit supplies a current to the input terminal of the buffer amplifier depending on the output of the buffer amplifier, corresponding to the output of the first comparator, and the output of the buffer amplifier is restrained from exceeding the first reference voltage to increase the difference, and at this time, since the buffer amplifier is contained in the ringing preventive circuit, the buffer amplifier used in the output of the semiconductor may be omitted by adding the ringing preventive circuit. Accordingly, the ringing can be suppressed by the ringing preventive circuit, while limiting expansion of the circuit scale by adding the ringing preventive circuit.

It is therefore an object of the present invention to provide a ringing preventive circuit capable of preventing malfunction in circuit and others in the subsequent stages by removing ringing at a specified position, if ringing or other noise should occur in the process of transmission of signal through a transmission path, in order to solve the problems in the prior art, and also to provide a pin electronics card of a semiconductor testing apparatus incorporating such ringing preventive circuit, DUT board incorporating a ringing preventive circuit, and a semiconductor device incorporating a ringing preventive circuit.

These and other objects, features, aspects and advantages of the present invention will become more apparent from the following description of the present invention when taken in conjunction with the accompanying drawings.

BRIEF DESCRIPTION OF THE DRAWINGS

FIGS. 10a–10b are circuit diagrams; showing a first example of constitution of a buffer amplifier used in the invention;

FIGS. 11a–11b are circuit diagrams; showing a second example of constitution of a buffer amplifier used in the invention;

FIGS. 12a–12b are circuit diagrams; showing a third example of constitution of a buffer amplifier used in the invention;

FIG. 19 is circuit diagram showing the constitution of a ringing preventive circuit according to a seventh preferred embodiment of the circuit FIG. 8;

FIGS. 27a–27b are waveform diagrams; of an ideal signal free from ringing or other noise and an output of pin electronics card when processing such signal;

FIGS. 28a–28b are waveform diagrams; of a signal containing ringing or other noise and an output of pin electronics card when processing such signal;

FIG. 32 is a circuit diagram showing a fourth example of constitution of a buffer amplifier used in the invention; and FIGS. 33a–33b are circuit diagrams; showing a fifth example of constitution of a buffer amplifier used in the invention.

DESCRIPTION OF THE PREFERRED EMBODIMENTS

Figure 1:
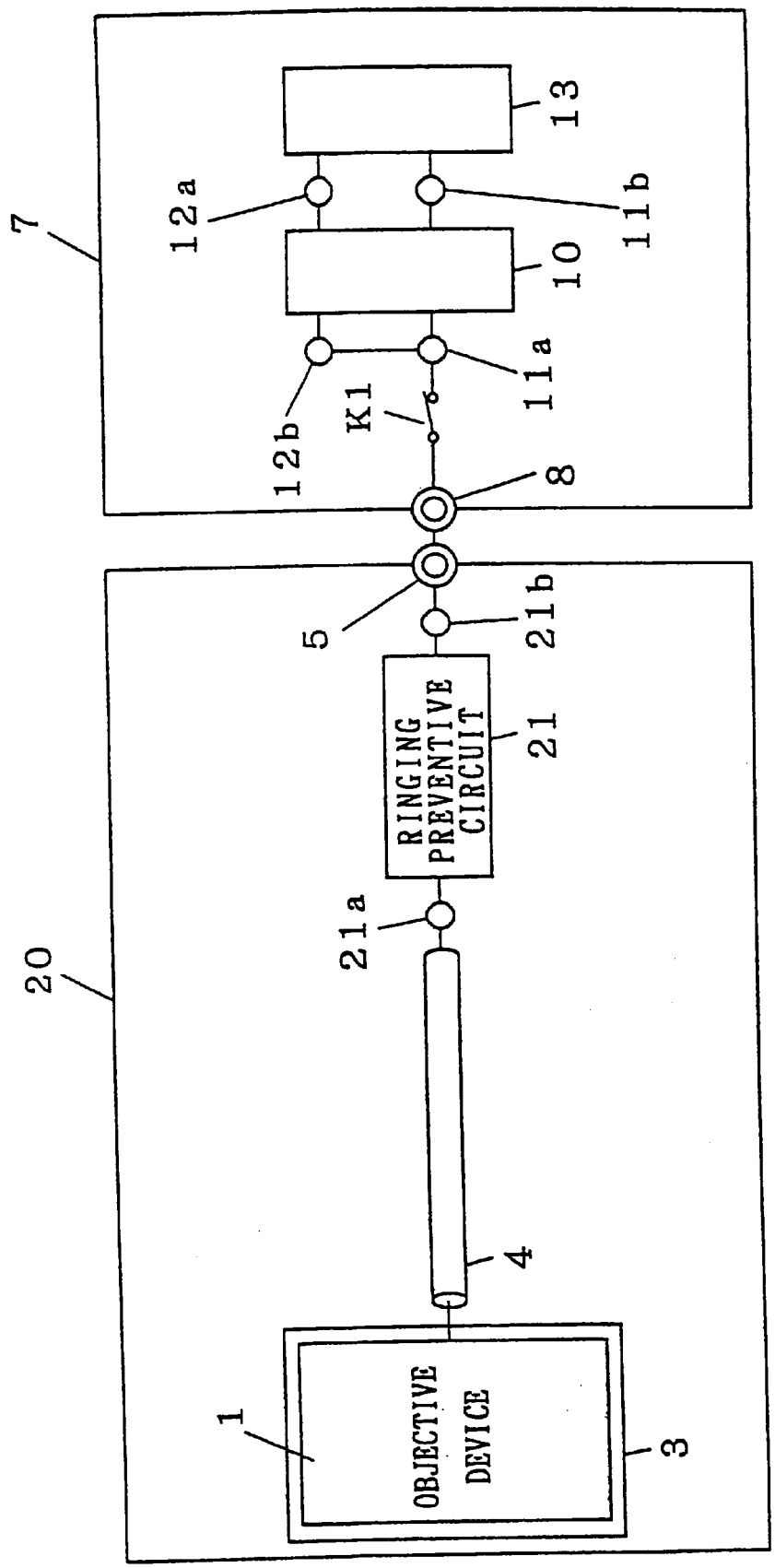
FIG. 1 is a block diagram showing the constitution of a DUT board according to a first preferred embodiment of the invention connected to a pin electronics card.
Figure 25:
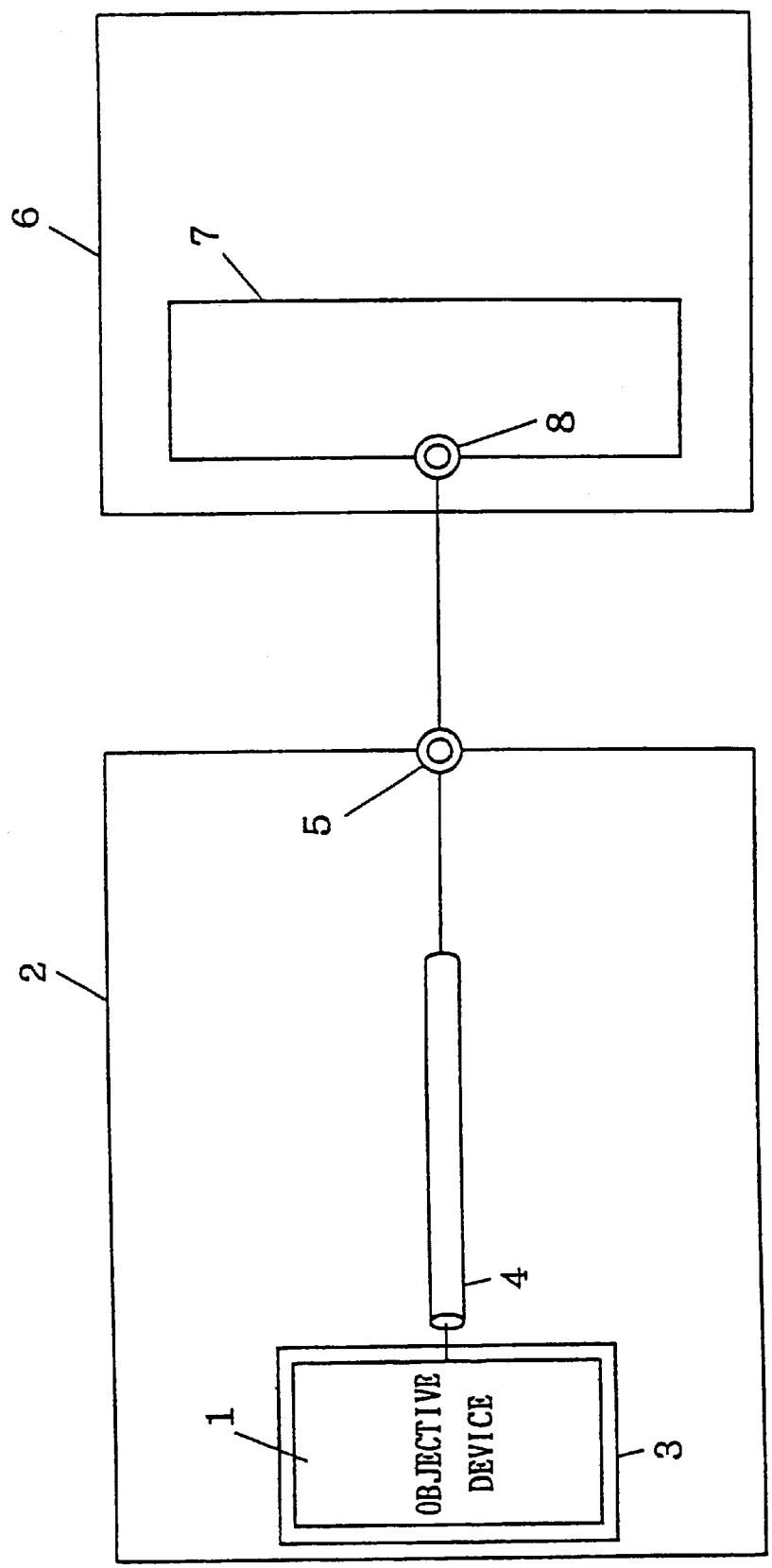
FIG. 25 is a block diagram showing the connection state of a conventional DUT board and a conventional testing apparatus for testing an objective device when testing a semiconductor device.

A first preferred embodiment of the invention is described below by referring to FIG. 1 and FIG. 2. FIG. 1 is a conceptual diagram fro explaining the constitution of a DUT board in the first preferred embodiment of the invention. FIG. 1 shows the connection relation for testing the semiconductor device, relating to a DUT board 20 according to the first preferred embodiment incorporating a ringing preventive circuit 21, and a pin electronics card 7 of a conventional semiconductor testing apparatus. In FIG. 1, reference numeral 21 is a ringing preventive circuit being adjacent to a connector 5 of the DUT board 20, and comprising an input terminal 21a connected to a transmission path 4, and an output terminal 21b connected to the connector 5, and other reference numerals same as in FIG. 25 represent same or corresponding parts as in FIG. 25.

The ringing preventive circuit 21 is provided in the location adjacent to the connector 5 in order to prevent ringing before the signal outputted from the output terminal 21b of the ringing preventive circuit 21 reaches the connector 5.

The operation is explained below. It assumes that the signal from the output circuit of an objective device 1 is an output signal only, and a relay K1 in the pin electronics card 7 of the semiconductor testing apparatus is supposed to be in ON (closed) state. For example, it is supposed as follows: a waveform (L level voltage $V_L$, H level voltage $V_H$) shown in (a) of FIG. 27 is issued from the output circuit of the objective device 1, and is mixed with noise such as ringing in the process of passing through the transmission path 4, and it becomes a waveform as shown in (a) of FIG. 28 at the input terminal 21a of the ringing preventive circuit 21. Herein, the voltage at the input terminal 21a is supposed to be $V_{ri}$, and the voltage $V_{ri}$ is a voltage on the basis of GND. The lower side logic level is L level, and the higher side logic level is H level.

The ringing preventive circuit 21 operates when $V_{ri} > V_H + \Delta V$ and $V_{ri} < V_L - \Delta V$, and supplies a current for suppressing overshoot of shaded areas A, C shown in (a) of FIG. 28. The detail of the ringing preventive circuit 21 is shown in preferred embodiment 6 and after. When the ringing preventive circuit 21 operates in order to suppress overshoot of shaded areas A, C, the damping factor increased, and oscillations of shaded areas B, D shown in (a) of FIG. 28 become small, and the peak of voltage fluctuations corresponding to B, C approaches voltages $V_H$, $V_L$, respectively.

Figure 2:
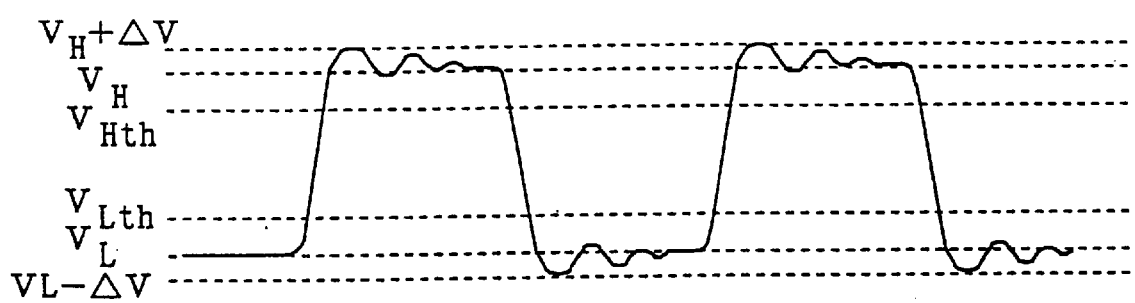
FIG. 2 is a waveform diagram showing an output signal from a ringing preventive circuit.
Figure 26:
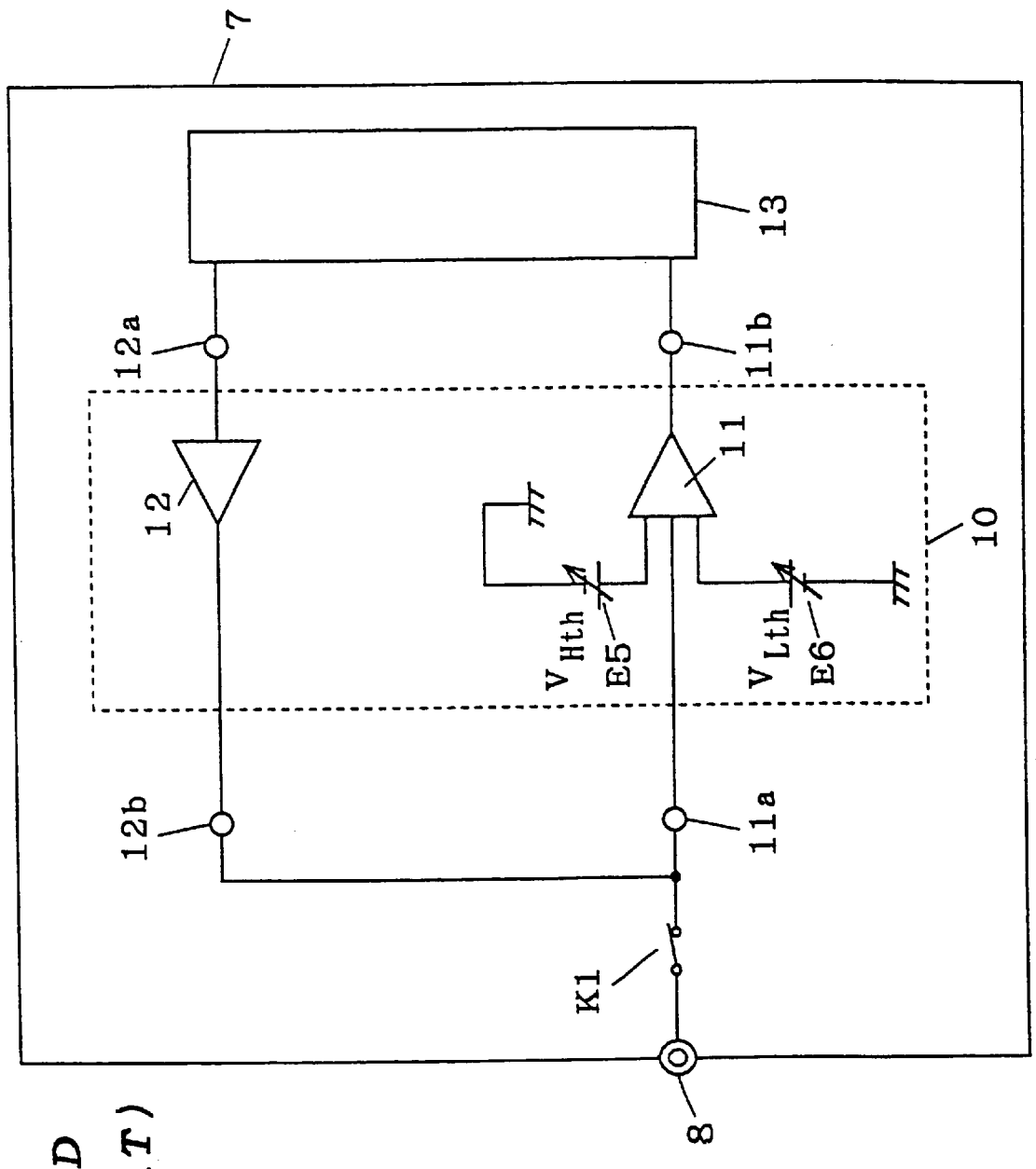
FIG. 26 is a block diagram showing the constitution of a conventional pin electronics card.

After passing through such ringing preventive circuit 21, the waveform appearing at the output terminal 21b of the ringing preventive circuit 21 becomes a waveform suppressed of ringing as shown in FIG. 2. Afterwards, it is put into an input terminal 11a of a pin electronics comparator/driver 10. The voltage $V_{ri}$ of the input signal is compared with threshold voltages $V_{Hth}$, $V_{Lth}$ of the pin electronics comparator 11 as shown in FIG. 26. As a result of comparison, the pin electronics comparator 11 outputs the waveform shown in (b) of FIG. 27 from an output terminal 11b of the pin electronics comparator 11, and a pin electronics control circuit 13 receives this output, and converts into a signal that can be processed in a semiconductor testing apparatus 6 shown in FIG. 25, and transmits inside.

By inserting such ringing preventive circuit 21 in a DUT board 20 of front stage of the pin electronics card 7 of the semiconductor testing apparatus, noise such as ringing inserted in the transmission path 4 can be removed, so that malfunction of the pin electronics comparator may be prevented.

Figure 3:
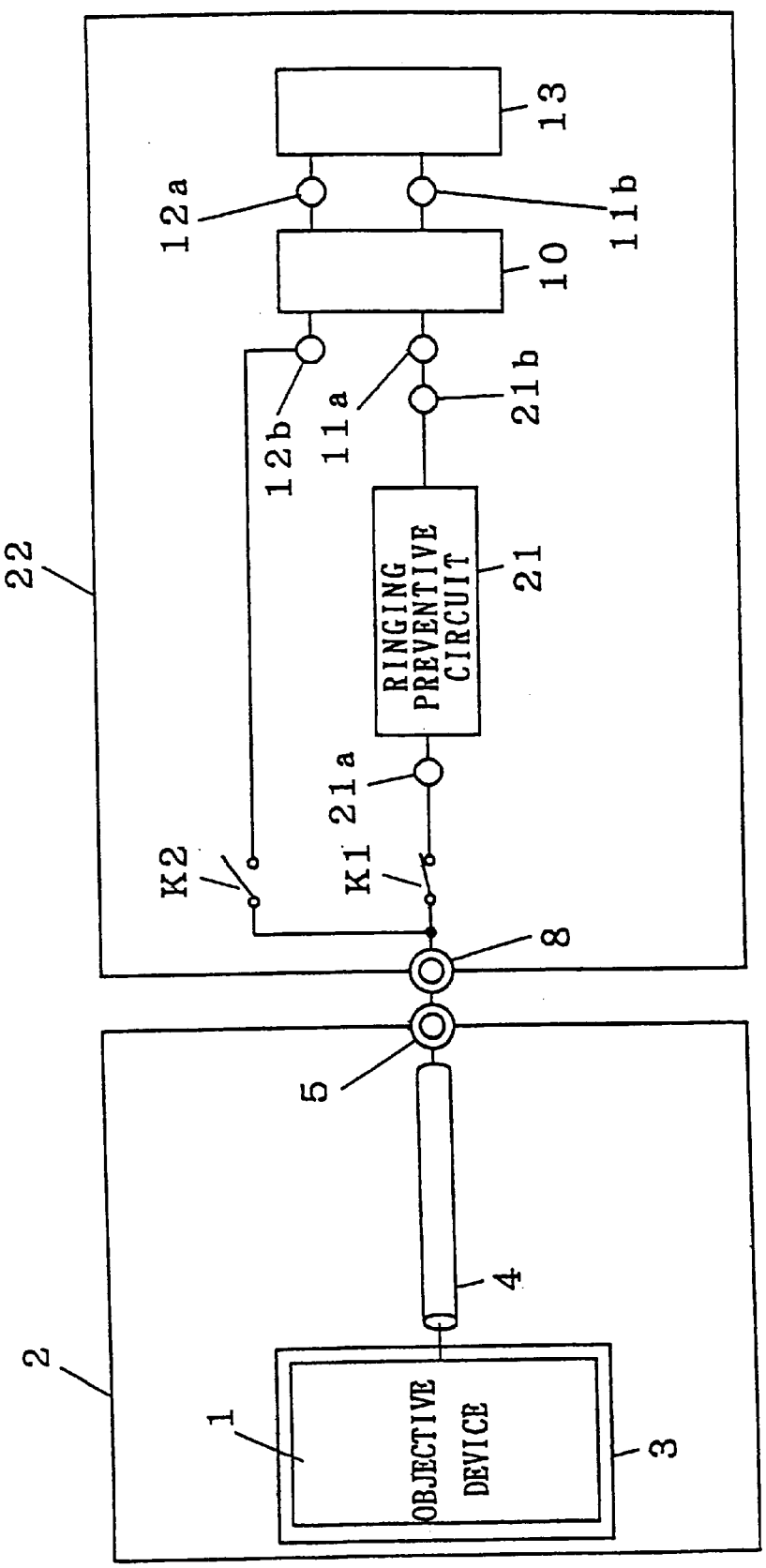
FIG. 3 is block diagram showing the constitution of a pin electronics card according to a second preferred embodiment of the invention connected to a DUT board.

A second preferred embodiment of the invention is described by reference to FIG. 3. FIG. 3 is a conceptual diagram for explaining the constitution of a pin electronics card according to the second preferred embodiment of the invention. FIG. 3 shows the connection relation for testing of semiconductor device, relating to a conventional DUT board 2 and a pin electronics card 22 of the semiconductor testing apparatus of the second preferred embodiment.

In FIG. 3, reference numeral 21 denotes a ringing preventive circuit having an input terminal 21a connected to the connector 8 through the relay K1 adjacent to the input terminal (the connector 8) of the pin electronics card 22, and an output terminal 21b connected to the input terminal 11a of the pin electronics comparator/driver 10, K2 is a relay having one end connected to the connector 8, and other end connected to the output terminal 12b of the pin electronics driver 12, and other reference numerals same as in FIG. 26 represent same or corresponding parts in FIG. 26.

What the pin electronics card 22 shown in FIG. 3 differs from the pin electronics card shown in FIG. 26 lies in that the ringing preventive circuit 21 is inserted between the relay K1 and input terminal 11a of the pin electronics comparator 11, and that the output terminal 12b of the pin electronics driver 12 is connected to the connector 8 through the relay K2. That the output terminal 12b of the pin electronics driver 12 is connected to the connector through the relay K2 is intended not to connect the input terminal 21a of the ringing preventive circuit 21 and the output terminal 12b of the pin electronics driver 12 when the pin electronics driver 12 operates. If the voltage at the output terminal 12b of the pin electronics driver 12 reaches the operating voltage of the ringing preventive circuit 21, it is intended so that the ringing preventive circuit 21 may not operate to supply current. It is therefore necessary to operate the relays K1, K2 complementarily. The ringing preventive circuit 21 should be preferably adjacent to the input terminal 11a of the pin electronics comparator 11 so that ringing may not occur in its output.

The operation is described below. Suppose that the signal from the output circuit 8 of the semiconductor device is output only, and that the relay K2 and relay K1 in the pin electronics card 22 of the semiconductor testing apparatus are respectively in OFF (open) and ON (closed) state.

For example, it is supposed as follows: a waveform (L level voltage $V_L$, H level voltage $V_H$) shown in (a) of FIG. 27 is issued from the output circuit of the objective device 1, and is mixed with noise such as ringing in the process of passing through the transmission path 4, and it becomes a waveform as shown in (a) of FIG. 28 when transmitted to the input terminal 21a of the ringing preventive circuit 21. Herein, the voltage at the input terminal 21a is supposed to be $V_{ri}$, and the voltage $V_{ri}$ is a voltage on the basis of GND. The ringing preventive circuit 21 operates when $V_{ri}>V_H+\Delta V$ and $V_{ri}<V_L-\Delta V$, and supplies a current for suppressing overshoot of shaded areas A, C shown in (a) of FIG. 28. The detail of the ringing preventive circuit 21 is shown in embodiments of FIG. 8 and after. When the ringing preventive circuit 21 operates in order to suppress overshoot of shaded areas A, C, the damping factor increases, and oscillations of shaded areas B, D shown in (a) of FIG. 28 become small, and the peak of voltage fluctuations corresponding to B, D approaches voltages $V_H$, $V_L$, respectively.

After passing through such ringing preventive circuit 21, the waveform appearing at the output terminal 21b of the ringing preventive circuit 21 becomes a waveform suppressed of ringing as shown in FIG. 2. Afterwards, it is put into an input terminal 11a of a pin electronics comparator 11. The voltage $V_{ri}$ of the input signal is compared with threshold voltages $V_{Hth}$, $V_{Lth}$ of the pin electronics comparator 11 as shown in FIG. 25. As a result of comparison, the pin electronics comparator 11 outputs the waveform shown in (b) of FIG. 27 from an output terminal 11b of the pin electronics comparator 11, and a pin electronics control circuit 13 receives this output, and converts into a signal that can be processed in a semiconductor testing apparatus 6 shown in FIG. 25, and transmits inside.

By inserting such ringing preventive circuit 21 in a front stage of the input terminal 11a of the pin electronics comparator 11 of the semiconductor testing apparatus, noise such as ringing inserted in the transmission path 4 can be removed, so that malfunction of the pin electronics comparator 11 may be prevented. In addition, by incorporating the ringing preventive circuit 21 in the pin electronics card 22 of the semiconductor testing apparatus, it is not necessary to install the ringing preventive circuit 21 in all DUT boards prepared in every application corresponding to the type of the objective device.

Figure 4:
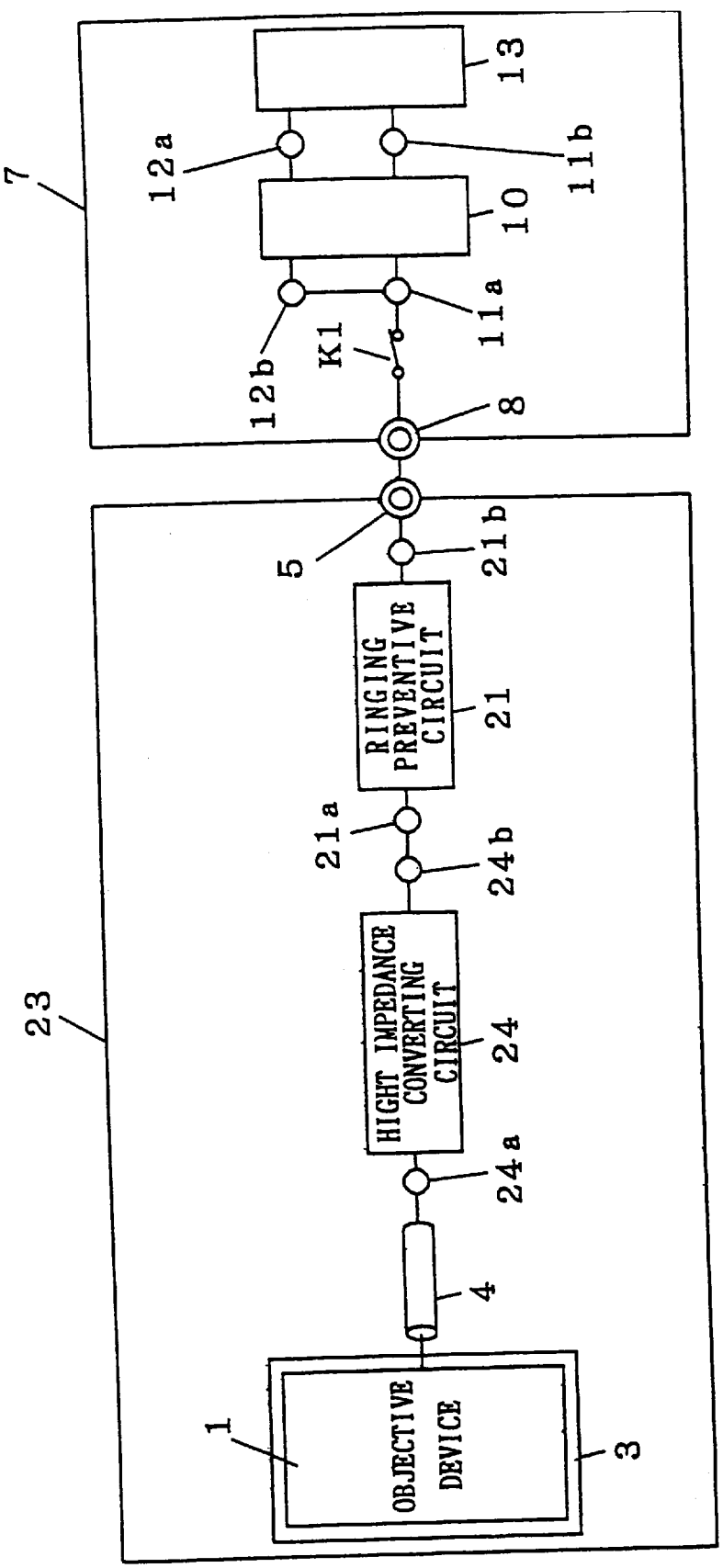
FIG. 4 is block diagram showing the constitution of a DUT board according to a third preferred embodiment of the invention connected to a pin electronics card.
Figure 5:
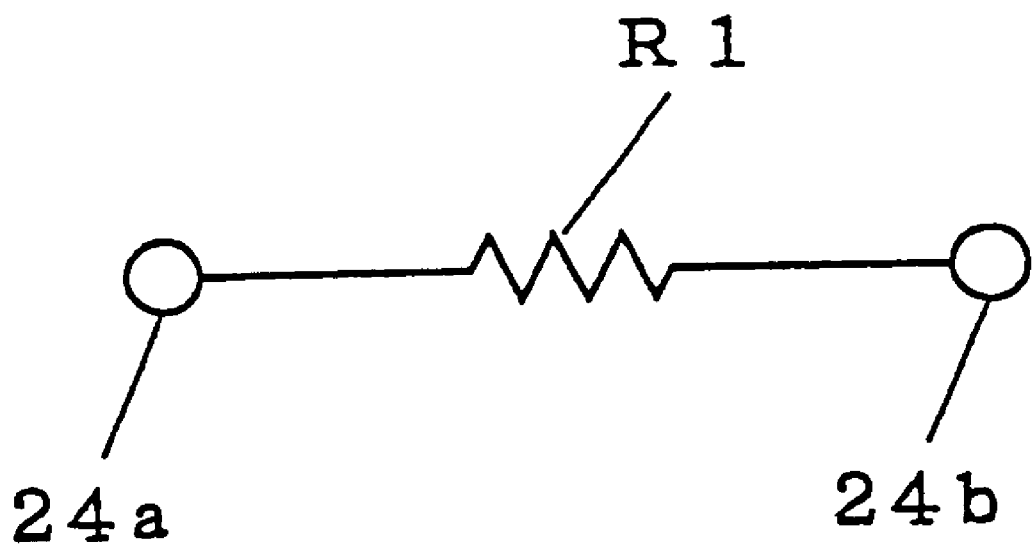
FIG. 5 is a circuit diagram showing an example of constitution of a high impedance converting circuit of FIG. 4.

A third preferred embodiment of the invention is described below by reference to FIG. 4 and FIG. 5. FIG. 4 is a conceptual diagram for explaining the constitution of a pin electronics card according to the third preferred embodiment of the invention. FIG. 4 shows the connection relation of testing of the semiconductor device, relating to the ringing preventive circuit 21 of the third preferred embodiment of the invention, the DUT board 23 incorporating a high impedance converting circuit 24, and the pin electronics card 7 of the conventional semiconductor testing apparatus.

The DUT board 23 shown in FIG. 4 is the DUT board 20 of the first preferred embodiment plus the high impedance converting circuit 24. The high impedance converting circuit 24 is inserted before the ringing preventive circuit 21. The high impedance converting circuit 24 comprises one end 24a connected to the transmission path 4 being built in the DUT board 23, and other end 24b connected to the input terminal 21a of the ringing preventive circuit 21. In FIG. 4, same reference numerals as in FIG. 1 denote the same corresponding parts as in FIG. 1. By inserting the high impedance converting circuit 24 before the ringing preventive circuit 21, the impedance when seeing the transmission path 4 side from the ringing preventive circuit 21 is higher than before insertion of the high impedance converting circuit 24.

The operation is explained below. The signal from the output circuit of the objective device 1 is an output signal only, and the relay K1 in the pin electronics card 7 of the semiconductor testing apparatus is supposed to be in ON (closed) state.

Suppose the waveform shown in (a) of FIG. 27 is issued from the output circuit of the objective device 1, pass through the transmission path 4, is converted into high impedance in the high impedance converting circuit 24, and mixed with noise such as ringing in the process of passing through the transmission path 4, and it becomes a waveform as shown in (a) of FIG. 28 at the input terminal 21a of the ringing preventive circuit.

The ringing preventive circuit 21 operates same as in the first preferred embodiment, that is, the ringing preventive circuit 21 operates when $V_{ri}>V_H+\Delta V$ and $V_{ri}<V_L-\Delta V$, upon input of the signal shown in (a) of FIG. 28 at the input terminal 21a of the ringing preventive circuit 21.

Afterwards, it is put into the input terminal 11a of the pin electronics driver 12 comparator 10 in FIG. 3, and is compared with threshold voltages $V_{Hth}$, $V_{Lth}$ of the pin electronics comparator 11 as shown in FIG. 26. The compared waveforms shown in (b) of FIG. 27 are sent out into the pin electronics control circuit 13 through the output terminal 11b of the pin electronics comparator 11.

By inserting such ringing preventive circuit 21 in the DUT board 23 connected to the front stage of the pin electronics card 7 of the semiconductor testing apparatus, noise such as ringing inserted in the transmission path 4 can be removed, so that malfunction of the pin electronics comparator 11 in the pin electronics comparator/driver 10 may be prevented.

By inserting the high impedance converting circuit 24 before the ringing preventive circuit 21, when the ringing preventive circuit 21 operates to supply current, the current flowing into the transmission path 4 becomes smaller. Accordingly, the current supplyback amount of the ringing preventive circuit 21 can be decreased. An example of high impedance converting circuit is shown in FIG. 5. The high impedance converting circuit shown in FIG. 5 has a resistance RI connected between one end 24a and other end 24b.

Figure 6:
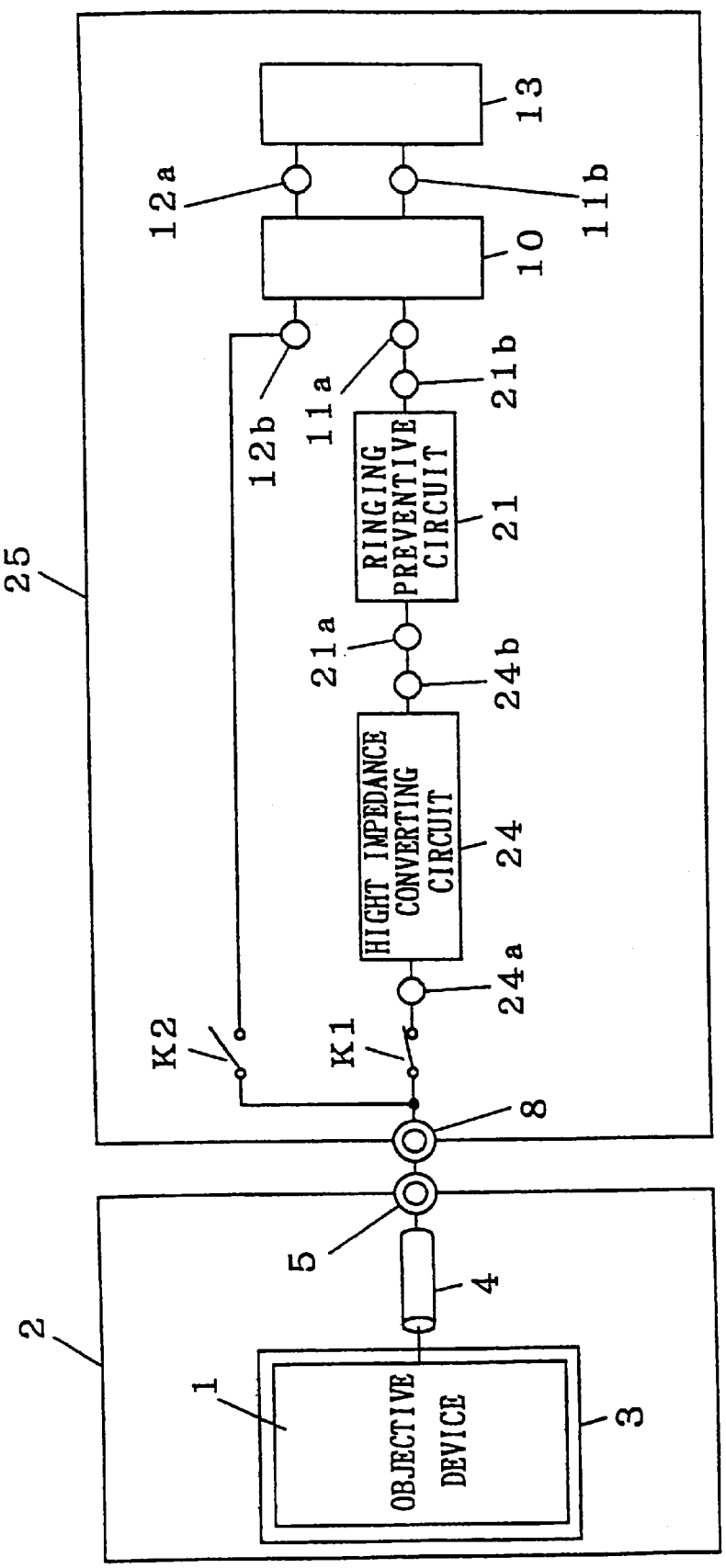
FIG. 6 is block diagram showing the constitution of a pin electronics card according to a fourth preferred embodiment of the invention connected to a DUT board.

A fourth preferred embodiment of the invention is described below by reference to FIG. 2, FIG. 5 and FIG. 6. FIG. 6 is a conceptual diagram for explaining the constitution of a pin electronics card according to the fourth preferred embodiment of the invention. FIG. 6 shows the connection relation of testing of the semiconductor device, relating to the conventional DUT board 2 and the pin electronics card 25 of the semiconductor testing apparatus according to the fourth preferred embodiment.

The pin electronics card 25 shown in FIG. 6 is composed of the pin electronics card 22 shown in FIG. 3 and the high impedance converting circuit 24 inserted before the ringing preventive circuit 21 shown in FIG. 3.

The high impedance converting circuit 24 comprises one end 24a connected to the other end of the relay K1 incorporated in the pin electronics card 25, and other end 24b connected to the input terminal 21a of the ringing preventive circuit 21. In FIG. 6, same reference numerals as in FIG. 3 denote the same corresponding parts as in FIG. 3. By inserting the high impedance converting circuit 24 before the ringing preventive circuit 21, the impedance of the connector 8 of the pin electronics card 25 viewed from the ringing preventive circuit 21 is higher than before insertion of the high impedance converting circuit 24.

The operation is explained below. The signal from the output circuit of the objective device 1 is an output only, and the relay K2 and relay K1 in the pin electronics card 25 of the semiconductor testing apparatus are supposed to be in OFF (open), and ON (closed) state, respectively.

The ringing preventive circuit 21 operates same as in the second preferred embodiment, that is, the ringing preventive circuit 21 operates when $V_{ri}>V_H+\Delta V$ and $V_{ri}<V_L-\Delta V$, upon input of the signal shown in (a) of FIG. 28 at the input terminal 21a of the ringing preventive circuit 21.

After passing through such ringing preventive circuit 21, the waveform appearing at the output terminal 21b of the ringing preventive circuit 21 becomes a waveform suppressed in ringing as shown in FIG. 2. Afterwards, it is put into the input terminal 11a of the pin electronics comparator 11, and the voltage $V_{ri}$ of the input signal is compared with threshold voltages $V_{Hth}$, $V_{Lth}$ of the pin electronics comparator 11 as shown in FIG. 25. As a result of comparison, the pin electronics comparator 11 outputs the waveform shown in (b) of FIG. 27 from the output terminal 11b of the pin electronics comparator 11, and the pin electronics control circuit 13 receives its output, and converts it into a signal that can be processed in the semiconductor testing apparatus shown in FIG. 25, and transmits inside.

By inserting such ringing preventive circuit 21 before the input terminal of the pin electronics comparator 11 of the pin electronics comparator/driver 10, noise such as ringing mixed in the transmission path 4 can be removed, so that malfunction of the pin electronics comparator 11 may prevented.

By incorporating the ringing preventive circuit 21 into the pin electronics card 25 of the semiconductor testing apparatus, it is not necessary to install the ringing preventive circuit 21 in all DUT boards prepared in every application corresponding to the type of the objective device, and it is economical.

By inserting the high impedance converting circuit 24 before the ringing preventive circuit 21, when the ringing preventive circuit 21 operates to supply current, the current flowing out from the connector 8 becomes smaller. Accordingly, the current supplyback amount of the ringing preventive circuit 21 can be decreased. What is shown in FIG. 5 is used in the high impedance converting circuit 24.

Figure 7:
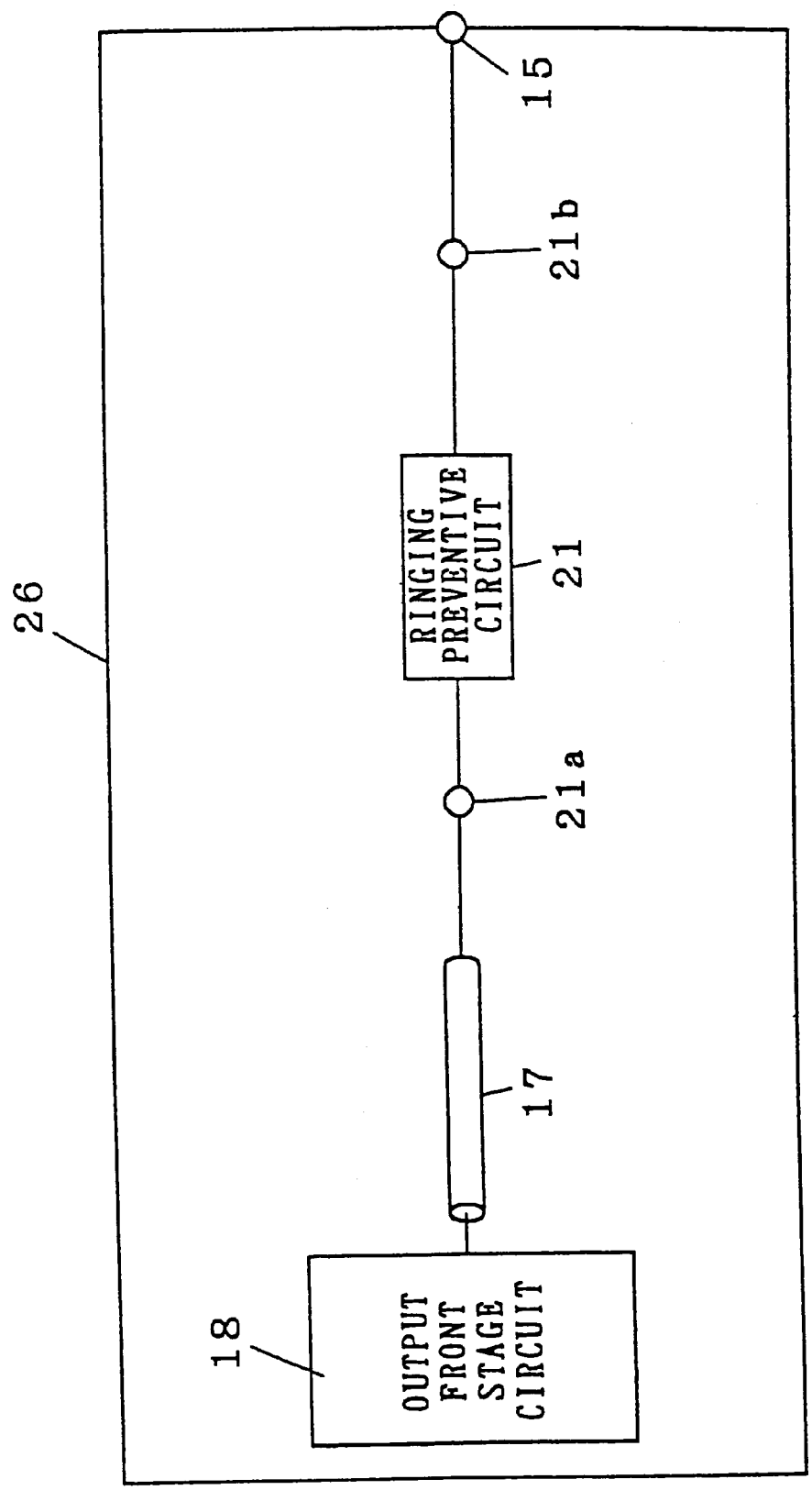
FIG. 7 is block diagram showing the constitution of a semiconductor device according to a fifth preferred embodiment of the invention.
Figure 29:
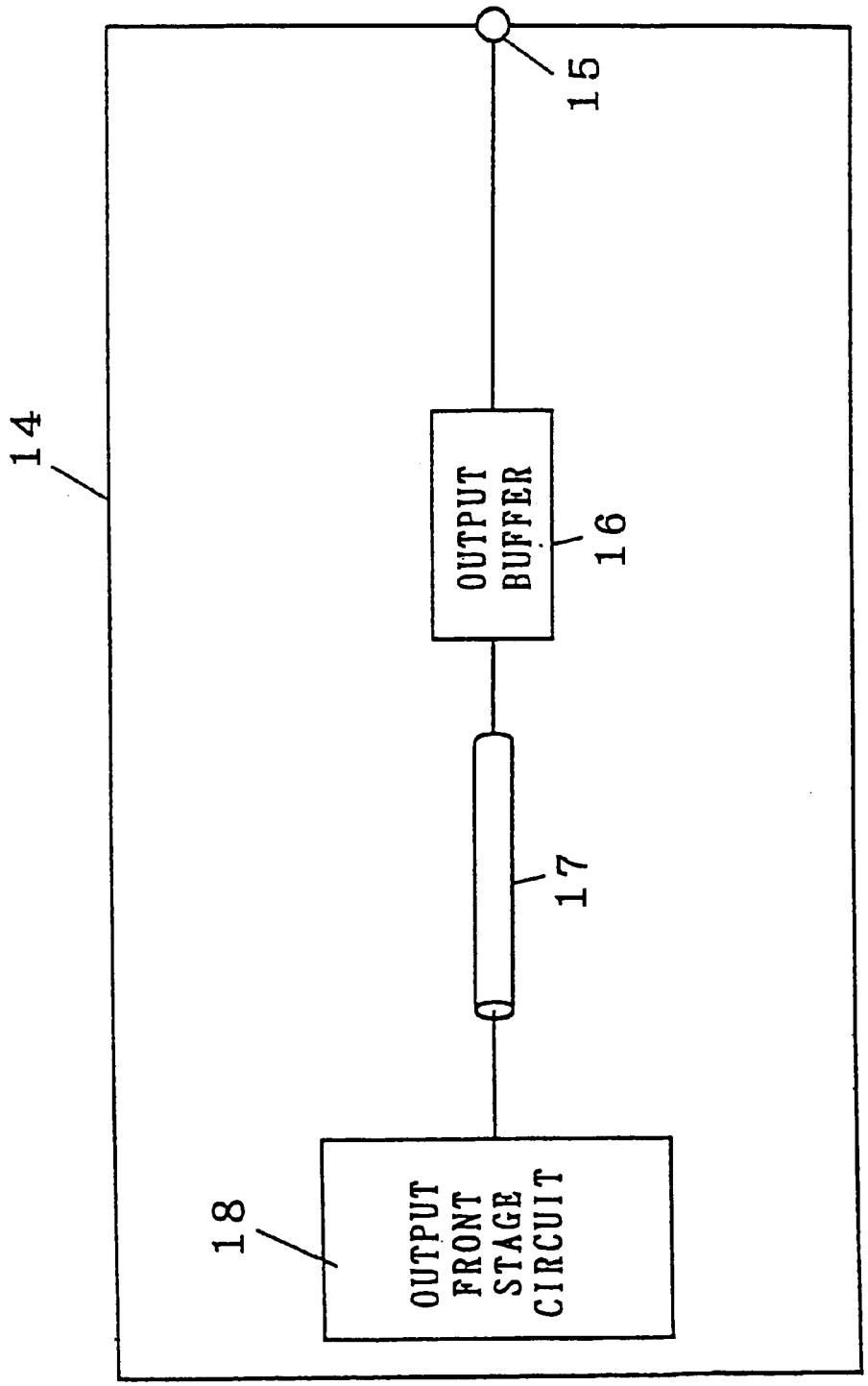
FIG. 29 is a block diagram showing the constitution of a conventional semiconductor device.

A semiconductor device according to a fifth preferred embodiment of the invention is described below by reference to FIG. 7. FIG. 7 is a conceptual diagram showing the constitution of the semiconductor device of the fifth preferred embodiment of the invention. In the semiconductor device 26 shown in FIG. 7, the ringing preventive circuit 21 is adjacent to the output pin 15. What the semiconductor device 26 of the fifth preferred embodiment differs from the semiconductor device 14 shown in FIG. 29 is that the ringing preventive circuit 21 is used instead of the output buffer 16. Inside the ringing preventive circuit 21, as explained in the embodiment of FIG. 8 and after, a buffer amplifier is provided between input terminal 21a and output terminal 21b, so that the output buffer can be omitted.

In FIG. 7, reference numeral 26 is the semiconductor device, 15 is the output pin of the semiconductor device, 21 is the ringing preventive circuit having the input terminal 21a and output terminal 21b connected to the output pin 15, for giving an output signal being rid of ringing to the output pin 15, 17 is the transmission path connected to the input terminal 21a of the ringing preventive circuit 21, and 18 is a circuit before an output stage for generating a signal to be transmitted to the transmission path 17. The transmission path 17 is a wiring formed in the semiconductor device 26, which may include wiring of aluminum, polysilicon, etc., and the output pin 15 may be a pad or the like.

The operation is described below. From the circuit 18 before the output stage of the semiconductor device 26, for example, an output signal having a waveform shown in (a) of FIG. 27 is outputted, and it is transmitted to the input terminal 21a of the ringing preventive circuit 21 through the transmission path 17 composed of internal wiring of the semiconductor device 26. The output signal is mixed with noise such as ringing while passing through the transmission route 17 and others, and it is supposed to become the waveform shown in (a) of FIG. 28 when reaching the input terminal 21a of the ringing preventive circuit. Supposing the voltage at the input terminal 21a to be $V_{ri}$, the voltage $V_{ri}$ is supposed to be a voltage on the basis of GND.

The ringing preventive circuit 21 operates when $V_{ri}>V_H+\Delta V$ and $V_{ri}<V_L-\Delta V$, and supplies a current for suppressing overshoot of shaded areas A, C shown in (a) of FIG. 28. Details of preferred embodiments of the ringing preventive circuit 21 are shown in embodiments 1 and after. When the ringing preventive circuit 21 operates in order to suppress overshoot of shaded areas A, C, the damping factor increases, and oscillations of shaded areas B, D shown in (a) of FIG. 28 decrease, and the vibration peak voltage approaches voltages $V_H$, $V_L$, respectively. Afterwards, from the output terminal 21b of the ringing preventive circuit 21, the output signal having the waveform as shown in FIG. 2 is transmitted to the output pin 15 of the semiconductor device 26.

By inserting such ringing preventive circuit 21 to the output unit of the semiconductor device 26, it is possible to remove the nosie, such as ringing, mixed in the transmission path 17.

Figure 8:
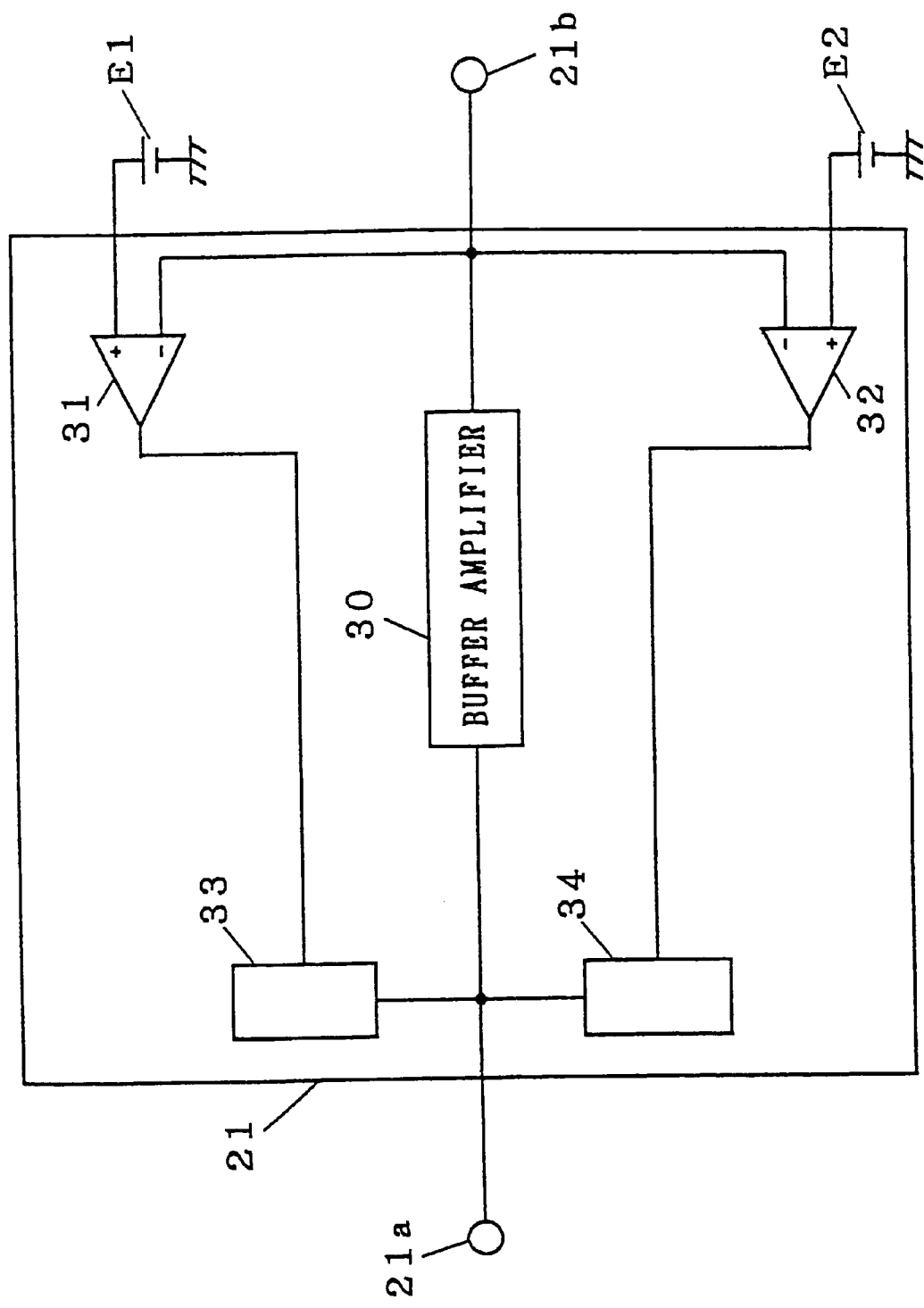
FIG. 8 is block diagram showing the constitution of a ringing preventive circuit.

The ringing preventive circuit according to the invention is described below by referring to FIG. 8 to FIG. 12, FIG. 32, and FIG. 33. FIG. 8 is a block diagram showing the constitution of the ringing preventive circuit 21. In FIG. 8, reference numeral 30 is a buffer amplifier having an input terminal connected to the input terminal 21a of the ringing preventive circuit 21, and an output terminal connected to the output terminal 21b of the ringing preventive circuit 21, 31 is a lower potential side comparator (hereinafter called L side comparator) having an inverting input terminal connected to the output terminal of the buffer amplifier 30, a non-inverting input terminal connected to a reference power source E1, and an output terminal, for comparing if the output of the buffer amplifier 30 is smaller than the voltage of the reference power source E1 or not, 33 is a lower potential side current supply circuit (hereinafter called L side current supply circuit) for supplying current to an input terminal of the buffer amplifier 30 in response to the signal given from the output terminal of the L side comparator 31, 32 is a higher potential side comparator (hereinafter called H side comparator) having an inverting input terminal connected to the output terminal of the buffer amplifier 30, a non-inverting input terminal connected to a reference power source E2, and an output terminal, for comparing if the output of the buffer amplifier 30 is larger than the voltage of the reference power source E2 or not, 34 is a higher potential side current supply circuit (hereinafter called H side current supply circuit) for supplying current flowing out from the input terminal of the buffer amplifier 30 in response to the signal given from the output terminal of the H side comparator 32, and others of the same reference numerals as in FIG. 1 are same or corresponding parts as in FIG. 1. The buffer amplifier 30 is usually used as gain 1. However, the gain of the buffer amplifier 30 is determined depending on the specification of the circuit connected to the input and the circuit connected to the output, and hence it is not limited to 1.

The operation is described below. The voltage at the input terminal 21a of the ringing preventive circuit 21 is supposed to be voltage $V_{ri}$ on the basis of GND, the voltage (base line) converged at the L side of the waveform mixed with noise such as ringing to be voltage $V_L$ on the basis of GND, the voltage (top line) converged at the H side of the waveform mixed with noise such as ringing to be voltage $V_H$ on the basis of GND, the voltage of the reference power source E1 to be $V_L - \Delta V$, the voltage of the reference power source E2 to be $V_H + \Delta V$. Among these voltages, there is a relation of $V_L - \Delta V < V_L < V_H < V_H + \Delta V$, where $\Delta V$ is set as $\Delta V > Vos$, supposing the maximum offset voltage of the L side comparator 31 and H side comparator 32 to be Vos.

When the waveform mixed with ringing or other noise shown in (a) of FIG. 28 is put in the input terminal 21a of the ringing preventive circuit 21, at the output side of the ringing preventive circuit 21, the impedance is low in the buffer amplifier 30, and the output voltage of the buffer amplifier 30 having the gain equal to 1 is $V_{ri}$.

When $V_{ri} < V_L - \Delta V$, the output of the L side comparator 31 is H level, and the L side current supply circuit 33 is operated, and a current is supplied to the front stage of the buffer amplifier 30.

When $V_{ri} > V_L - \Delta V$, the output of the L side comparator 31 is L level, and the L side current supply circuit 33 is not operated, and no current is supplied to the front stage of the buffer amplifier 30.

When $V_{ri} < V_H + \Delta V$, the output of the H side comparator 32 is H level, and the H side current supply circuit 34 is not operated, an no current is supplied to the front stage of the buffer amplifier 30.

When $V_{ri} > V_H + \Delta V$, the output of the H side comparator 32 is L level, and the H side current supply circuit 34 is operated, and a current (negative current) is supplied to the front stage of the buffer amplifier 30.

The above operations are summed up in Table 1.

TABLE 1

| Ringing preventive circuit input voltage $V_{ri}$ | Output of L side comparator | Output of H side comparator | L side current supply circuit | H side current supply circuit |
|---|---|---|---|---|
| $V_{ri} > V_H + \Delta V$ | L | L | OFF | ON |
| $V_H + \Delta V > V_{ri} > V_H - \Delta V$ | L | H | OFF | OFF |
| $V_L - \Delta V > V_{ri}$ | H | H | ON | OFF |

In this way, the ringing preventive circuit 21 eliminates the shaded areas A, C in (a) of FIG. 28. At this time, the shaded areas B, D are smaller in oscillation as the damping factor increases when removing the shaded areas A, C, and hence the peak voltage of oscillation approaches $V_H$ and $V_L$. The waveform of the output terminal 21b after passing through such ringing preventive circuit 21 is a waveform having a range from $V_H + \Delta V$ to $V_L - \Delta V$ as shown in FIG. 2.

After the transmission path for transmitting the digital waveform, when this ringing preventive circuit 21 is inserted, voltage noise of ringing or the like is prevented, and malfunction of the subsequent circuits can be suppressed as far as possible.

The buffer amplifier is described below while referring to FIG. 10 to FIG. 12, FIG. 32, and FIG. 33. FIG. 10 is a circuit diagram showing the constitution of a buffer amplifier including emitter follower. FIG. 10 shows different circuit compositions of the constitution of the buffer amplifier.

In (a) of FIG. 10, reference numeral 35 is an input terminal of the buffer amplifier, 45 is an output terminal of the buffer amplifier, Q80 is an npn type bipolar transistor having a base connected to the input terminal 35, an emitter provided with a negative supply voltage Em, and a collector, 36 is a constant current source connected to a node provided with a positive supply voltage Ep for producing a specific current I1, R50 is a resistance having one end connected to the node provided with the positive supply voltage Ep through the constant current source 36 and other end connected to the collector of the npn type bipolar transistor QS0, Q81 is an npn type bipolar transistor having a base connected to the collector of the npn type bipolar transistor Q80, an emitter provided with the negative supply voltage Em, and a collector connected to the output terminal 45 of the buffer amplifier, 37 is a constant current source connected to the node provided with the positive supply voltage Ep for producing a specific current I2, and R51 is a resistance having one end connected to the constant current source 37 and other end connected to the output terminal 45.

In (b) of FIG. 10, reference numeral 35 is an input terminal of the buffer amplifier, 45 is an output terminal of the buffer amplifier, Q82 is an npn type bipolar transistor having a base connected to the input terminal 35, an emitter provided with a negative supply voltage Em, and a collector, R52 is a resistance having one end provided with a positive supply voltage Ep and other end connected to the collector of the transistor Q82, Q83 is an npn type bipolar transistor having a base connected to the collector of the transistor Q82, an emitter provided with the negative supply voltage Em, and a collector connected to the output terminal 45, and R53 is a resistance having one end connected to the node provided with the positive supply voltage Ep and other end connected to the output terminal 45.

The buffer amplifiers shown in FIG. 10 are mainly applicable to ringing at the lower potential side. To ringing at the higher potential side, the output current of the ringing preventive circuit 21 is applicable in a range of I2 or less.

In addition, the same circuit as shown in FIG. 10 can be composed by using a MOS transistor. FIG. 32 is a circuit diagram showing the constitution of a buffer amplifier of source follower type. FIG. 32 shows different circuit compositions of buffer amplifier.

In (a) of FIG. 32, reference numeral 35 is an input terminal of the buffer amplifier, 45 is an output terminal of the buffer amplifier, Q90 is an n channel MOS transistor having a gate connected to the input terminal 35, a source provided with a negative supply voltage Em, and a drain, 76 is a constant current source connected to a node provided with a positive supply voltage Ep for producing a specific current I1, R60 is a resistance having one end connected to the node provided with the positive supply voltage Ep through the constant current source 76 and other end connected to the drain of the n channel MOS transistor Q90, Q91 is an n channel MOS transistor having a gate connected to the drain of the n channel MOS transistor Q90, a source provided with the negative supply voltage Em, and a drain connected to the output terminal 45 of the buffer amplifier, 77 is a constant current source connected to the node provided with the positive supply voltage Ep for producing a specific current I2, and R61 is a resistance having one end connected to the constant current source 77 and other end connected to the output terminal 45.

In (b) of FIG. 32, reference numeral 35 is an input terminal of the buffer amplifier, 45 is an output terminal of the buffer amplifier, Q92 is an n channel MOS transistor having a gate connected to the input terminal 35, a source provided with a negative supply voltage Em, and a drain, R62 is a resistance having one end provided with a positive supply voltage Ep and other end connected to the drain of the transistor Q92, Q93 is an n channel MOS transistor having a gate connected to the drain of the transistor Q92, a source provided with the negative supply voltage Em, and a drain connected to the output terminal 45, and R63 is a resistance having one end connected to the node provided with the positive supply voltage Ep and other end connected to the output terminal 45. The buffer amplifiers shown in FIG. 32 are mainly applicable to ringing at the lower potential side. To ringing at the higher potential side, the output current of the ringing preventive circuit 21 is applicable in a range of I2 or less.

FIG. 11 and FIG. 12 are conceptual diagram and circuit diagram showing the constitution of the buffer amplifier using an operational amplifier. In (a) of FIG. 11, reference numeral 35 is an input terminal of the buffer amplifier, 45 is an output terminal of the buffer amplifier, 38 is a differential input stage having a non-inverting input terminal connected to the input terminal 35, an inverting input terminal connected to the output terminal 45, and an output terminal 40, and 41 is an output stage having an input terminal 42 connected to the output terminal 40 of the differential input stage and the output terminal 45.

The circuit composition of the output stage 41 is shown in (b) of FIG. 11. The output stage shown in (b) of FIG. 11 is a push-pull amplifier. In (b) of FIG. 11, reference numeral Q84 is an npn type bipolar transistor having a base connected to the input terminal 42, an emitter provided with a negative supply voltage Em, and a collector, D10 is a diode having a cathode connected to the collector of the transistor Q84, and an anode, 43 is a constant current power source connected to the node provided with a positive supply voltage Ep for producing a specific current I, D11 is a diode having a cathode connected to the anode of the diode D10, and an anode connected to the constant current source 43, Q85 is a pnp type bipolar transistor having a base connected to the collector of the transistor Q84, a collector provided with the negative supply voltage Em, and an emitter connected to the output terminal 45, and Q86 is an npn type bipolar transistor having a collector provided with the positive supply voltage Ep, an emitter connected to the output terminal 45, and a base connected to the anode of the diode D11.

The circuit composition of the output stage 41 shown in (a) of FIG. 11 may be as shown in FIG. 12. The output stage shown in (a) of FIG. 12 is an example of totem pole type output stage. In (a) of FIG. 12, reference numeral Q87 is an npn type bipolar transistor having a base connected to the input terminal 42, an emitter provided with a negative supply voltage Em, and a collector, D12 is a diode having a cathode connected to the collector of the transistor Q87, and an anode connected to the output terminal 45, R55 is a resistance having one end provided with a positive supply voltage Ep and other end, and Q88 is an npn type bipolar transistor having a base connected to the other end of the resistance R55, a collector provided with the positive supply voltage Ep, and an emitter connected to the output terminal. Herein, the other end of the resistance R55 and the cathode of the diode D12 are connected.

The output stage shown is (b) of FIG. 12 is other example of totem pole amplifier. In (b) FIG. 12, same reference numerals as in (a) of FIG. 12 are same or corresponding parts in (a) of FIG. 12. In (b) of FIG. 12, reference numeral Q89 is an npn type bipolar transistor having a base connected to the input terminal 42, an emitter provided with a negative supply voltage Em, and a collector connected to the base of the transistor Q87, R56 is a resistance connected between the output terminal 45 and input terminal 42, and D13 is a diode having an anode connected to the other end of the resistance R55 and a cathode connected to the cathode of the diode D12. In the output stage in (a) of FIG. 12, the other end of the resistance R55 and the cathode of the diode D12 are short-circuited, whereas in the output stage shown in (b) of FIG. 12, the other end of the resistance R55 and the cathode of the diode D12 are connected together through the diode D13.

FIG. 33 is a circuit diagram showing the constitution of a buffer amplifier using an operational amplifier. The other examples of the circuit composition of the output stage 41 shown in (a) of FIG. 11 are shown in FIG. 33. In (a) of FIG. 33, reference numeral Q94 is an n channel MOS transistor having a gate connected to the input terminal 42, a source provided with a negative supply voltage Em, and a drain, 91 is a constant current source connected to the node provided with a positive supply voltage Ep for producing a specific current I to the drain of the transistor Q94, Q95 is a p channel MOS transistor having a gate connected to the drain of the transistor Q94, a drain provided with the negative supply voltage Em, and a source connected to the output terminal 45, and Q96 is an n channel MOS transistor having a drain provided with the positive supply voltage Ep, source connected to the output terminal 45, and a gate connected to the drain of the transistor Q94.

In (b) of FIG. 33, reference numeral Q97 is an n channel MOS transistor having a gate connected to the input terminal 42, a source and a drain, Q98 is an n channel MOS transistor having a source provided with a negative supply voltage Em, a drain connected to the source of the transistor Q97, and a gate connected to the source of the transistor Q97, 96 is a constant current source for supplying a specific current from the connection point provided with a positive supply voltage Ep to the drain of the transistor Q97, Q99 is an n channel MOS transistor having a drain provided with the positive supply voltage Ep, a gate connected to the drain of the transistor Q97, and a source connected to the output terminal, and Q100 is an n channel MOS transistor having a source provided with the negative supply voltage Em, a gate connected to the source of the transistor Q97, and a drain connected to the output terminal 45.

Figure 9:
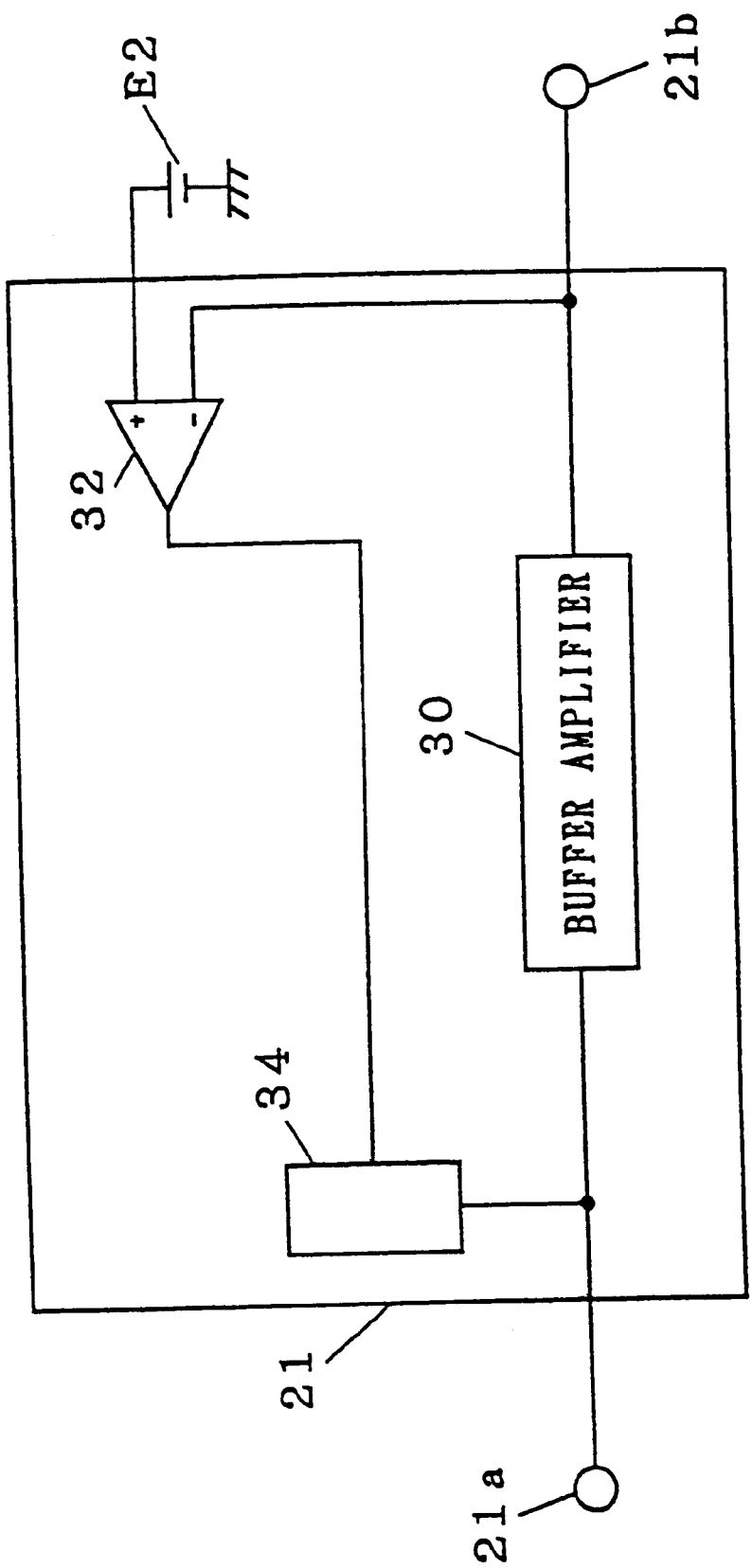
FIG. 9 is block diagram showing another constitution of the ringing preventive circuit.

In a preferred embodiment, the ringing preventive circuit capable of removing ringing occurring on the basal line and the top line of the pulse simultaneously is explained, but, for example, if ringing on the top line only is a problem, as shown in FIG. 9, the L side comparator 31 and L side current supply circuit 33 can be omitted from the ringing preventive circuit 21 shown in FIG. 8. The same is said of the basal line side.

A first embodiment of the ringing preventive circuit of FIG. 8 of the invention is described below by referring to FIG. 13.

Figure 13:
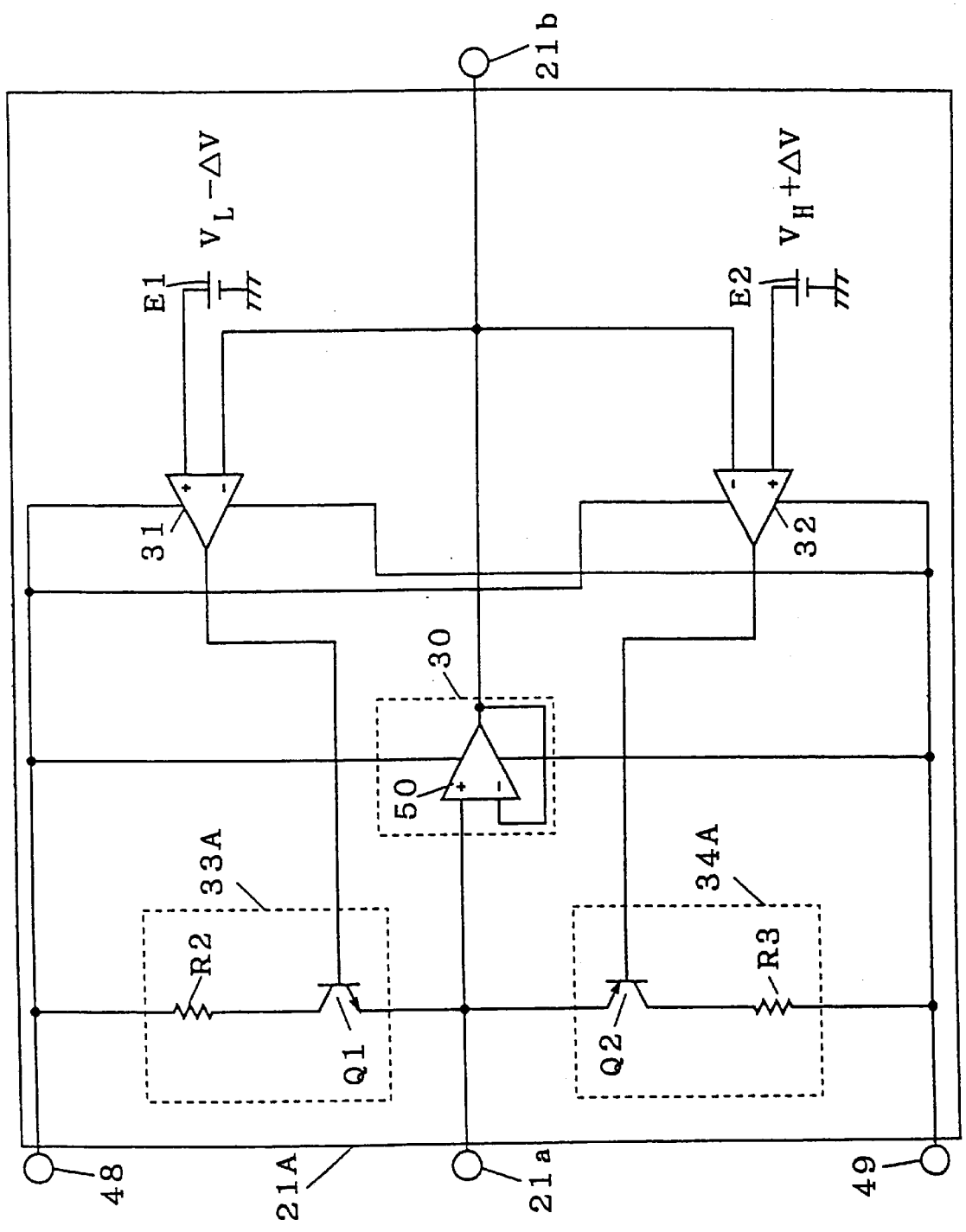
FIG. 13 is a circuit diagram showing the constitution of a ringing preventive circuit according to a first preferred embodiment of the circuit of FIG. 8.

In FIG. 13, reference numeral 48 is a positive power source terminal of a ringing preventive circuit 21A, 49 is a negative power source terminal of a ringing preventive circuit 21A, 50 is an operational amplifier having a non-inverting input terminal connected to an input terminal 21a, an inverting input terminal connected to an output terminal 21b, and an output terminal connected to the output terminal 21b, R2 is a resistance having one end connected to the positive power source terminal 48, and other end, Q1 is an npn type bipolar transistor having a collector connected to the other end of the resistance R2, an emitter connected to the non-inverted input terminal of the operational amplifier 50, and a base connected to the output terminal of an L side comparator 31, R3 is a resistance having one end connected to the negative power source terminal 49, and other end, Q2 is a pnp type bipolar transistor having a collector connected to the other end of the resistance R3, an emitter connected to the non-inverted input terminal of the operational amplifier 50, and a base connected to the output terminal of an H side comparator 32, and other reference numerals same as in FIG. 8 denote same or corresponding parts as in FIG. 8. The L side comparator 31 and H side comparator 32 shown in FIG. 13 are both connected to the positive power source terminal 48 and negative power source terminal 49, and are operated by the voltage supplied from the positive power source terminal 48 and negative power source terminal 49 to the ringing preventive circuit 21A.

As shown in FIG. 13, the L side current supply circuit 33A is composed of resistance R2 and npn transistor Q1. The H side current supply circuit 34A is composed of resistance R3 and pnp type transistor Q2. In FIG. 13, the buffer amplifier 30 is composed of the voltage follower using an operational amplifier as shown in (a) of FIG. 11, but it may be composed otherwise, and, for example, it may be also composed by using an emitter following as shown in FIG. 10, and the same effects are brought about.

The operation is described below. The voltages $V_{ri}$, $V_L$, $V_H$, $V_L-\Delta V$, $V_H+\Delta V$ are supposed to be defined same as in the embodiment of FIG. 8. In addition, the potential of the positive power source terminal 48 is supposed to be Ep, the potential of the negative power source terminal 49 to be Em, the collector-emitter voltage of the npn type transistor Q1 to be Vce1, the collector-emitter voltage of the pnp type transistor Q2 to be Vce2, and the voltage of the input terminal 21a of the ringing preventive circuit 21 to be Vin. The relation of the voltages Ep, Em, $V_L$, $V_H$, $V_L-\Delta V$, and $V_H+\Delta V$ is supposed to be Ep>$V_H+\Delta V$>$V_H$>$V_L$>$V_L-\Delta V$>Em.

When a waveform mixed with noise such as ringing as shown in (a) of FIG. 28 is put in the input terminal 21a of the ringing preventive circuit 21A, the output potential $V_{ri}$ becomes as follows:

When $V_{ri}$<$V_L-\Delta V$, the output of the L side comparator 31 is H level, and the L side current supply circuit 33A is operated, and a current is supplied to the front stage of the buffer amplifier 30. The current Ip supplied at this time is Ip=(EP−Vin−Vce1)/R2.

When $V_{ri}$>$V_L-\Delta V$, the output of the L side comparator 31 is L level, and the L side current supply circuit 33A is not operated, and no current is supplied to the front stage of the buffer amplifier 30.

When $V_{ri}$<$V_H+\Delta V$, the output of the H side comparator 32 is H level, and the H side current supply circuit 34A is not operated, and no current is supplied to the front stage of the buffer amplifier 30.

When $V_{ri}$>$V_H+\Delta V$, the output of the H side comparator 32 is L level, and the H side current supply circuit 34A is operated, and a current (negative current) is supplied to the front stage of the buffer amplifier 30. The current Im supplied at this time is Im=(Vin−Em−Vce2)/R3.

In this way, the ringing preventive circuit 21A operates so as to remove the shaded areas A, C in (a) of FIG. 28. At this time, the shaded areas B, D, are decreased in oscillation because the damping factor increases when removing the shaded areas A, C, and the peak voltage of the oscillation approaches $V_H$ and $V_L$. Thus, the waveform of the output terminal 21b after passing through the ringing preventive circuit 21A is a waveform having range from $V_H+\Delta V$ to $V_L-\Delta V$ as shown in FIG. 2.

When this ringing preventive circuit is inserted after the transmission path of digital signal, voltage noise such as ringing is prevented, and malfunction in the circuit succeeding the next stage can be suppressed effectively.

In the ringing preventive circuit according to the first preferred embodiment, the currents in the condition of R2=R3 and (Ep−Vin−Vce1)=(Vin−Em−Vce2) are in the relation of Ip=Im. If, however, there is a large voltage difference between (Ep−Vin−Vce1) and (Vin−Em−Vce2), or there is a large difference in the level of noise such as ringing between H and L side, R2 and R3 must be adjusted.

A second embodiment of the ringing preventive circuit of FIG. 8 of the invention is described below while referring to FIG. 14.

Figure 14:
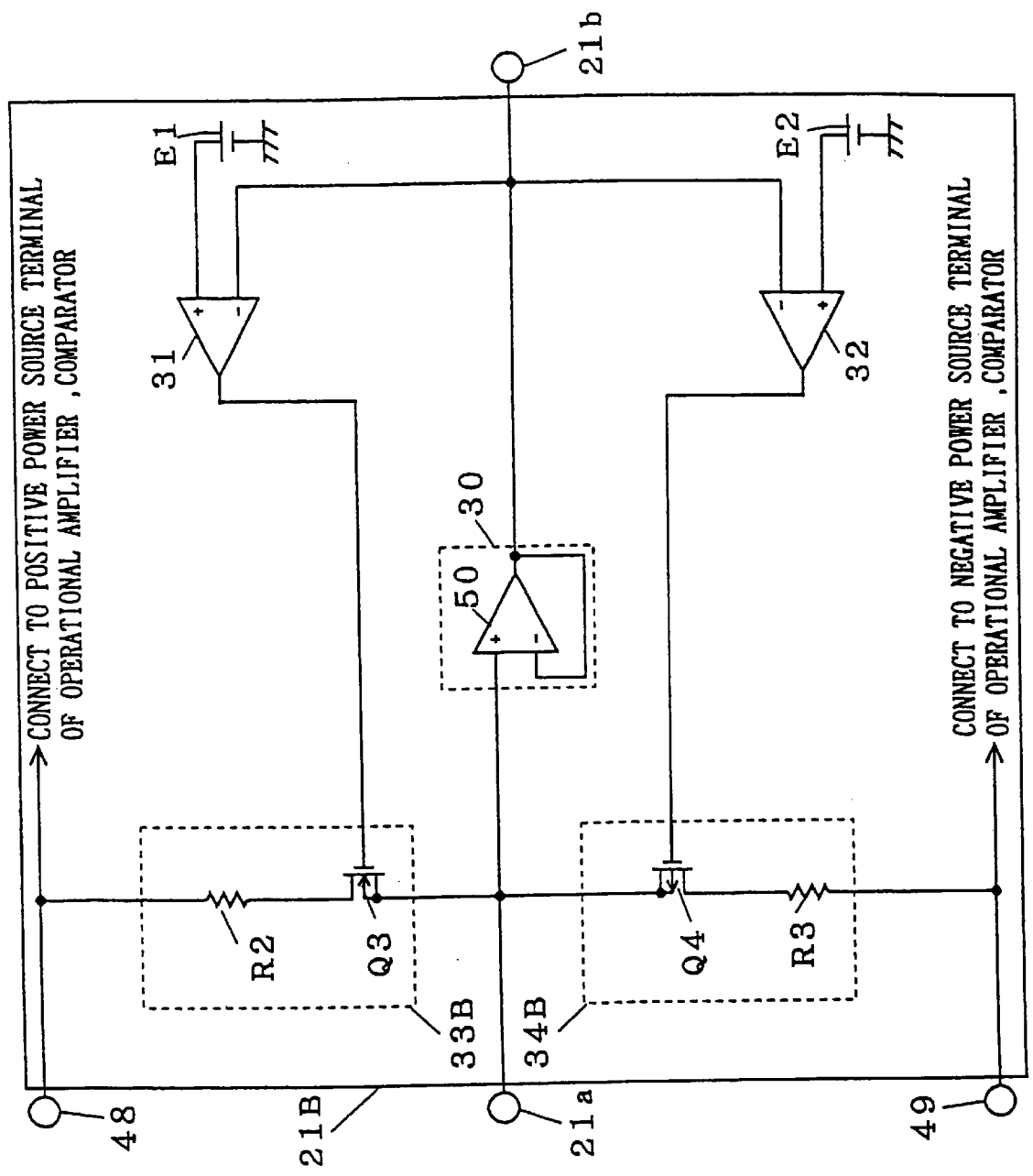
FIG. 14 is a circuit diagram showing the constitution of a ringing preventive circuit according to a second preferred embodiment of the circuit FIG. 8.

In the ringing preventive circuit of FIG. 14, instead of the npn type bipolar transistor Q1 and pnp type bipolar transistor Q2 used in the ringing preventive circuit of FIG. 13, an n channel MOS transistor Q3 and a p channel MOS transistor Q4 are used.

In FIG. 14, an L side current supply circuit 33B is composed of the resistance R2 and n channel MOS transistor Q3. The source of the transistor Q3 is connected to the non-inverting input terminal of the operational amplifier 50, its drain is connected to the other end of the resistance R2, and the gate is connected to the output terminal of the L side comparator 31. An H side current supply circuit 34B is composed of the resistance R3 and p channel MOS transistor Q4. The source of the transistor Q4 is connected to the non-inverting input terminal of the operational amplifier 50, its drain is connected to the other end of the resistance R3, and the gate is connected to the output terminal of the H side comparator 32.

The operation is described below. The potentials $V_{ri}$, $V_L$, $V_H$, $V_L-\Delta V$, $V_H+\Delta V$, Ep, Em are supposed to be defined same as in the embodiment of FIG. 13. The source-drain voltage of the n channel transistor Q3 is supposed to be Vsd3, the source-drain voltage of the p channel transistor Q4 to be Vsd4, and the voltage at the input terminal 21a of the ringing preventive circuit 21B to be Vin.

When a waveform mixed with noise such as ringing as shown in (a) of FIG. 28 is put in the input terminal 21a of the ringing preventive circuit 21B, the output side of the ringing preventive circuit 21B is lowered in impedance by the buffer amplifier 30, and the output voltage of the buffer amplifier 30 having the gain equal to 1 becomes $V_{ri}$.

When $V_{ri}$<$V_L-\Delta V$, the output of the L side comparator 31 is H level, and the L side current supply circuit 33B is operated, and a current is applied to the front stage of the buffer amplifier 30. The current Ip supplied at this time is Ip=(Ep−Vin−Vsd3)/R2.

When $V_{ri}$>$V_L-\Delta V$, the output of the L side comparator 31 is L level, and the L side current supply circuit 33B is not operated, and no current is applied to the front stage of the buffer amplifier 30.

When $V_{ri}<V_H+\Delta V$, the output of the H side comparator 32 is H level, and the H side current supply circuit 34B is not operated, and no current is applied to the front stage of the buffer amplifier 30.

When $V_{ri}>V_H+\Delta V$, the output of the H side comparator 32 is L level, and the H side current supply circuit 34B is operated, and a current (negative current) is supplied to the front stage of the buffer amplifier 30. The current Im supplied at this time is Im=(Vin−Em−Vsd4)/R3.

Between the ringing preventive circuit of FIG. 14 and that of FIG. 13, only the type of the transistor used therein is different, and by using the ringing preventive circuit of FIG. 14, the same effects as when the ringing preventive circuit of FIG. 13 is used are obtained.

A third embodiment of the ringing preventive circuit of FIG. 8 is described by reference to FIG. 15. The difference between the ringing preventive circuit 21C in FIG. 15 and the ringing preventive circuit 21A in FIG. 13 lies in that, in order to omit adjustment of the resistance R2 and R3, the resistance R2 for composing the L side current supply circuit 33a is changed to a constant current source 51, and that the resistance R3 for composing the H side current supply circuit 35A is changed to a constant current source 32.

Figure 15:
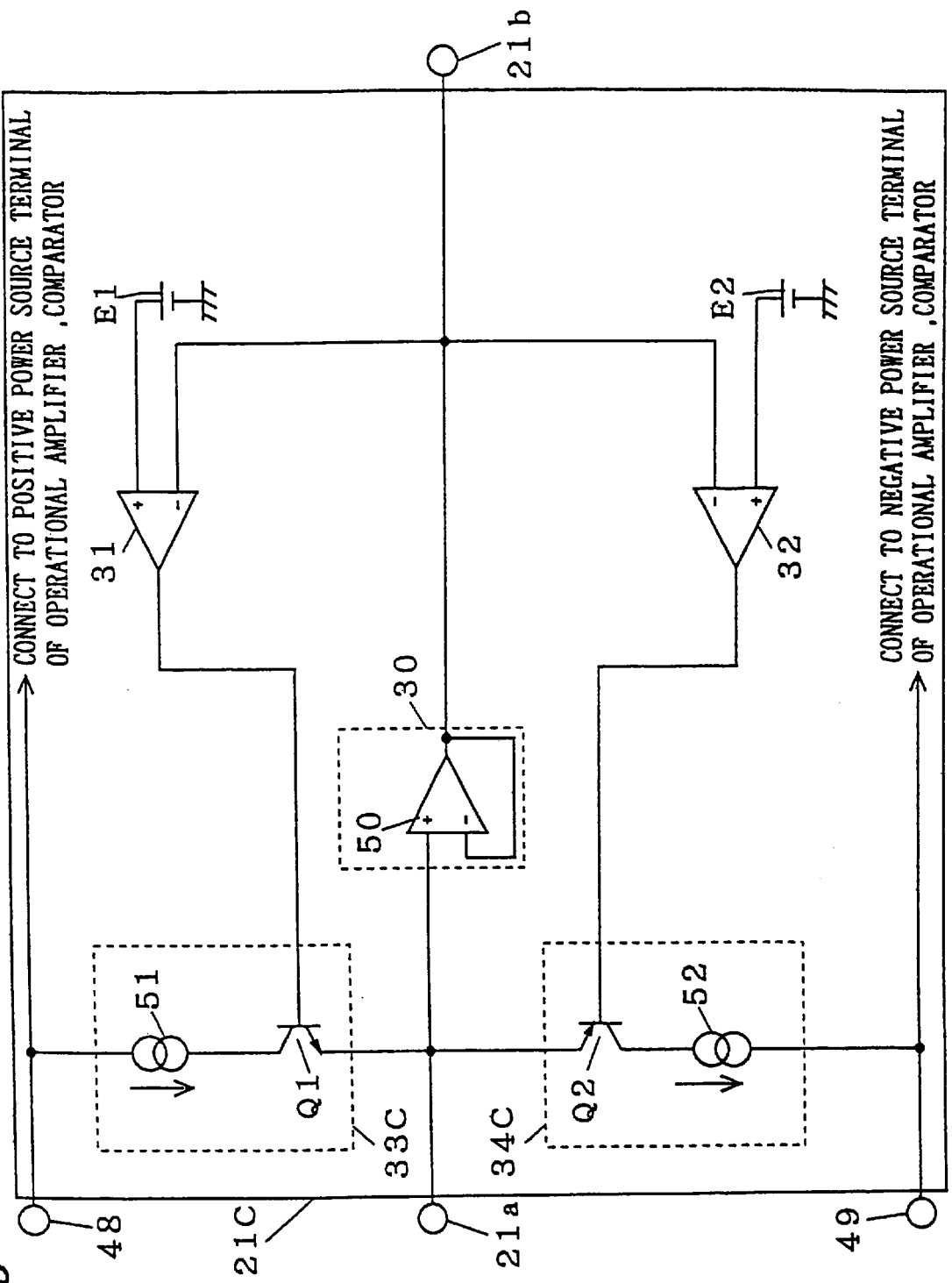
FIG. 15 is a circuit diagram showing the constitution of a ringing preventive circuit according to third preferred embodiment of the circuit FIG. 8.

In FIG. 15, the L side current supply circuit 33C is composed of the constant current source 51 and npn type bipolar transistor Q1. The constant current source 51 is connected between the collector of the transistor Q1 and the positive power source terminal 48. The H side current supply circuit 34C is composed of the constant current source 52 and pnp type bipolar transistor Q2. The constant current source 52 is connected between the collector of the transistor Q2 and the negative power source terminal 49.

The operation is described below. The potentials $V_{ri}$, $V_L$, $V_H$, $V_L-\Delta V$, $V_H+\Delta V$, Ep, Em are supposed to be defined same as in the embodiment of FIG. 13.

When a waveform mixed with noise such as ringing as shown in (a) of FIG. 28 is put in the input terminal 21 of the ringing preventive circuit 21C, the output side of the ringing preventive circuit 21C is lowered in impedance by the buffer amplifier 30, and the output voltage of the buffer amplifier 30 having the gain equal to 1 becomes $V_{ri}$.

When $V_{ri}<V_L-\Delta V$, the output of the L side comparator 31 is H level, and the L side current supply circuit 33C is operated, and a specific current Ip is supplied to the front stage of the buffer amplifier 30.

When $V_{ri}>V_L-\Delta V$, the output of the L side comparator 31 is L level, and the L side current supply circuit 33C is not operated, and no current is supplied to the front stage of the buffer amplifier 30.

When $V_{ri}<V_H+\Delta V$, the output of the H side comparator 32 is H level, and the H side current supply circuit 34C is not operated, and no current is supplied to the front stage of the buffer amplifier 30.

When $V_{ri}>V_H+\Delta V$, the output of the H side comparator 32 is L level, and the H side current supply circuit 34C is operated, and a specific current (negative current) Im is supplied to the front stage of the buffer amplifier 30.

Between the ringing preventive circuit 21C of FIG. 15 and the ringing preventive circuit 21A of FIG. 13, only the means of flowing a current to the collector of the transistors Q1, Q2 is different, and by using the ringing preventive circuit 21C in FIG. 15, the same effects as when the ringing preventive circuit 21A in FIG. 15 is used are obtained. In the ringing preventive circuit 21C of FIG. 15, using the constant current sources 51, 52, it is no longer necessary to adjust the resistance values which was necessary in the resistances R2, R3 of the ringing preventive circuit 21A in FIG. 13, but since the magnitude of the supply current is predetermined, a capacity of the current supply source may be insufficient in the presence of a large noise such as ringing.

A fourth embodiment of the ringing preventive circuit of FIG. 8 of the invention is described below while referring to FIG. 16.

Figure 16:
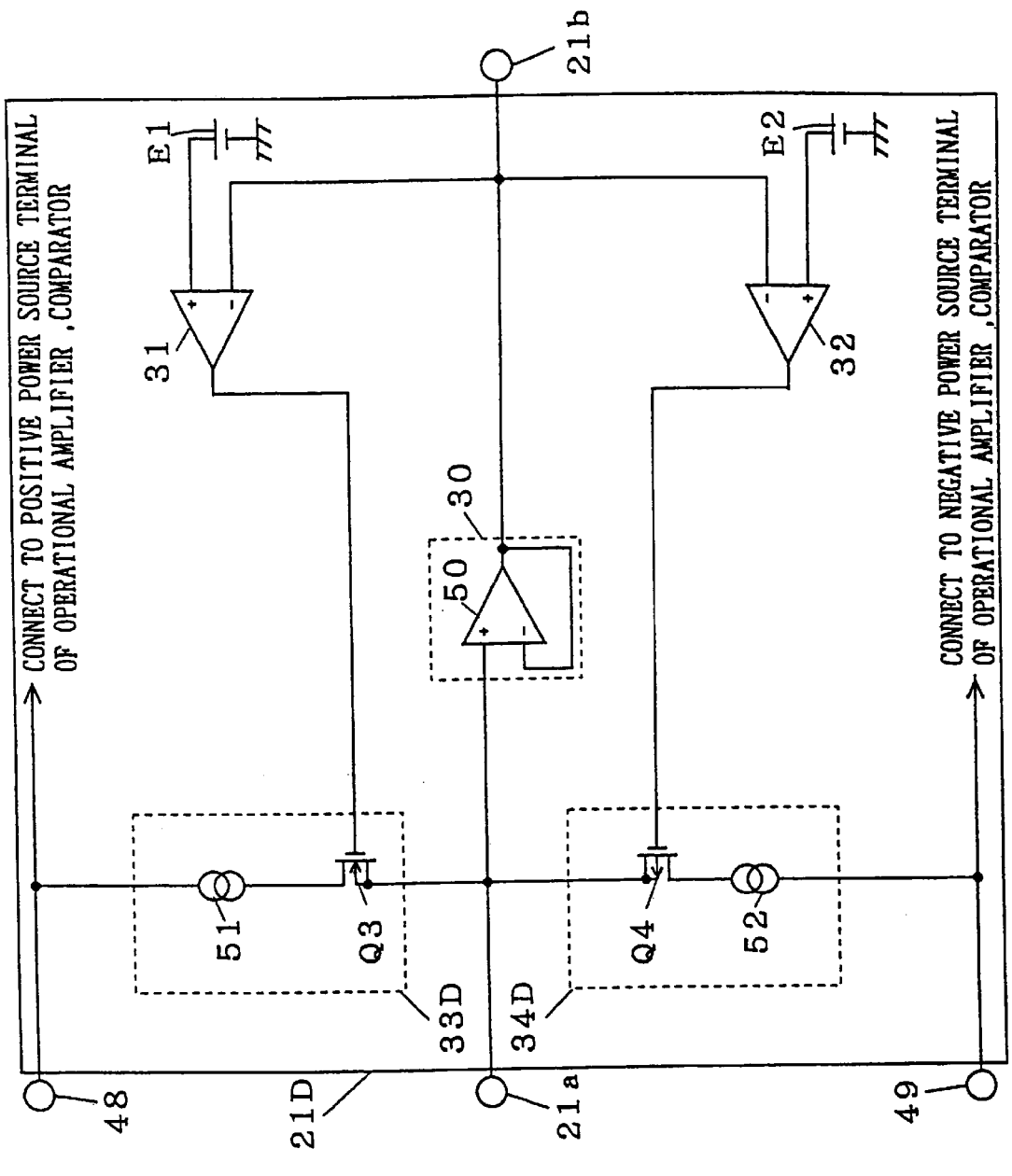
FIG. 16 is a circuit diagram showing the constitution of a ringing preventive circuit according to a fourth preferred embodiment of the circuit FIG. 8.

In the ringing preventive circuit 21D according to FIG. 16, instead of the npn type bipolar transistor Q1 and pnp type bipolar transistor Q2 used in the ringing preventive circuit 21C of FIG. 15, an n channel MOS transistor Q3 and a p channel MOS transistor Q4 are used.

In FIG. 16, an L side current supply circuit 33D is composed of the constant current source 51 and n channel MOS transistor Q3. The source of the transistor Q3 is connected to the non-inverting input terminal of the operational amplifier 50, its drain is connected to the constant current source 51, and the gate is connected to the output terminal of the L side comparator 31. An H side inverting supply circuit 34D is composed of the constant current source 52 and p channel MOS transistor Q4. The source of the transistor Q4 is connected to the non-inverting input terminal of the operational amplifier 50, its drain is connected to the constant current source 52, and the gate is connected to the output terminal of the H side comparator 32.

The operation is described below. The potentials $V_{ri}$, $V_L$, $V_H$, $V_L-\Delta V$, $V_H+\Delta V$, Ep, Em are supposed to be defined same as in the embodiment of FIG. 15. The source-drain voltage of the n channel transistor Q3 is supposed to be Vsd3, the source-drain voltage of the p channel transistor Q4 to be Vsd4, and the voltage at the input terminal 21a of the ringing preventive circuit 21D to be Vin.

When a waveform mixed with noise such as ringing as shown in (a) of FIG. 28 is put in the input terminal 21a of the ringing preventive circuit 21D, the output side of the ringing preventive circuit 21D is lowered in impedance by the buffer amplifier 30, and the output voltage of the buffer amplifier 30 of gain 1 becomes $V_{ri}$.

When $V_{ri}<V_L-\Delta V$, the output of the L side comparator 31 is H level, and the L side current supply circuit 33D is operated, and a specific current Ip is supplied to the front stage of the buffer amplifier 30.

When $V_{ri}>V_L-\Delta V$, the output of the L side comparator 31 is L level, and the L side current supply circuit 33D is not operated, and no current is supplied to the front stage of the buffer amplifier 30.

When $V_{ri}<V_H+\Delta V$, the output of the H side comparator 32 is H level, and the H side current supply circuit 34D is not operated, and no current is supplied to the front stage of the buffer amplifier 30.

When $V_{ri}>V_H+\Delta V$, the output of the H side comparator 32 is L level, and the H side current supply circuit 34D is operated, and a specific current (negative current) Im is supplied to the front stage of the buffer amplifier 30.

Between the ringing preventive circuit 21D of FIG. 16 and ringing preventive circuit 21C of FIG. 15, only the type of the transistor used therein is different, and by using the ringing preventive circuit 21D of FIG. 16, the same effects as when the ringing preventive circuit 21C in FIG. 15 is used are obtained.

Figure 17:
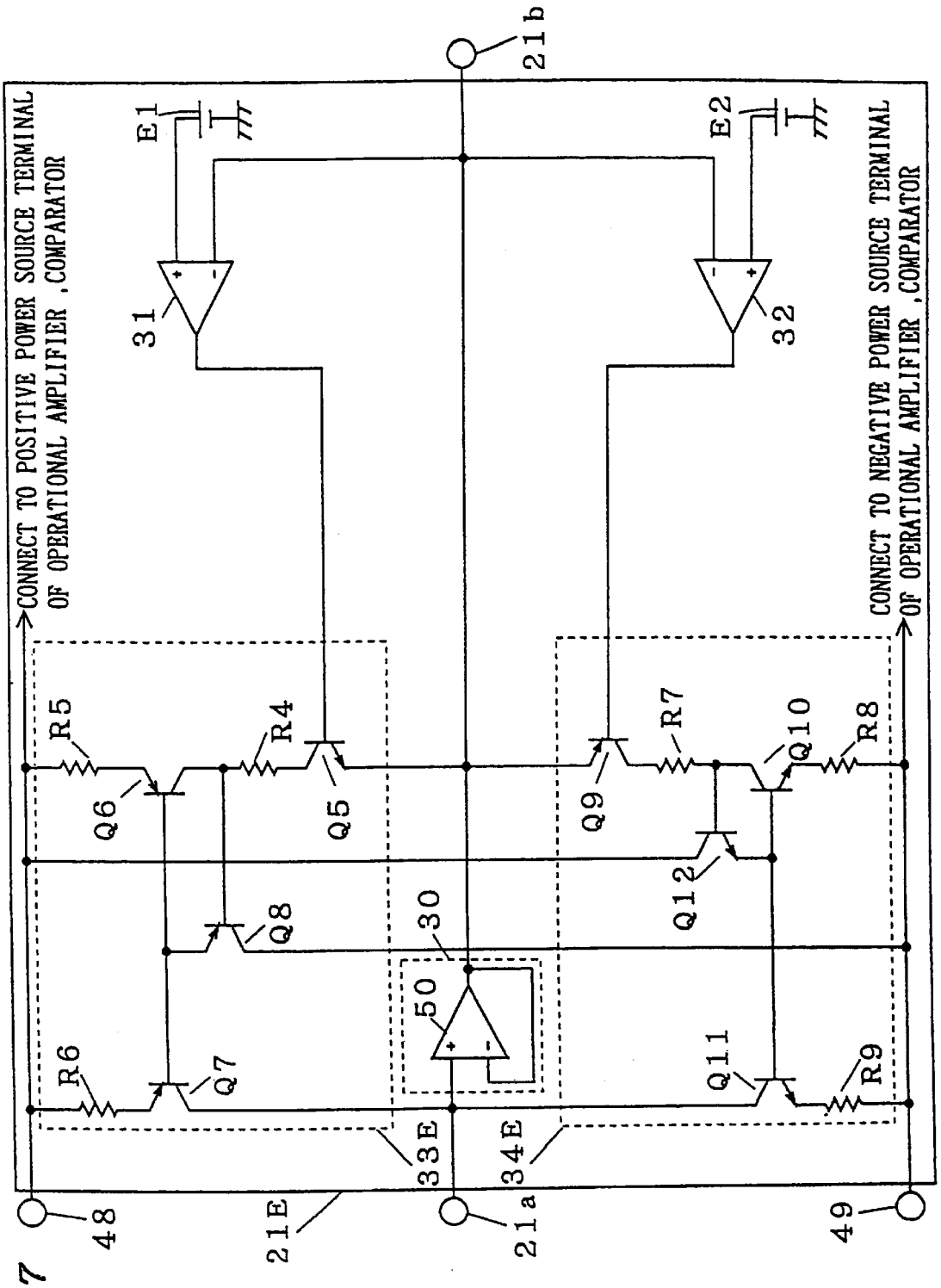
FIG. 17 is a circuit diagram showing the constitution of a ringing preventive circuit according to a fifth preferred embodiment of the circuit FIG. 8.

A fifth embodiment of the ringing preventive circuit of FIG. 8 of the invention is described below by reference to FIG. 17. In FIG. 17, reference numeral 33E is an L side current supply circuit composed of npn type transistor Q5, pnp type transistors Q6 to Q8, and resistances R4 to R6, 34E is an H side current supply circuit composed of pnp type transistor Q9, npn type transistors Q10 to Q12, and resistances R7 to R9, and others having the same reference numerals as in FIG. 13 are same or corresponding parts as in FIG. 13.

The constitution of the L side current supply circuit 33E is described. The transistor Q5 has an emitter connected to the output terminal of the operational amplifier 50, a base connected to the output terminal of the L side comparator 31, and a collector. The resistance R4 has one side connected to the collector of the transistor Q5, and other end. The transistor Q6 has a collector connected to the other end of the resistance R4, a base, and an emitter. The resistance R5 has one end connected to the positive power source terminal 48, and other end connected to the emitter of the transistor Q6. The transistor Q7 has a collector connected to the non-inverting input terminal of the operational amplifier 50, an emitter, and a base connected to the base of the transistor Q6. The resistance R6 has one end connected to the positive power source terminal 48, and other end connected to the emitter of the transistor Q7. The transistor Q8 has a base connected to the other end of the resistance R4, an emitter connected to the base of the transistor Q6, and a collector connected to the negative power source terminal 49.

The constitution of the H side current supply circuit 34E is described. The transistor Q9 has an emitter connected to the output terminal of the operational amplifier 50, a base connected to the output terminal of the H side comparator 32, and a collector. The resistance R7 has one side connected to the collector of the transistor Q9, and other end. The transistor Q10 has a collector connected to the other end of the resistance R7, a base, and an emitter. The resistance R8 has one end connected to the negative power source terminal 49, and other end connected to the emitter of the transistor Q10. The transistor Q11 has a collector connected to the non-inverting input terminal of the operational amplifier 50, an emitter, and a base connected to the base of the transistor Q10. The resistance R9 has one end connected to the negative power source terminal 49, and other end connected to the emitter of the transistor Q11.

The operation is described below. The potentials $V_{ri}$, $V_L$, $V_H$, $V_L-\Delta V$, $V_H+\Delta V$, Ep, Em are supposed to be defined same as in the embodiment of FIG. 13.

When a waveform mixed with noise such as ringing as shown in (a) of FIG. 28 is put in the input terminal 21 of the ringing preventive circuit 21E, the output side of the ringing preventive circuit 21E is lowered in impedance by the buffer amplifier 30, and the output voltage of the buffer amplifier 30 having the gain equal to 1 becomes $V_{ri}$.

When $V_{ri}<V_L-\Delta V$, the output of the L side comparator 31 is H level, and a current flows into the base of the npn type transistor Q5 to turn on the transistor Q5. The base-emitter voltage of the transistor Q6 is supposed to be Vbe6, the base-emitter voltage of the transistor Q8 to be Vbe8, the base-emitter voltage of the transistor Q7 to be Vbe7, the current flowing in the collector of the transistor Q5 to be Ic5, and the current flowing in the collector of the transistor Q7 to be Ic7. At this time, the L side current supply circuit 33E supplies the current Ic7 satisfying formula 1 to the front stage of the buffer amplifier 30.

[Formula 1]

Ic5≈(Ep-$V_{ri}$-Vbe6-Vbe8)/(R4+R5),

Ic7≈(R5·Ic5+Vbe6-Vbe7)/R6

At this time, the greater the noise voltage of ringing or the like, the smaller becomes the value of $V_{ri}$, and Ic5 becomes larger. As the Ic5 becomes larger, Ic7 increases, so that more current is supplied to the front stage of the buffer amplifier 30.

When $V_{ri}>V_L-\Delta V$, the output of the L side comparator 31 is L level, and the L side current supply circuit 33E is not operated, and no current is supplied to the front stage of the buffer amplifier 30.

When $V_{ri}<V_H+\Delta V$, the output of the H side comparator 32 is H level, and the H side current supply circuit 34E is not operated, and no current is supplied to the front stage of the buffer amplifier 30.

When $V_{ri}>V_H+\Delta V$, the output of the H side comparator 32 is L level, and a negative current is supplied to the base of the pnp type transistor Q9, thereby turning on the transistor Q9. The base-emitter voltage of the transistor Q10 is supposed to be Vbe10, the base-emitter voltage of the transistor Q12 to be Vbe12, the base-emitter voltage of the transistor Q11 to be Vbe11, the current flowing in the collector of the transistor Q9 to be Ic9, and the current flowing in the collector of the transistor Q11 to be Ic11. At this time, the H side current supply circuit 34 supplies the negative current Ic11 satisfying formula 2 to the front stage of the buffer amplifier 30.

[Formula 2]

Ic9≈($V_{ri}$-Em-Vbe10-Vbe12)/(R7+R8),

Ic11≈(R8·Ic9+Vbe10-Vbe11)/R9

At this time, the greater the noise voltage of ringing or the like, the larger becomes the value of $V_{ri}$, and Ic9 becomes larger. As the Ic9 becomes larger, Ic11 increases, so that more negative current is supplied to the front stage of the buffer amplifier 30.

In this way, the ringing preventive circuit 21E operates so as to remove the shaded areas A, C in (a) of FIG. 28. At this time, the shaded areas B, D are decreased in vibration because the damping factor increases when removing the shaded areas A, C, and the peak voltage of the vibration approaches $V_H$ and $V_L$. Thus, the waveform of the output terminal 21b after passing through the ringing preventive circuit 21E is a waveform limited by $V_H+\Delta V$ and $V_L-\Delta V$ as shown in FIG. 2. When this ringing preventive circuit is inserted after the transmission path of digital signal, voltage noise such as ringing is prevented, and malfunction in the circuit succeeding the next stage can be suppressed effectively.

In the invention, moreover, since the current depending on the voltage level of noise such as ringing can be supplied to the front stage of the buffer amplifier 30, a great effect of removing voltage noise is brought about.

A sixth embodiment of the ringing preventive circuit of FIG. 8 of the invention is described below by reference to FIG. 18. In FIG. 17, reference numeral 33F is an L side current supply circuit composed of n channel MOS transistor Q13, p channel MOS transistors Q14, Q15, and resistances R10 to R12, 34F is an H side current supply circuit composed of p channel MOS transistor Q16, n channel MOS transistors Q17, Q18, and resistances R13 to R15, and others having the same reference numerals as in FIG. 11 are same or corresponding parts as in FIG. 11.

The operation is described below. The potentials $V_{ri}$, $V_L$, $V_H$, $V_L-\Delta V$, $V_H+\Delta V$, Ep, Em are supposed to be defined same as in FIG. 13. When a waveform mixed with noise such as ringing as shown in (a) of FIG. 28 is put in the input terminal 21a of the ringing preventive circuit 21F, the output side of the ringing preventive circuit 21F is lowered in impedance by the buffer amplifier 30, and the output voltage of the buffer amplifier 30 of gain 1 becomes $V_{ri}$.

When $V_{ri}<V_L-\Delta V$, the output of the L side comparator 31 is H level, and the n channel MOS transistor Q13 is turned on. The drain-source voltage of the transistor Q13 is supposed to be Vds13, the gate-source voltage of the transistor Q4 to be Vgs14, the gate-source voltage of the transistor Q15 to be Vgs15, the current flowing in the drain of the transistor Q13 to be Id13, and the current flowing in the drain of the transistor Q15 to be Id15. At this time, the L side current supply circuit 33F supplies the current Id15 satisfying formula 3 to the front stage of the buffer amplifier 30.

[Formula 3]

$$Id13 \approx (Ep - V_{ri} - Vgs14 - Vds13)/(R10 + R11),$$
$$Id15 \approx (R11 \cdot Id13 + Vgs14 - Vgs15)/R12$$

At this time, the greater the noise voltage of ringing or the like, the smaller becomes the value of $V_{ri}$, and Id13 becomes larger. As the Id13 becomes larger, Id15 increases, so that more current is supplied to the front stage of the buffer amplifier 30.

When $V_{ri} > V_L - \Delta V$, the output of the L side comparator 31 is L level, and the L side current supply circuit 33F is not operated, and no current is supplied to the front stage of the buffer amplifier 30.

When $V_{ri} < V_H + \Delta V$, the output of the H side comparator 32 is H level, and the H side current supply circuit 34F is not operated, and no current is supplied to the front stage of the buffer amplifier 30.

When $V_{ri} > V_H + \Delta V$, the output of the H side comparator 32 is L level, and the p channel MOS transistor Q16 is turned on. The source-drain voltage of the transistor Q16 is supposed to be Vsd16, the gate-source voltage of the transistor Q17 to be Vgs17, the gate-source voltage of the transistor Q18 to be Vgs18, the current flowing in the drain of the transistor Q16 to be Id16, and the current flowing in the drain of the transistor Q18 to be Id18. At this time, the H side current supply circuit 34F supplies the negative current Id18 satisfying formula 4 to the front stage of the buffer amplifier 30.

[Formula 4]

$$Id16 \approx (V_{ri} - Em - Vgs17 - Vsd16)/(R13 + R14),$$
$$Id18 \approx (R14 \cdot Id16 + Vgs17 - Vsd18)/R15$$

At this time, the greater the noise voltage of ringing or the like, the larger becomes the value of $V_{ri}$, and Id16 becomes larger. As the Id16 becomes larger, Id18 increases, so that more negative current is supplied to the front stage of the buffer amplifier 30.

In this way, the ringing preventive circuit 21F operates so as to remove the shaded areas A, C and shaded areas B, D in (a) of FIG. 28, and the waveform at the output terminal 21b of the ringing preventive circuit 21F becomes as shown in FIG. 2.

By using the ringing preventive circuit of the sixth embodiment, the same effects as using the ringing preventive circuit shown in the fifth preferred embodiment are obtained.

A seventh embodiment of the ringing preventive circuit of FIG. 8 of the invention is described by referring to FIG. 19. In the ringing preventive circuit according to FIGS. 17 and 18, the waveform put into the input terminal 21a of the ringing preventive circuits 21E, 21F may not be constant in $V_H - V_L$ or may have a difference between $EP-V_L$ and $V_H-EM$. For example, in the ringing preventive circuit 21F in FIG. 18, at this time, there is a great fluctuation between the currents Id15 and Id18 supplied to the front stage of the buffer amplifier 30, and hence it is to adjust the value of the resistors R10 to R15 or the gate length or gate width of transistors Q14, Q15, Q17, Q18 by the waveform put into the input terminal 21a of the ringing preventive circuit 21F. The ringing preventive circuit in FIG. 19 is designed so that such adjustment is not necessary. What differs between the ringing preventive circuit in FIG. 17 and the ringing preventive circuit in FIG. 19 is that the ringing preventive circuit of FIG. 19 has an intermediate voltage generating circuit 55 composed of resistances R23, R24, and the emitters of the transistors Q20 and Q24 are connected to the intermediate voltage Vm.

In FIG. 19, reference numeral 33G is an L side current supply circuit composed of npn type transistor Q20, pnp type transistors Q21 to Q23, and resistances R16 to R18, 34G is an H side current supply circuit composed of pnp type transistor Q24, npn type transistors Q25 to Q27, and resistances R20 to R22, and others of same reference numerals as in FIG. 13 are same or corresponding parts as in FIG. 13. The diode D20 composed of resistance R19 and pnp type transistor is intended to prevent malfunction of the ringing preventive circuit 21G at low temperature.

First, the constitution of the L side current supply circuit 33G is described. The transistor Q20 has an emitter provided with an intermediate voltage Vm from an intermediate voltage generating circuit 55, a base connected to the output terminal of the L side comparator 31, and a collector. The resistance R16 has one end connected to the collector of the transistor Q20, and other end. The transistor Q21 has a collector connected to the other end of the resistance R16, a base, and an emitter. The resistance R17 has one end connected to a positive power source terminal 48, and other end connected to the emitter of the transistor Q21. The transistor Q23 has a base connected to the other end of the resistance R16, a collector connected to a negative power source terminal 49, and an emitter connected to the base of the transistor Q21. The transistor Q22 has a base connected to the base of the transistor Q21, and an emitter. The resistance R18 has one end connected to the positive power source terminal 48, and other end connected to the emitter of the transistor Q22.

Incidentally, one end of the resistance R19 is connected to the positive power source terminal, and the other end of the resistance R19 is connected to the anode of the diode D20. The cathode of the diode D20 is connected to the emitter of the transistor Q23.

Next, the constitution of the H side current supply circuit 34G is described. The transistor Q24 has an emitter provided with an intermediate voltage Vm from the intermediate generating circuit 55, a base connected to the output terminal of the H side comparator 32, and a collector. The resistance R20 has one end connected to the collector of the transistor Q24, and other end. The transistor Q25 has a collector connected to the other end of the resistance R20, a base, and an emitter. The resistance R21 has one end connected to the emitter of the transistor Q25 and the other end connected to the negative power source terminal 49. The transistor Q27 has an emitter connected to the base of the transistor Q25, a base connected to the collector of the transistor Q25, and a collector connected to the positive power source terminal 48. The transistor Q26 has a base connected to the base of the transistor Q25, a collector connected to the non-inverting input terminal of the operational amplifier 50, and an emitter. The resistance R22 has one end connected to the negative power source terminal 49, and other end connected to the emitter of the transistor Q26.

The intermediate voltage generating circuit 55 is composed of the resistance R23 having one end connected to the positive power source terminal 48, and other end connected to the node M for generating the intermediate voltage Vm, and the resistance R24 having one end connected to the negative power source terminal 49 and other end connected to the node M for generating an intermediate voltage.

The operation is described below. The potentials $V_{ri}$, $V_L$, $V_H$, $V_L-\Delta V$, $V_H+\Delta V$, Ep, Em are supposed to be defined same as in the embodiment of FIG. 13.

When a waveform mixed with noise such as ringing as shown in (a) of FIG. 28 is put in the input terminal 21a of the ringing preventive circuit 21G, the output side of the ringing preventive circuit 21G is lowered in impedance by the buffer amplifier 30, and the output voltage of the buffer amplifier 30 having the gain equal to 1 becomes $V_{ri}$.

When $V_{ri}<V_L-\Delta V$, the output of the L side comparator 31 is H level, and a current flows into the base of the npn type transistor Q20 to turn on the transistor Q20. The base-emitter voltage of the transistor Q21 is supposed to be Vbe21, the base-emitter voltage of the transistor Q23 to be Vbe23, the base-emitter voltage of the transistor Q22 to be Vbe22, the current flowing in the collector of the transistor Q20 to be Ic20, and the current flowing in the collector of the transistor Q22 to be Ic22. At this time, the L side current supply circuit 33G supplies the current Ic22 satisfying formula 5 to the front stage of the buffer amplifier 30.

[Formula 5]

$$Ic20 \approx (Ep-Vm-Vbe21-Vbe23)/(R16+R17),$$

$$Ic22 \approx (R17 \cdot Ic20+Vbe21-Vbe22)/R18$$

When $V_{ri}>V_L-\Delta V$, the output of the L side comparator 31 is L level, and the L side current supply circuit 33G is not operated, and no current is supplied to the front stage of the buffer amplifier 30.

When $V_{ri}<V_H+\Delta V$, the output of the H side comparator 32 is H level, and the H side current supply circuit 34G is not operated, and no current is supplied to the front stage of the buffer amplifier 30.

When $V_{ri}>V_H+\Delta V$, the output of the H side comparator 32 is L level, and a negative current is supplied to the base of the pnp type transistor Q24, thereby turning on the transistor Q24. The base-emitter voltage of the transistor Q25 is supposed to be Vbe25, the base-emitter voltage of the transistor Q27 to be Vbe27, the base-emitter voltage of the transistor Q26 to be Vbe26, the current flowing in the collector of the transistor Q24 to be Ic24, and the current flowing in the collector of the transistor Q26 to be Ic26. At this time, the H side current supply circuit 34G supplies the negative current Ic26 satisfying formula 6 to the front stage of the buffer amplifier 30.

[Formula 6]

$$Ic24 \approx (Vm-Em-Vbe25-Vbe27)/(R20+R21),$$

$$Ic26 \approx (R21 \cdot Ic24+Vbe25-Vbe26)/R22.$$

In this way, the ringing preventive circuit 21G operates so as to remove the shaded areas A, C in (a) of FIG. 28. At this time, the shaded areas B, D are decreased in oscillation because the damping factor increases when removing the shaded areas A, C, and the peak voltage of the oscillation approaches $V_H$ and $V_L$. Thus, the waveform of the output terminal 21b after passing through the ringing preventive circuit 21G is a waveform having a range from $V_H+\Delta V$ to $V_L-\Delta V$ as shown in FIG. 2.

When this ringing preventive circuit is inserted after the transmission path of digital waveform, voltage noise such as ringing is prevented, and malfunction in the circuit succeeding the next stage can be suppressed as far as possible.

In the ringing preventive circuit 21G in FIG. 19, when the voltage $V_{ri}$ of the waveform put into the input terminal 21a is in the relation of $Em+\Delta V<V_{ri}<Ep-\Delta V$, constant currents Ic22, Ic26 may be always supplied to the front stage of the buffer amplifier 30.

An eighth embodiment of the ringing preventive circuit of FIG. 8 of the invention is described by reference to FIG. 20. In the ringing preventive circuit of FIG. 20, instead of the bipolar transistor Q20 to Q27 used in the ringing preventive circuit 21G in FIG. 19, MOS transistors Q30 to Q35 are used.

Figure 18:
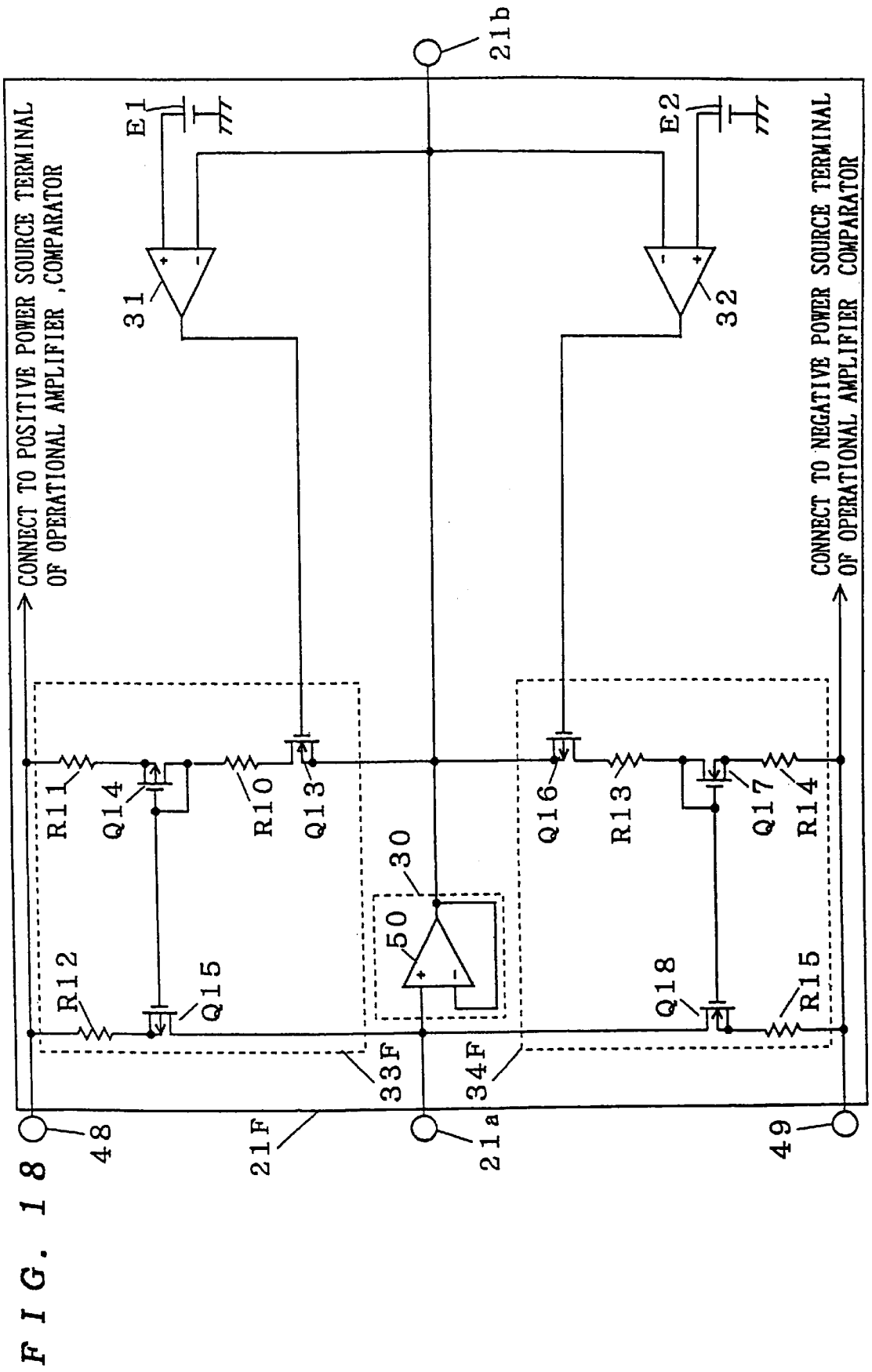
FIG. 18 is a circuit diagram showing the constitution of a ringing preventive circuit according to a sixth preferred embodiment of the circuit FIG. 8.
Figure 20:
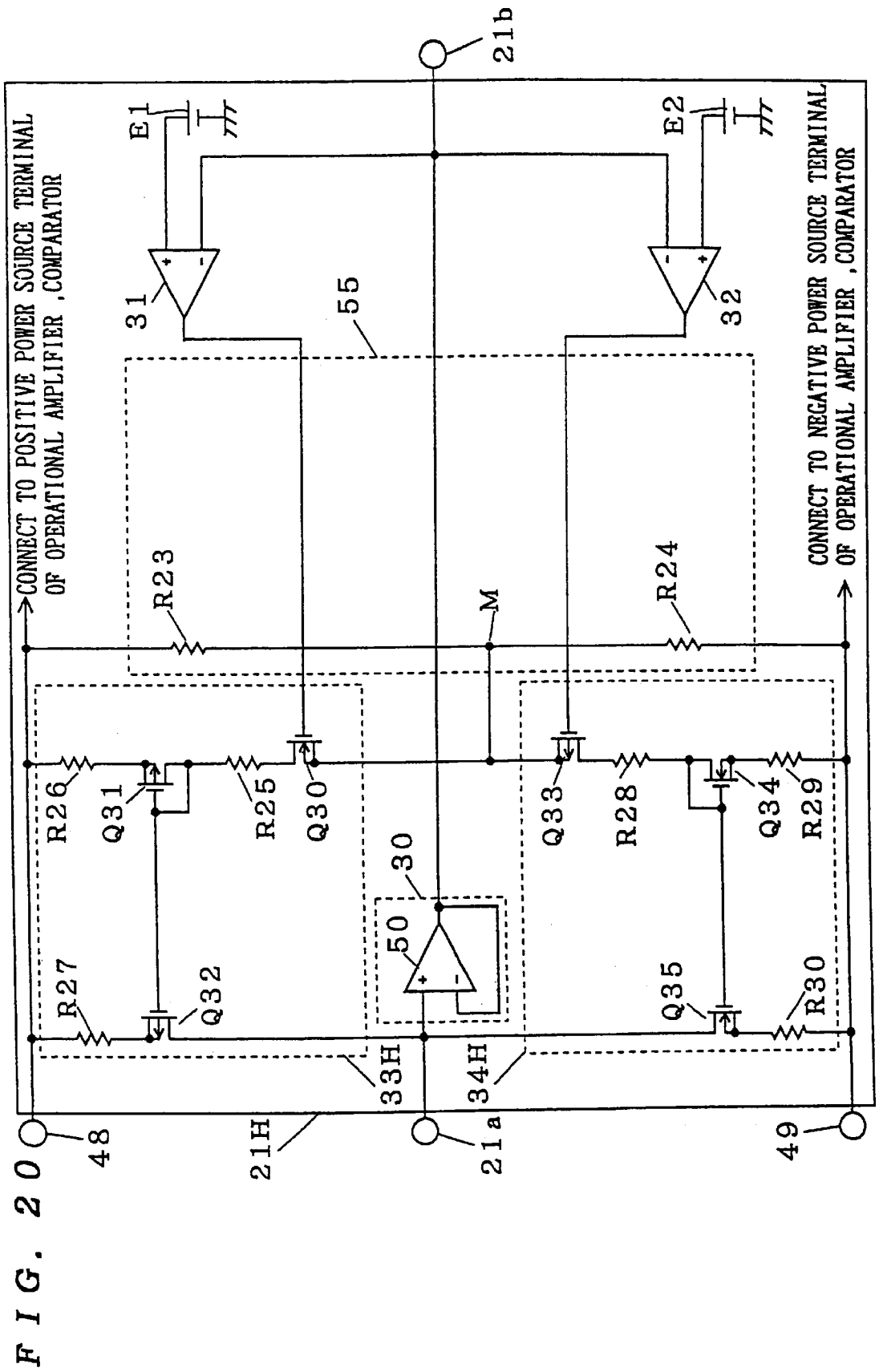
FIG. 20 is a circuit diagram showing the constitution of a ringing preventive circuit according to an eighth preferred embodiment of the circuit FIG. 8.

That is, the ringing preventive circuit 21H shown in FIG. 20 is to solve the problem of the ringing preventive circuit 21F composed of CMOS shown in FIG. 18. What the ringing preventive circuit 21H in FIG. 20 differs from the ringing preventive circuit 21F in FIG. 18 is that an intermediate voltage generating circuit composed of two resistance is provided, and that the sources of the transistors of the H side and L side current supply circuits controlled by the comparators are connected to the intermediate voltage Vm.

In FIG. 20, reference numeral 33H is an L side current supply circuit composed of n channel MOS transistor Q30, p channel MOS transistors Q31, Q32, and resistances R25 to R27, 34H is an H side current supply circuit composed of p channel MOS transistor Q33, n channel MOS transistors Q34, Q35, and resistances R28 to R30, 55 is an intermediate voltage generating circuit composed of resistances R23, R24, and other reference numerals same as in FIG. 13 are same or corresponding parts as in FIG. 13.

First, the constitution of the L side current supply circuit 33H is described. The transistor Q30 has a source provided with an intermediate voltage Vm from the intermediate voltage generating circuit 55, a gate connected to the output terminal of the L side comparator 31, and a drain. The resistance R25 has one end connected to the drain of the transistor Q30, and other end. The transistor Q31 has a drain connected to the other end of the resistance R25, a gate connected to the other end of the resistance R25, and a source. The resistance R26 has one end connected to a positive power source terminal 48, and other end connected to the source of the transistor Q31. The transistor Q32 has a gate connected to the gate of the transistor Q31, a drain connected to the non-inverting input terminal of the operational amplifier 50, and a source. The resistance R27 has one end connected to the positive power source terminal 48, and other end connected to the source of the transistor Q32.

Next, the constitution of the H side current supply circuit 34H is described. The transistor Q33 has a source provided with an intermediate voltage Vm from the intermediate voltage generating circuit 55, a gate connected to the output terminal of the H side comparator 32, and a drain. The resistance R28 has one end connected to the drain of the transistor Q33, and other end. The transistor Q34 has a drain connected to the other end of the resistance R28, a gate connected to the other end of the resistance R28, and a source. The resistance R29 has one end connected to a negative power source terminal 49, and other end connected to the source of the transistor Q34. The transistor Q35 has a gate connected to the gate of the transistor Q34, a drain connected to the non-inverting input terminal of the operational amplifier 50, and a source. The resistance R30 has one end connected to the source of the transistor Q35, and other end connected to the negative power source terminal 49.

The intermediate voltage generating circuit 55 is composed of the resistance R23 having one end connected to the positive power source terminal 48, and other end connected to the node M for generating the intermediate voltage Vm, and the resistance R24 having one end connected to the negative power source terminal 49, and other end connected to the node M for generating the intermediate voltage.

The operation is described below. The potentials $V_{ri}$, $V_L$, $V_H$, $V_L-\Delta V$, $V_H+\Delta V$, Ep, Em are supposed to be defined same as in the embodiment of FIG. 13.

When a waveform mixed with noise such as ringing as shown in (a) of FIG. 28 is put in the input terminal 21 of the ringing preventive circuit 21H, the output side of the ringing preventive circuit 21H is lowered in impedance by the buffer amplifier 30, and the output voltage of the buffer amplifier 30 having the gain equal to 1 becomes $V_{ri}$.

When $V_{ri} < V_L - \Delta V$, the output of the L side comparator 31 is H level, and a current flows into the base of the n channel MOS transistor Q30 to turn on the transistor Q30. The drain-source voltage of the transistor Q30 is supposed to be Vds30, the gate-source voltage of the transistor Q31 to be Vgs31, the gate-source voltage of the transistor Q32 to be Vgs32, the current flowing in the drain of the transistor Q30 to be Id30, and the current flowing in the drain of the transistor Q32 to be Id32. At this time, the L side current supply circuit 33H supplies the current Id32 satisfying formula 7 to the front stage of the buffer amplifier 30.
[Formula 7]

$Id30 \approx (Ep - Vm - Vgs31 - Vds30)/(R25 + R26)$, $Id32 \approx (R26 \cdot Id30 + Vgs31 - Vgs32)/R27$ When $V_{ri} > V_L - \Delta V$, the output of the L side comparator 31 is L level, and the L side current supply circuit 33H is not operated, and no current is supplied to the front stage of the buffer amplifier 30.

When $V_{ri} < V_H + \Delta V$, the output of the H side comparator 32 is H level, and the H side current supply circuit 34H is not operated, and no current is supplied to the front stage of the buffer amplifier 30.

When $V_{ri} > V_H + \Delta V$, the output of the H side comparator 32 is L level, and the p channel MOS transistor Q33 is turned on. The source-drain voltage of the transistor Q33 is supposed to be Vsd33, the gate-source voltage of the transistor Q34 to be Vgs34, the gate-source voltage of the transistor Q35 to be Vgs35, the current flowing in the drain of the transistor Q33 to be Id33, and the current flowing in the drain of the transistor Q35 to be Id35. At this time, the H side current supply circuit 34 supplies the negative current Id35 satisfying formula 8 to the front stage of the buffer amplifier 30.
[Formula 8]

$Id33 \approx (V_{ri} - Em - Vgs34 - Vsd33)/(R28 + R29)$, $Id35 \approx (R29 \cdot Id33 + Vgs34 - Vsd35)/R30$ In this way, the ringing preventive circuit 21H operates so as to remove the shaded areas A, C in (a) of FIG. 28. At this time, the shaded areas B, D are decreased in oscillation because the damping factor increases when removing the shaded areas A, C, and the peak voltage of the oscillation approaches $V_H$ and $V_L$. Thus, the waveform of the output terminal 21b after passing through the ringing preventive circuit 21H is a waveform having a range from $V_H + \Delta V$ to $V_L - \Delta V$ as shown in FIG. 2.

When this ringing preventive circuit is inserted after the transmission path of digital signal, voltage noise such as ringing is prevented, and malfunction in the circuit succeeding the next stage can be suppressed effectively.

Using the ringing preventive circuit 21H of FIG. 20, the same effects as when using the ringing preventive circuit 21G in FIG. 19 are obtained. The ringing preventive circuit 21 can always supply constant currents Id32, Id35 to the front stage of the buffer amplifier 30 as far as the voltage $V_{ri}$ of the waveform applied to the input terminal 21a is in the relation of $Em + \Delta V < V_{ri} < Ep - \Delta V$.

Figure 21:
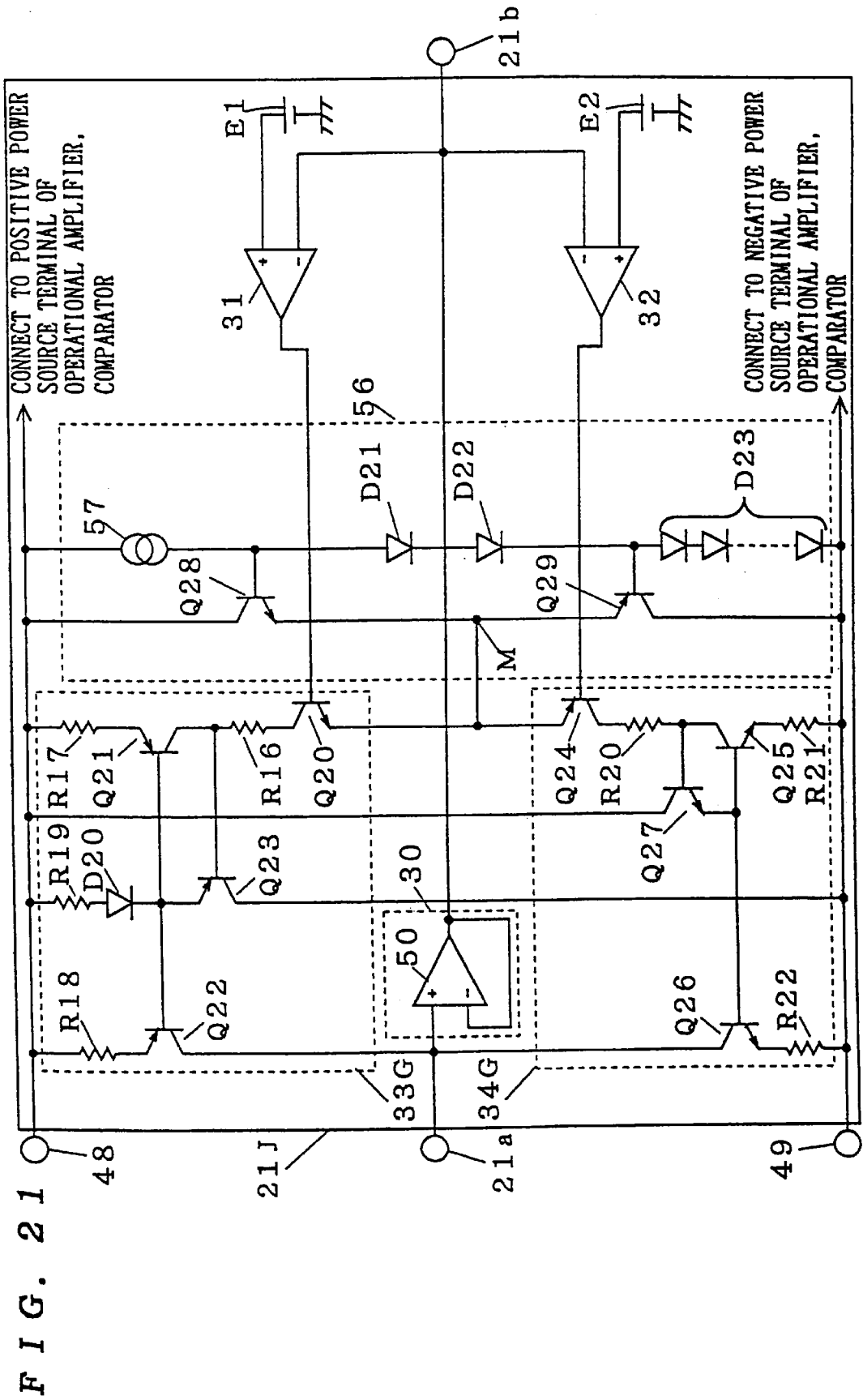
FIG. 21 is a circuit diagram showing the constitution of a ringing preventive circuit according to a ninth preferred embodiment of the circuit FIG. 8.

A ninth embodiment of the ringing preventive circuit of FIG. 8 of the invention is described below by reference to FIG. 21. The intermediate voltage generating circuit 55 of the ringing preventive circuit 21G of FIG. 19 was composed of divided resistances, and a current flows into the intermediate portion M, and the intermediate voltage Vm is not equal to (Ep−Em)/2, but the currents Ic22, Ic26 supplied in the front stage of the buffer amplifier 30 decrease. The ringing preventive circuit 21J shown in FIG. 21 is to solve the problem of the ringing preventive circuit 21G of FIG. 19. What the ringing preventive circuit 21J of FIG. 21 differs from the ringing preventive circuit 21G shown in FIG. 19 is that the intermediate voltage generating circuit is changed from the resistance division system to push-pull system in order to obtain a stable intermediate potential.

In FIG. 21, reference numeral 56 is an intermediate voltage generating circuit composed of an npn bipolar transistor Q28, a pnp bipolar transistor Q29, a constant current power source 57, and diodes D21 to D23, and other reference numerals same as in FIG. 19 denote same or corresponding parts as in FIG. 19. The diode D20 composed of resistance R19 and pnp transistor is intended to prevent malfunction of the ringing preventive circuit 21 at low temperature. The diodes D21 and D23 are composed of, for example, npn type transistors. The diode D22 is composed of pnp type transistor.

The difference between the ringing preventive circuit shown in FIG. 19 and the ringing preventive circuit shown in FIG. 21 lies only in the difference of constitution of the intermediate voltage generating circuit, and hence only the intermediate voltage generating circuit is described below. In the intermediate voltage generating circuit 56 with push-pull amplifier, the constant current power source 57 is connected to a positive power source terminal 48. The transistor Q28 has a collector connected to the positive power source terminal 48, an emitter connected to the node M for producing an intermediate voltage Vm, and a base connected to the constant current power source 57. The transistor Q29 has a collector connected to a negative power source terminal 49, an emitter connected to the node M, and a base. The diode D21 has an anode connected to the constant current power source 57, and a cathode. The diode D22 has an anode connected to the cathode of the diode D21, and a cathode connected to the base of the transistor Q29. The diode D23 is composed of plural diodes connected in series between the negative power source terminal 49 and the base of the transistor Q29, and a bias voltage is applied to all diodes in forward direction. The action upon onset of ringing is same as in the ringing preventive circuit 21G shown in FIG. 19.

Using the ringing preventive circuit 21J of FIG. 21, the same effects as when using the ringing preventive circuit 21G shown in FIG. 19 are obtained. Using the ringing preventive circuit 21J of FIG. 21, since the intermediate voltage generating circuit 56 is structured in push-pull system, the intermediate voltage Vm hardly changes, and stable currents Ic22, Ic26 can be supplied to the front stage of the buffer amplifier 30.

In this preferred embodiment, the intermediate voltage generating circuit 56 has a push-pull amplifier, but same effects are obtained in the circuit composition by making use of the band gap of the semiconductor in order to obtain a stabler intermediate potential regardless of temperature changes.

Figure 22:
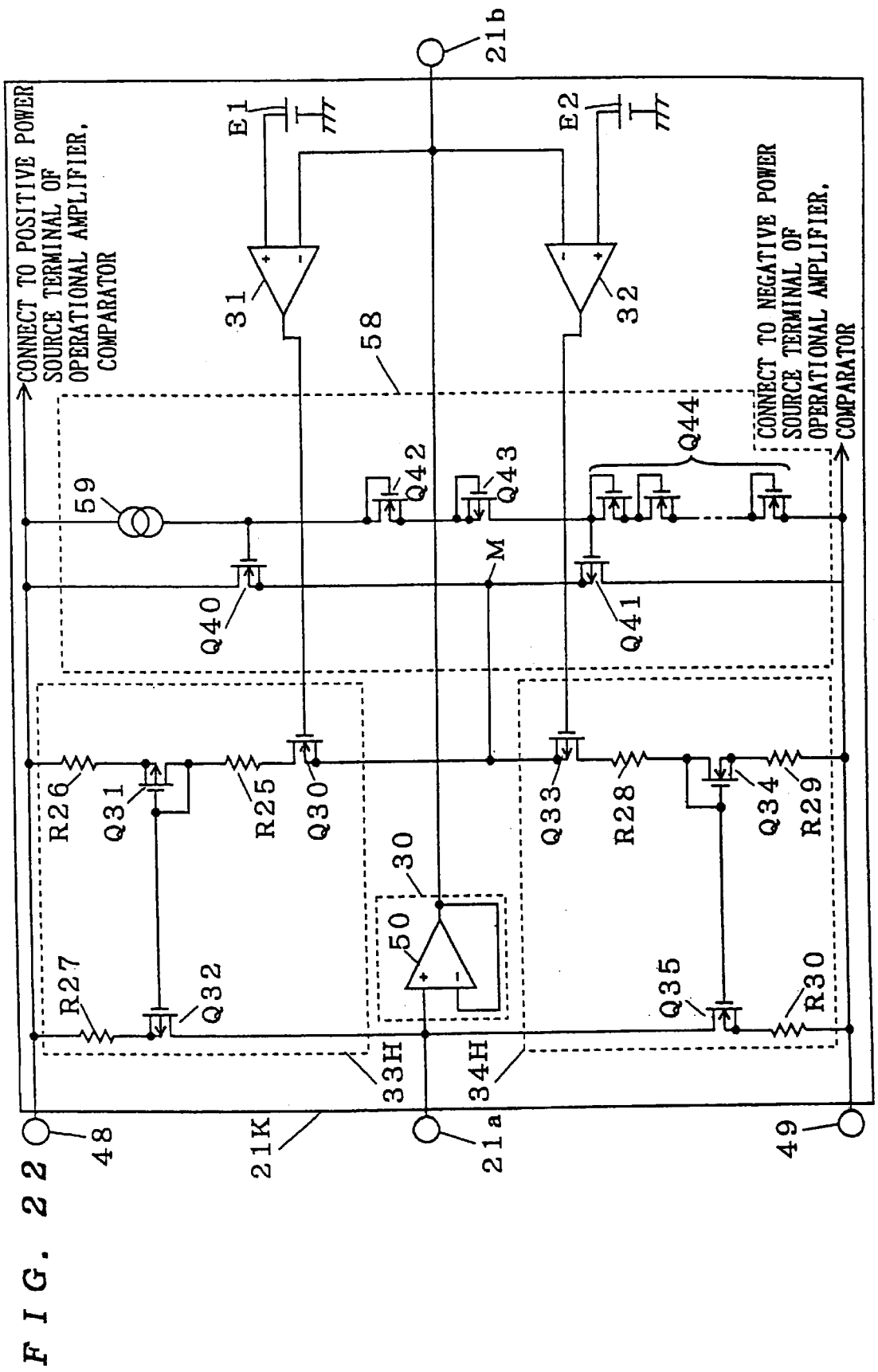
FIG. 22 is a circuit diagram showing the constitution of a ringing preventive circuit according to a tenth preferred embodiment of the circuit FIG. 8.

A tenth embodiment of the ringing preventive circuit of FIG. 8 of the invention is described below by reference to FIG. 22. The intermediate voltage generating circuit 55 of the ringing preventive circuit 21H of the preferred embodiment of FIG. 20 was composed of divided resistances, and a current flows into the intermediate portion M, and the intermediate voltage Vm is not equal to (Ep−Em)/2, but the currents Id32, Id35 supplied in the front stage of the buffer amplifier 30 decrease. The ringing preventive circuit 21K shown in FIG. 22 is to solve the problem of the ringing preventive circuit 21H of FIG. 20. What the ringing preventive circuit 21K of FIG. 22 differs from the ringing preventive circuit 21H shown in FIG. 20 is that basic component of the intermediate voltage generating circuit is a push-pull amplifier instead of the voltage divider with resistors in order to obtain a stable intermediate potential.

In FIG. 22, reference numeral 58 is an intermediate voltage generating circuit of push-pull amplifier composed of n channel MOS transistors Q40, Q42, Q44, p channel MOS transistors Q41, Q43, and a constant current power source 59, and other reference numerals same as in FIG. 20 denote same or corresponding parts as in FIG. 20. To keep stability of the intermediate potential regardless of temperature changes, a resistance may be used instead of the transistor Q44.

The action upon onset of ringing is same as in the ringing preventive circuit 21H shown in FIG. 20.

Since the intermediate generating circuit 58 of the ringing preventive circuit 21K of FIG. 22 is structured in push-pull system, the intermediate voltage Vm hardly changes, and stable currents Id32, Id35 can be supplied to the front stage of the buffer amplifier 30.

In this preferred embodiment, the intermediate voltage generating circuit 58 is of push-pull system, but same effects are obtained in the circuit composition by making use of the band gap of the semiconductor in order to obtain a stabler intermediate potential regardless of temperature changes.

Figure 23:
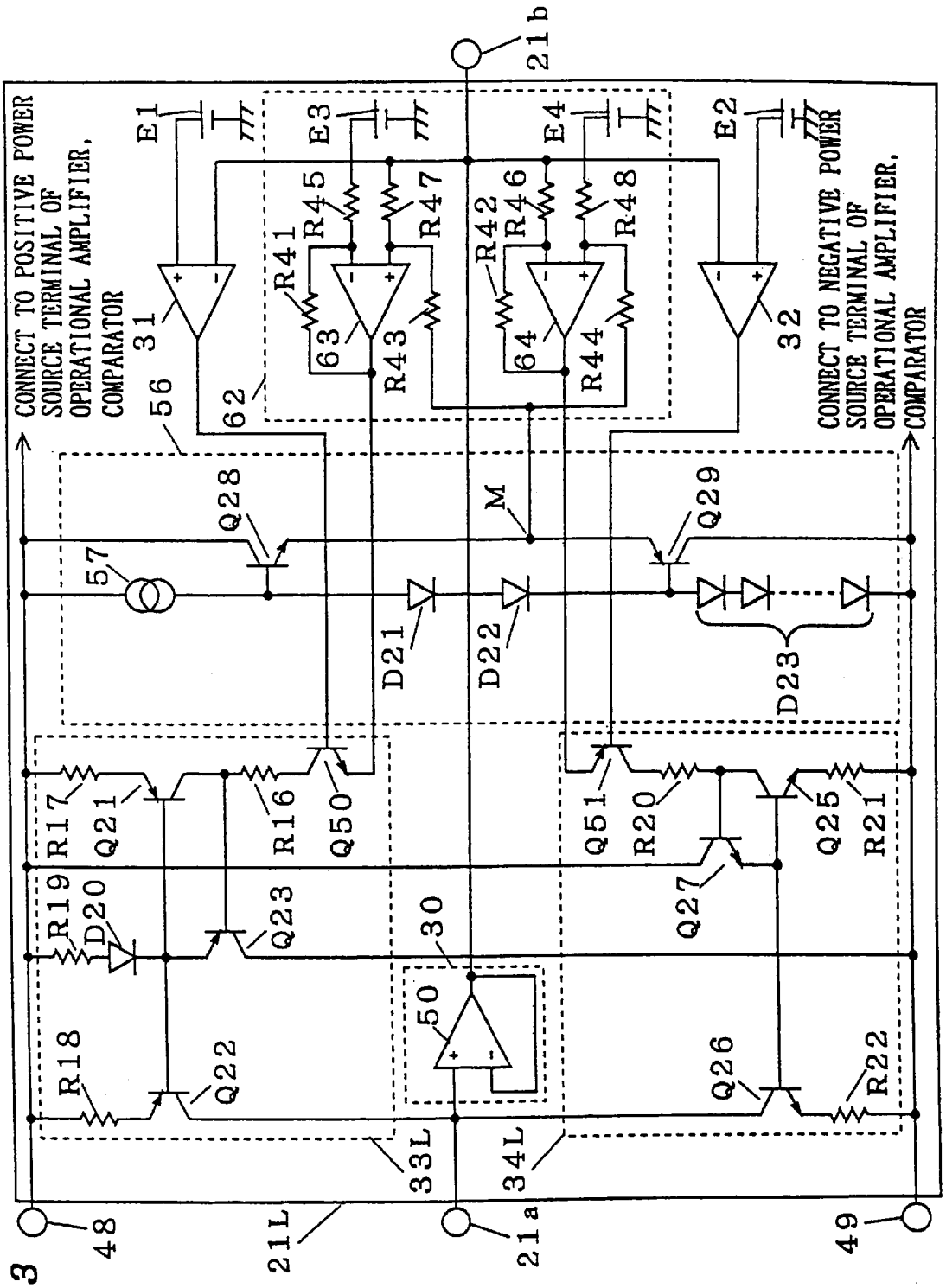
FIG. 23 is a circuit diagram showing the constitution of a ringing preventive circuit according to an eleventh preferred embodiment of the circuit FIG. 8.

An eleventh embodiment of the ringing preventive circuit of FIG. 8 of the invention is described below by reference to FIG. 23. In the ringing preventive circuit 21J of FIG. 21, if a waveform of a large noise voltage due to ringing or the like is put into the input terminal 21a of the ringing preventive circuit 21J, the noise of ringing or the like may not be sufficiently prevented by predetermined constant currents Ic22, Ic26. The ringing preventive circuit 21L shown in FIG. 23 is intended to solve the problem of the ringing preventive circuit 21J of FIG. 21. What the ringing preventive circuit 21L of FIG. 23 differs from the ringing preventive circuit 21J of FIG. 21 is that differential voltage amplifiers are added for amplifying the noise voltage in order to supply a current corresponding to the noise voltage of ringing or the like into the front stage of the buffer amplifier 30.

In FIG. 23, reference numeral 33L is an L side current supply circuit composed of an npn type transistor Q50, pnp type transistors Q21 to Q23, and resistances R16 to R19, 34L is an H side current supply circuit composed of a pnp type transistor Q51, npn type transistors Q25 to Q27, and resistances R25 to R27, 62 is a differential amplifying circuit for amplifying the differential voltages of the reference power sources E3, E4 and the output of the operational amplifier 50 individually, and outputting the intermediate voltage Vm to the L side current supply circuit 33L and H side current supply circuit 34L as the reference, and other reference numerals same as in FIG. 21 are same or corresponding parts as in FIG. 21.

The difference in connection relation of circuits between the L side current supply circuit 33G shown in FIG. 21 and the L side current supply circuit 33L in FIG. 23 lies only in the connection of the transistor Q20 and transistor Q50. The emitter of the transistor Q20 is connected to the node M of the intermediate voltage generating circuit 56, whereas the emitter of the transistor Q50 is connected to the output terminal of the operational amplifier 63.

Likewise, the difference in connection relation of circuits between the H side current supply circuit 34G shown in FIG. 21 and the H side current supply circuit 34L in FIG. 23 lies only in the connection of the transistor Q24 and transistor Q51. The emitter of the transistor Q24 is connected to the node M of the intermediate voltage generating circuit 56, whereas the emitter of the transistor Q51 is connected to the output terminal of the operational amplifier 64.

The constitution of the differential amplifier 62 is described below. The operational amplifier 63 has its non-inverting input terminal connected to the node M for generating the intermediate voltage of the intermediate voltage generating circuit 56 through the resistance R43 and also connected to the output terminal of the operational amplifier 50 through the resistance 47, its inverting input terminal connected to the positive electrode of the reference power source E3 through the resistance R45, and its output terminal connected to the emitter of the transistor Q50, and its output terminal and non-inverting input terminal are connected through the resistance R41, and the output is supplied back. An operational amplifier 64 has its non-inverting input terminal connected to the node M for generating the intermediate voltage of the intermediate voltage generating circuit 56 through the resistance R44 and also connected to the positive electrode of the reference power source E4 through the resistance R48, its inverting input terminal connected to the output terminal of the operational amplifier 50 through the resistance R46, and its output terminal connected to the emitter of the transistor Q51, and its output terminal and non-inverting input terminal are connected through the resistance R42, and the output is supplied back. The reference power source E3 generates the L side reference voltage $V_L$, and the reference power source E4 generates the H side reference voltage $V_H$. The relation of the resistance values of the resistances R41 to R48 is R45=R47=R46=R48=Rx, R41=R43=R42=R44=Ry. The diodes D20 composed of resistance R19 and pnp type transistor is intended to prevent malfunction at low temperature.

The operation is described below. The potentials $V_{ri}$, $V_L$, $V_H$, $V_L-\Delta V$, $V_H+\Delta V$, Ep, Em are supposed to be defined same as in the embodiment of FIG. 13, except that Vm=(Ep-Em)/2+Em.

When $V_{ri}<V_L-\Delta V$, the output of the L side comparator 31 is H level, and a current flows into the base of the npn type transistor Q50 to turn on the transistor Q50. The base-emitter voltage of the transistor Q21 is supposed to be Vbe21, the base-emitter voltage of the transistor Q23 to be Vbe23, the base-emitter voltage of the transistor Q22 to be Vbe22, the current flowing in the collector of the transistor Q50 to be Ic50, the current flowing in the collector of the transistor Q22 to be Ic22, and the output voltage of the operational amplifier 63 to be VL0. At this time, the L side current supply circuit 33L supplies the current Ic22 satisfying formula 9 to the front stage of the buffer amplifier 30.

[Formula 9]

VL0=Vm−(Ry/Rx)·(E3−$V_{ri}$),

Ic50≈(Ep−VL0−Vbe21−Vbe23)/(R16+R17),

Ic22≈(R17·Ic50+Vbe21−Vbe22)/R18

When $V_{ri}>V_L-\Delta V$, the output of the L side comparator 31 is L level, and the L side current supply circuit 33L is not operated, and no current is supplied to the front stage of the buffer amplifier 30.

When $V_{ri}<V_H+\Delta V$, the output of the H side comparator 32 is H level, and the H side current supply circuit 34L is not operated, and no current is supplied to the front stage of the buffer amplifier 30.

When $V_{ri}>V_H+\Delta V$, the output of the H side comparator 32 is L level, and a negative current is supplied to the base of the pnp type transistor Q51, thereby turning on the transistor Q51. The base-emitter voltage of the transistor Q25 is supposed to be Vbe25, the base-emitter voltage of the transistor Q27 to be Vbe27, the base-emitter voltage of the transistor Q26 to be Vbe26, the current flowing in the collector of the transistor Q51 to be Ic51, the current flowing in the collector of the transistor Q26 to be Ic26, and the output voltage of the operational amplifier 64 to be VH0. At this time, the H side current supply circuit 34L supplies the negative current Ic26 satisfying formula 10 to the front stage of the buffer amplifier 30.

[Formula 10]

VH0=Vm+(Ry/Rx)·($V_{ri}$−E4),

Ic51≈(Vm−VH0−Vbe25−Vbe27)/(R20+R21),

Ic26≈(R21·Ic51+Vbe25−Vbe26)/R22

In this way, the ringing preventive circuit 21L operates so as to remove the shaded areas A, C in (a) of FIG. 28. At this time, the shaded areas B, D are decreased in oscillation because the damping factor increases when removing the shaded areas A, C, and the peak voltage of the oscillation approaches $V_H$ and $V_L$. Thus, the waveform of the output terminal 21b after passing through the ringing preventive circuit 21L is a waveform having a range from $V_H$+ΔV to $V_L$−ΔV as shown in FIG. 2.

When this ringing preventive circuit 21L is inserted after the transmission path of digital signal, voltage noise such as ringing is prevented, and malfunction in the circuit succeeding the next stage can be suppressed effectively.

In the ringing preventive circuit 21L of FIG. 23, since the currents Ic22, Ic26 depending on the voltage level of noise such as ringing can be supplied to the front stage of the buffer amplifier 30, ringing and other noise can be prevented without having to adjust the values of the resistances R16 to R22 or emitter area of the transistors Q21, Q22, Q25, Q26, for all input waveforms in the range of Em+ΔV<$V_{ri}$<Ep−ΔV.

Figure 24:
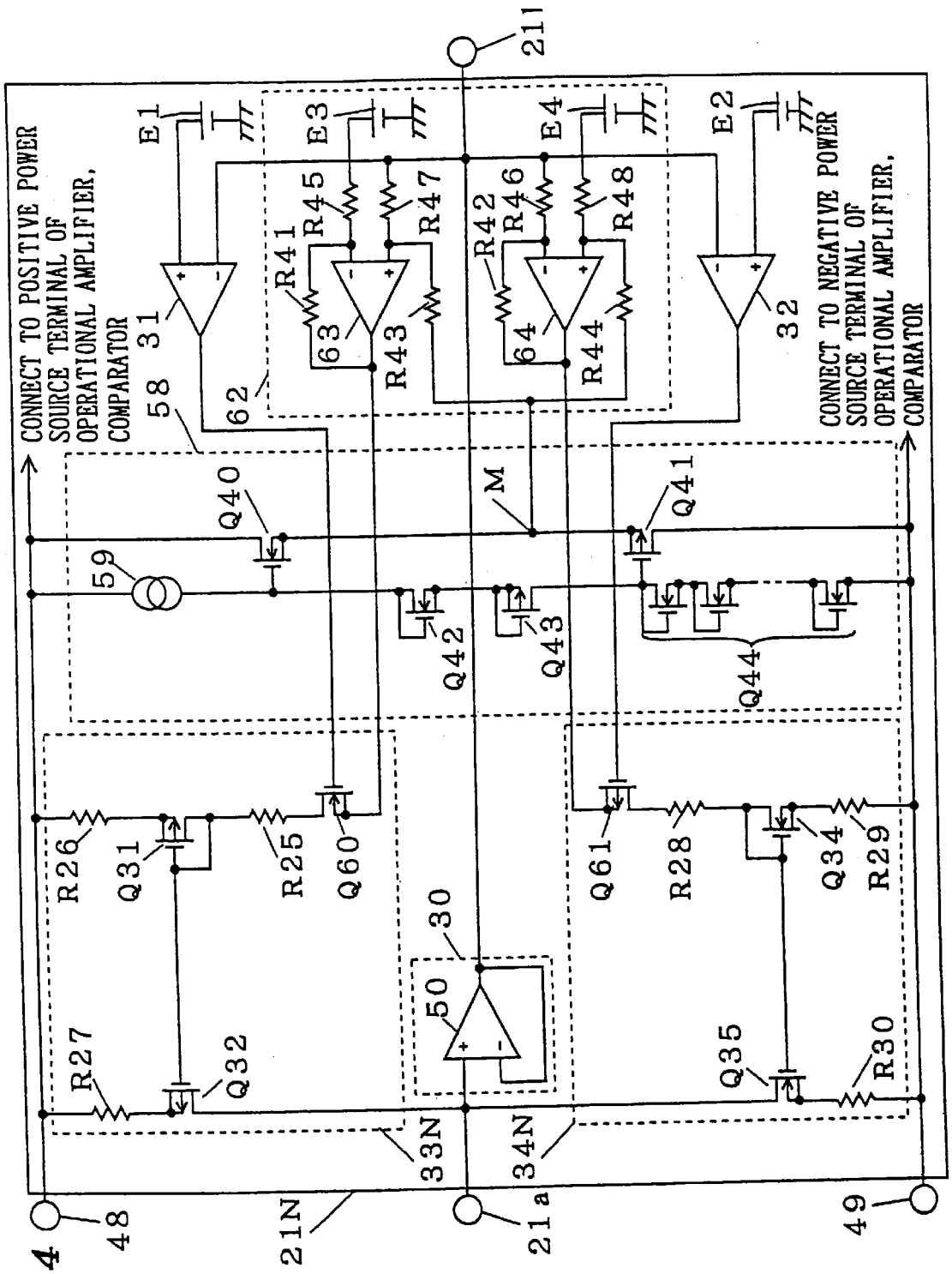
FIG. 24 is a circuit diagram showing the constitution of a ringing preventive circuit according to a twelfth preferred embodiment of the circuit FIG. 8.

A twelfth embodiment of the ringing preventive circuit of FIG. 8 of the invention is described below by reference to FIG. 24. In the ringing preventive circuit 21K of FIG. 22, if a waveform of a large noise voltage due to ringing or the like is put into the input terminal 21a of the ringing preventive circuit 21K, the noise of ringing or the like may not be sufficiently prevented by predetermined constant currents Id32, Id35. The ringing preventive circuit 21N of FIG. 24 is intended to solve the problem of the ringing preventive circuit 21K of FIG. 22. What the ringing preventive circuit 21N of FIG. 24 differs from the ringing preventive circuit 21K of FIG. 22 is that differential voltage amplifiers are added for amplifying the noise voltage in order to supply a current corresponding to the noise voltage of ringing or the like into the front stage of the buffer amplifier 30.

In FIG. 24, reference numeral 33N is an L side current supply circuit composed of an n channel MOS transistor Q60, p channel MOS transistors Q31, Q32, and resistances R25 to R27, 34N is an H side current supply circuit composed of a p channel MOS transistor Q61, n channel MOS transistors Q34, Q35, and resistances R29, R30, 62 is a differential amplifying circuit for amplifying the differential voltages of the reference power sources E3, E4 and the output of the operational amplifier 50 individually, and outputting the intermediate voltage Vm to the L side current supply circuit 33N and H side current supply circuit 34N as the reference, and other reference numerals same as in FIG. 22 are same or corresponding parts as in FIG. 22.

The difference in connection relation of circuits between the L side current supply circuit 33H shown in FIG. 22 and the L side current supply circuit 33N in FIG. 24 lies only in the connection of the transistor Q30 and transistor Q60. The emitter of the transistor Q30 is connected to the node M of the intermediate voltage generating circuit 58, whereas the emitter of the transistor Q56 is connected to the output terminal of the operational amplifier 63.

Likewise, the difference in connection relation of circuits between the H side current supply circuit 34H shown in FIG. 22 and the H side current supply circuit 34N in FIG. 24 lies only in the connection of the transistor Q33 and transistor Q61. The emitter of the transistor Q33 is connected to the node M of the intermediate voltage generating circuit 58, whereas the emitter of the transistor Q61 is connected to the output terminal of the operational amplifier 64.

The constitution of the differential amplifier 62 is same as that in FIG. 22, except that the output terminal of the operational amplifier 63 is connected to the drain of the transistor Q60, and that the output terminal of the operational amplifier 64 is connected to the drain of the transistor Q51.

The operation is described below. The potentials $V_{ri}$, $V_L$, $V_H$, $V_L$−ΔV, $V_H$+ΔV, Ep, Em are supposed to be defined same as in the embodiment of FIG. 13, except that Vm=(Ep−Em)/2+Em.

When $V_{ri}$<$V_L$−ΔV, the output of the L side comparator 31 is H level, and the n channel MOS transistor Q60 is turned on. The drain-source voltage of the transistor Q60 is supposed to be Vds60, the gate-source voltage of the transistor Q31 to be Vgs31, the gate-source voltage of the transistor Q32 to be Vgs32, the current flowing in the drain of the transistor Q60 to be Id60, the current flowing in the drain of the transistor Q32 to be Id32, and the output voltage of the operational amplifier 63 to be VL0. At this time, the L side current supply circuit 33N supplies the current Id32 satisfying formula 11 to the front stage of the buffer amplifier 30.

[Formula 11]

VL0=Vm−(Ry/Rx)·(E3−$V_{ri}$),

Id60≈(Ep−VL0−Vgs31−Vds60)/(R25+R26),

Id32≈(R26·Id60+Vgs31−Vgs32)/R27

When $V_{ri}$>$V_L$−ΔV, the output of the L side comparator 31 is L level, and the L side current supply circuit 33N is not operated, and no current is applied to the front stage of the buffer amplifier 30.

When $V_{ri}$<$V_H$+ΔV, the output of the H side comparator 32 is H level, and the H side current supply circuit 34N is not operated, and no current is applied to the front stage of the buffer amplifier 30.

When $V_{ri}$>$V_H$+ΔV, the output of the H side comparator 32 is L level, and the p channel MOS transistor Q61 is turned on. The source-drain voltage of the transistor Q61 is supposed to be Vsd61, the gate-source voltage of the transistor Q34 to be Vgs34, the gate-source voltage of the transistor Q35 to be Vgs35, the current flowing in the drain of the transistor Q61 to be Id61, the current flowing in the drain of the transistor Q35 to be Id35, and the output voltage of the operational amplifier 64 to be VH0. At this time, the H side current supply circuit 34N applies the negative current Id35 satisfying formula 12 to the front stage of the buffer amplifier 30.

[Formula 12]

VH0=Vm+(Ry/Rx)·($V_{ri}$−E4),

Id61≈(VH0−Em−Vgs34−Vsd61)/(R28+R29),

Id35≈(R29·Id61+Vgs34−Vsd35)/R30

In this way, same as in FIG. 23, the ringing preventive circuit 21N operates so as to remove the shaded areas A to D in FIG. 28. When this ringing preventive circuit 21N is inserted after the transmission path of digital signal, voltage noise such as ringing is prevented, and malfunction in the circuit succeeding the next stage can be suppressed effectively.

In the ringing preventive circuit 21N of FIG. 24, since the currents Id32, Id35 depending on the voltage level of noise such as ringing can be supplied to the front stage of the buffer amplifier 30, ringing and other noise can be prevented without having to adjust the value of the resistances R25 to R30 or gate length or gate width of the transistors Q31, Q32, Q34, Q35, for all input waveforms in the range of Em+ΔV<$V_{ri}$<Ep−ΔV.

In the ringing preventive circuits of the first and subsequent preferred embodiments of the circuit of FIG. 8, the operational amplifier is connected to the voltage follower as an example of the buffer amplifier 30, but it may be connected to the emitter follower or other buffer amplifier, and same effects as in the foregoing preferred embodiments are obtained.

The reference power sources E1 to E4 are connected to the grounding voltage GND, but they may be also based on base line of pulse or other values relating to the direct-current component of a pulse wave, and same effects are in the preferred embodiments are obtained. Generation of direct-current component of a pulse wave is easily realized from the prior art.

Figure 30:
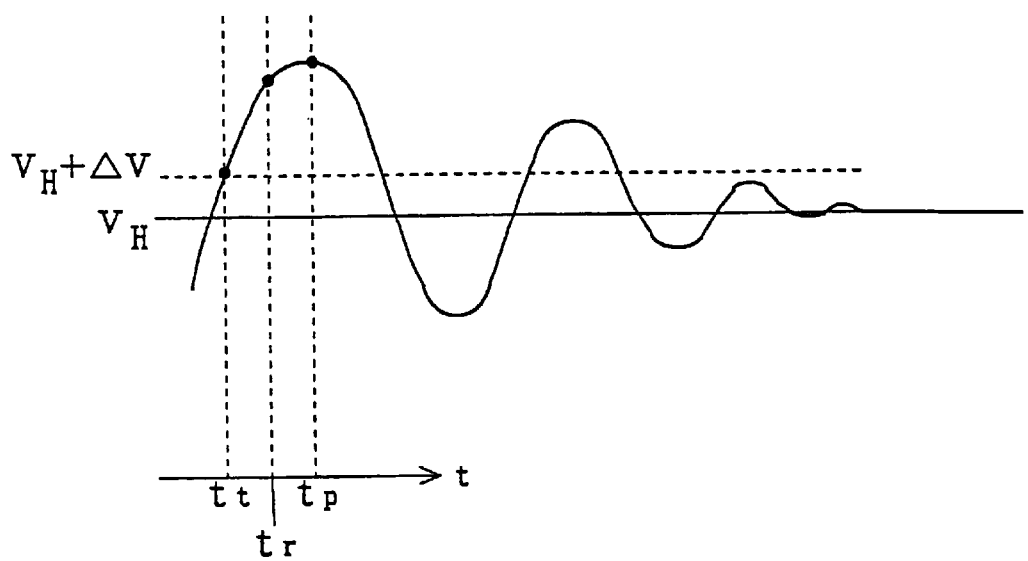
FIG. 30 is a waveform diagram for explaining the operation of a ringing preventive circuit.

In the description of the preferred embodiments, the range of the operating voltage of the ringing preventive circuit is not specifically explained, but as shown in FIG. 30, briefly, the time $t_r$, when the current starts to be supplied from the ringing preventive circuit is somewhere from the time $t_t$ when the output waveform crosses $V_H$+ΔV till the time $t_p$ when the voltage of the waveform reaches the maximum. That is, the following relation is established.

[Formula 13]

$$t_t \leq t_r \ll t_p$$

Figure 31:
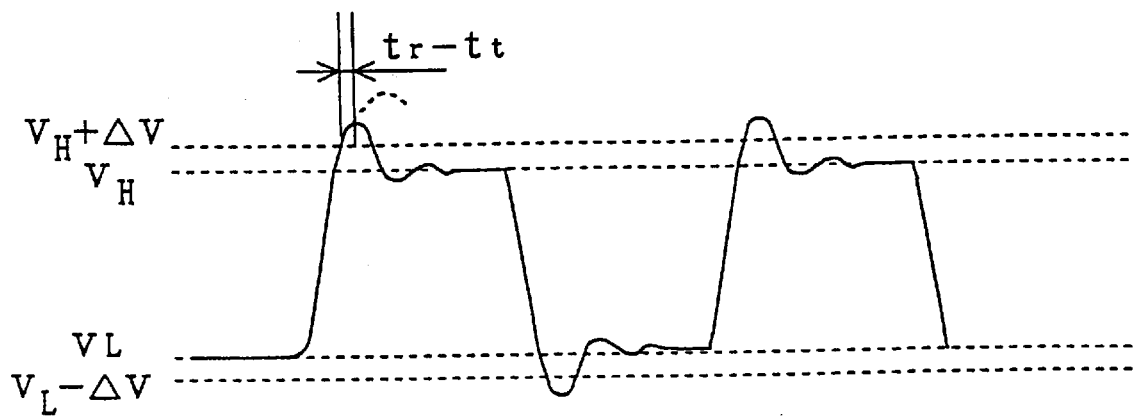
FIG. 31 is a waveform diagram showing the output of a ringing preventive circuit of the invention.

The effect of preventing ringing is greater as the reaction time ($t_r-t_t$) of the ringing preventive circuit is closer to 0, and as ΔV is closer to 0. FIG. 2 is a diagram showing the ideal characteristic in which the reaction time of the ringing preventive circuit is infinitely close to 0. Taking this point into consideration, the output waveform as shown in FIG. 31 is obtained.

While the invention has been shown and described in detail, the foregoing description is in all aspects illustrative and not restrictive. It is therefore understood that numerous modifications and variations can be devised without departing from the scope of the invention.

What is claimed is:

1. A ringing preventive circuit, comprising:

buffer amplifier having an input terminal and an output terminal;

a first comparator having a first input terminal connected to said output terminal of said buffer amplifier, a second input terminal provided with a first reference voltage, and an output terminal, for outputting a first control signal from said output terminal in response to a result of comparison between voltages at said first and second input terminals; and a first current supply circuit having a first terminal connected to a first power source for supplying a first voltage, a second terminal connected to said input terminal of said buffer amplifier, and a control signal input terminal connected to said output terminal of said first comparator, for controlling conduction and non-conduction of a current flowing from said first terminal to said second terminal as a function of said first control signal, wherein said first current supply circuit, comprises:

a first constant current source having a first terminal connected to said first power source, and a second terminal, for supplying a specific current from said first terminal to said second terminal, and a first switch means having a first current electrode connected to said second terminal of said first constant current source, a second current electrode connected to said input terminal of said buffer amplifier, and a control electrode connected to said output terminal of said first comparator, for controlling conduction and non-conduction of the current flowing between said first and second current electrodes in response to said first control signal provided to said control electrode.

2. The ringing preventive circuit of claim 1, wherein said buffer amplifier includes a voltage follower operational buffer amplifier comprising an output stage and a voltage follower in an input stage.

3. The ringing preventive circuit of claim 2, wherein the output stage of said voltage follower operational buffer amplifier includes a totem-pole amplifier.

4. The ringing preventive circuit of claim 2, wherein the output stage of said voltage follower operational buffer amplifier includes a push-pull amplifier.

5. The ringing preventive circuit of claim 1, wherein said buffer amplifier comprises an emitter follower.

6. The ringing preventive circuit of claim 1, further comprising:

a second comparator having a first input terminal connected to said output terminal of said buffer amplifier, a second input terminal provided with a second reference voltage, and an output terminal, for outputting a second control signal from said output terminal in response to a result of comparison between voltages at said first and second input terminals; and a second current supply circuit having a first terminal connected to a second power source for supplying a second voltage, a second terminal connected to said input terminal of said buffer amplifier, and a control signal input terminal connected to said output terminal of said second comparator, for controlling conduction and non-conduction of a current flowing from said first terminal to said second terminal as a function of said second control signal.

7. The ringing preventive circuit of claim 6, wherein said second current supply circuit, comprises:

a second constant current source having a first terminal connected to said second power source, and a second terminal, for supplying a specific current from said first terminal to said second terminal, and a second switch means having a first current electrode connected to said second terminal of said second constant current source, a second current electrode connected to said input terminal of said buffer amplifier, and a control electrode connected to said output terminal of said second comparator, for controlling conduction and non-conduction of the current flowing between said first and second current electrodes in response to said second control signal provided to said control electrode.

8. The ringing preventive circuit of claim 6, wherein a circuit composition of said first current supply circuit and the circuit composition of said second current supply circuit are identical.

* * * * *